United States Patent
Sakuishi et al.

(10) Patent No.: US 9,887,392 B2
(45) Date of Patent: Feb. 6, 2018

(54) METHOD FOR MANUFACTURING DISPLAY DEVICE AND METHOD FOR MANUFACTURING ELECTRONIC DEVICE

(71) Applicant: Semiconductor Energy Laboratory Co., Ltd., Atsugi-shi, Kanagawa-ken (JP)

(72) Inventors: Tatsuya Sakuishi, Kanagawa (JP); Daiki Nakamura, Kanagawa (JP); Akihiro Chida, Kanagawa (JP); Tomoya Aoyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 136 days.

(21) Appl. No.: 14/628,461

(22) Filed: Feb. 23, 2015

(65) Prior Publication Data
US 2015/0250038 A1    Sep. 3, 2015

(30) Foreign Application Priority Data

Feb. 28, 2014 (JP) .................. 2014-038740
Mar. 7, 2014 (JP) .................. 2014-044735

(51) Int. Cl.
*H05B 33/10* (2006.01)
*H01L 51/56* (2006.01)
(Continued)

(52) U.S. Cl.
CPC ............ *H01L 51/56* (2013.01); *B32B 38/105* (2013.01); *H01L 27/1218* (2013.01); *H01L 27/1266* (2013.01); *H01L 27/3276* (2013.01); *H01L 29/78603* (2013.01); *B32B 2310/0843* (2013.01); *B32B 2457/20* (2013.01); *H01L 27/124* (2013.01); *H01L 27/1225* (2013.01);
(Continued)

(58) Field of Classification Search
CPC ................ H01L 51/56; H01L 27/1218; H01L 29/78603; H01L 27/3276; H01L 27/1266; H01L 27/124; H01L 27/1225; H01L 2251/5338; H01L 27/322; H01L 2227/323; B32B 38/105; B32B 2310/0843; B32B 2457/20
See application file for complete search history.

(56) References Cited

U.S. PATENT DOCUMENTS

| RE38,466 E | * | 3/2004 | Inoue | .................. G02F 1/1368 438/158 |
| 8,367,440 B2 | | 2/2013 | Takayama et al. | |

(Continued)

FOREIGN PATENT DOCUMENTS

| JP | 2000-150143 A | 5/2000 |
| JP | 2003-174153 A | 6/2003 |

(Continued)

*Primary Examiner* — Tracie Y Green
(74) *Attorney, Agent, or Firm* — Fish & Richardson P.C.

(57) ABSTRACT

A method for manufacturing a display device is provided. The method includes forming a display element interposed between a first substrate and a second substrate and peeling the second substrate from the first substrate so that an electrode, which is located between the first and second substrates and to be connected to an external electrode, is exposed simultaneously with the peeling of the second substrate.

22 Claims, 44 Drawing Sheets

(51) Int. Cl.

| | | |
|---|---|---|
| *H01L 27/12* | (2006.01) | |
| *B32B 38/00* | (2006.01) | |
| *H01L 29/786* | (2006.01) | |
| *H01L 51/00* | (2006.01) | |
| *H01L 27/32* | (2006.01) | |

(52) U.S. Cl.
CPC .......... *H01L 27/322* (2013.01); *H01L 51/003* (2013.01); *H01L 51/0024* (2013.01); *H01L 51/0097* (2013.01); *H01L 2227/323* (2013.01); *H01L 2227/326* (2013.01); *H01L 2251/5338* (2013.01)

(56) References Cited

U.S. PATENT DOCUMENTS

| | | |
|---|---|---|
| 8,415,208 B2 | 4/2013 | Takayama et al. |
| 2001/0015256 A1* | 8/2001 | Yamazaki ........... H01L 27/1214 156/289 |
| 2005/0090075 A1* | 4/2005 | Takayama ........... H01L 27/1214 438/455 |
| 2009/0108728 A1 | 4/2009 | Ushimaru et al. |
| 2013/0214324 A1 | 8/2013 | Takayama et al. |
| 2013/0240855 A1 | 9/2013 | Chida et al. |
| 2014/0273317 A1 | 9/2014 | Chida |
| 2015/0263314 A1 | 9/2015 | Sakuishi et al. |

FOREIGN PATENT DOCUMENTS

| | | |
|---|---|---|
| JP | 2009-109770 A | 5/2009 |
| JP | 2013-251255 A | 12/2013 |

* cited by examiner

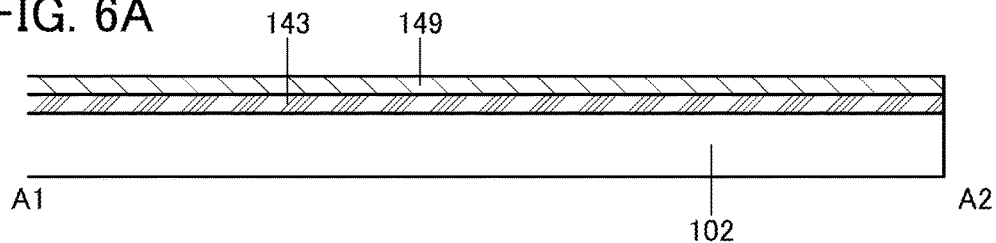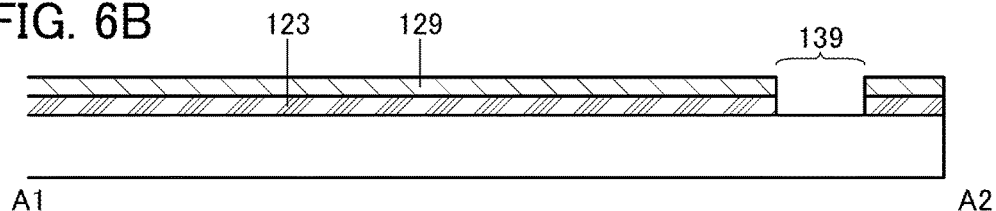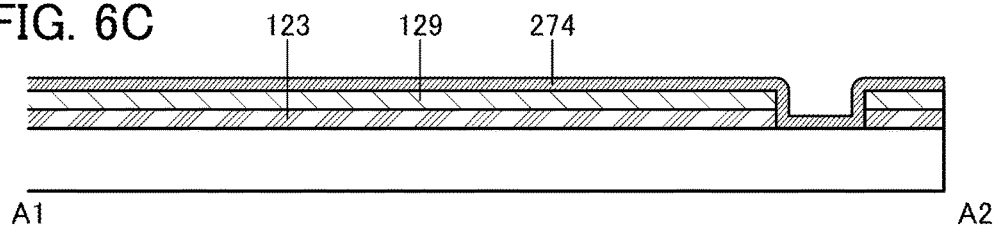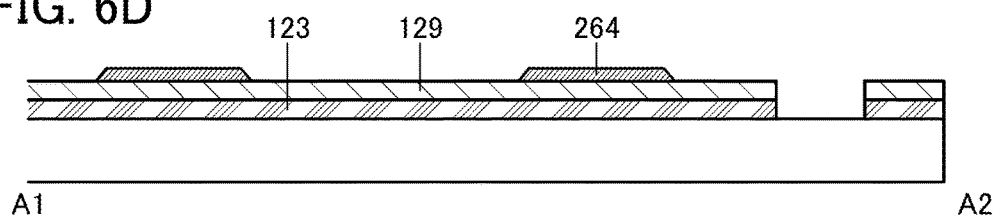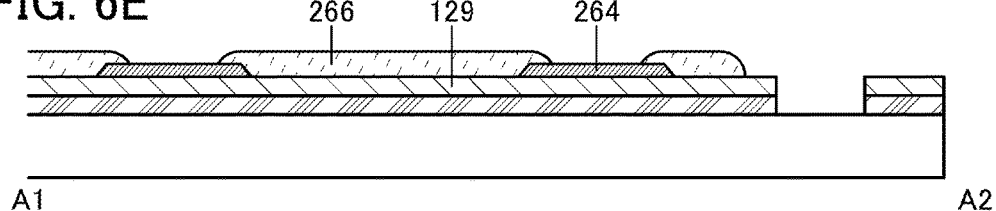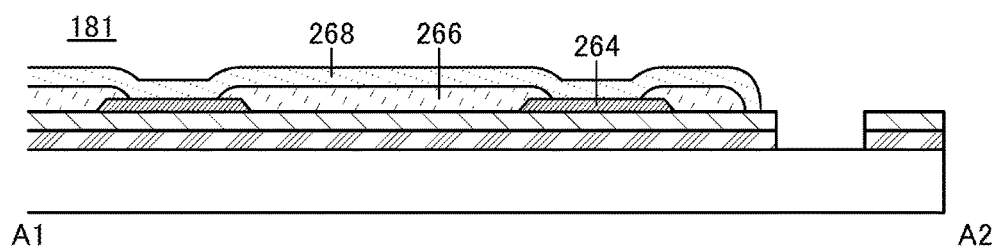

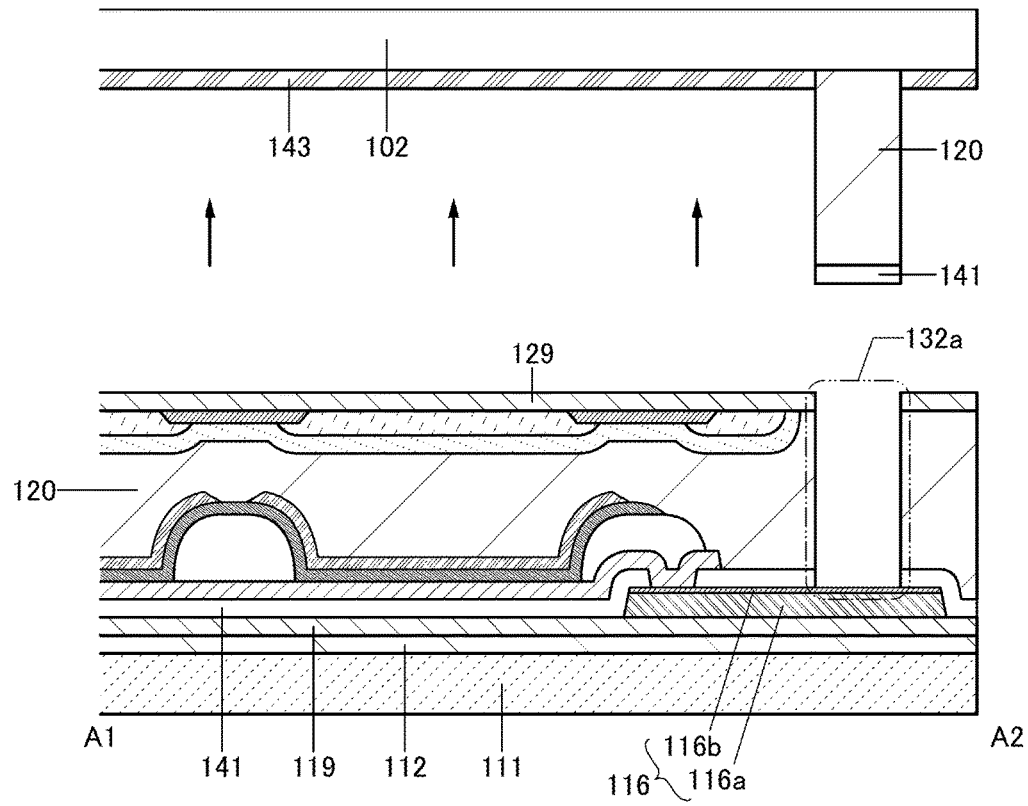
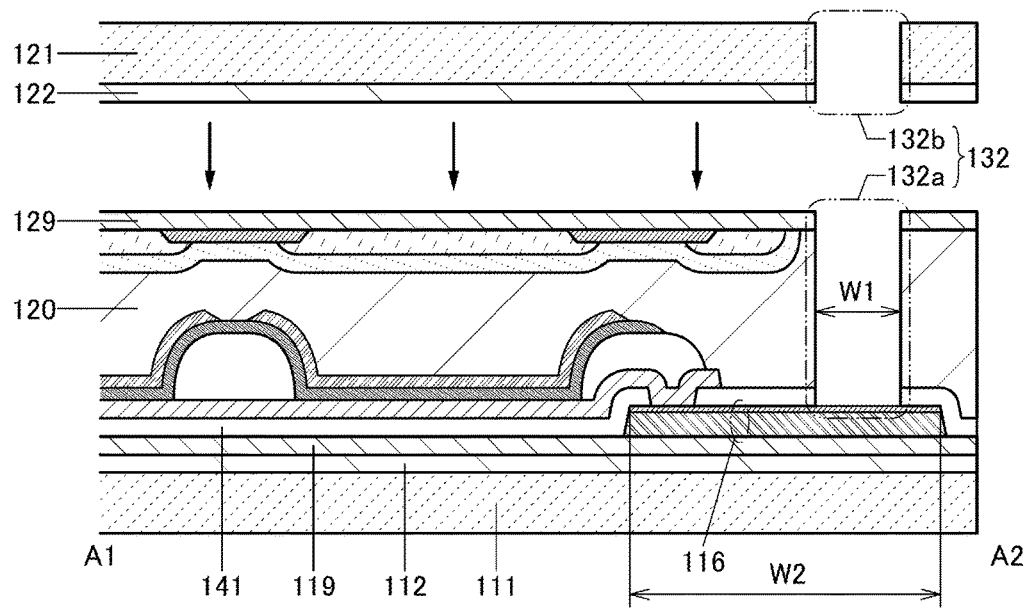

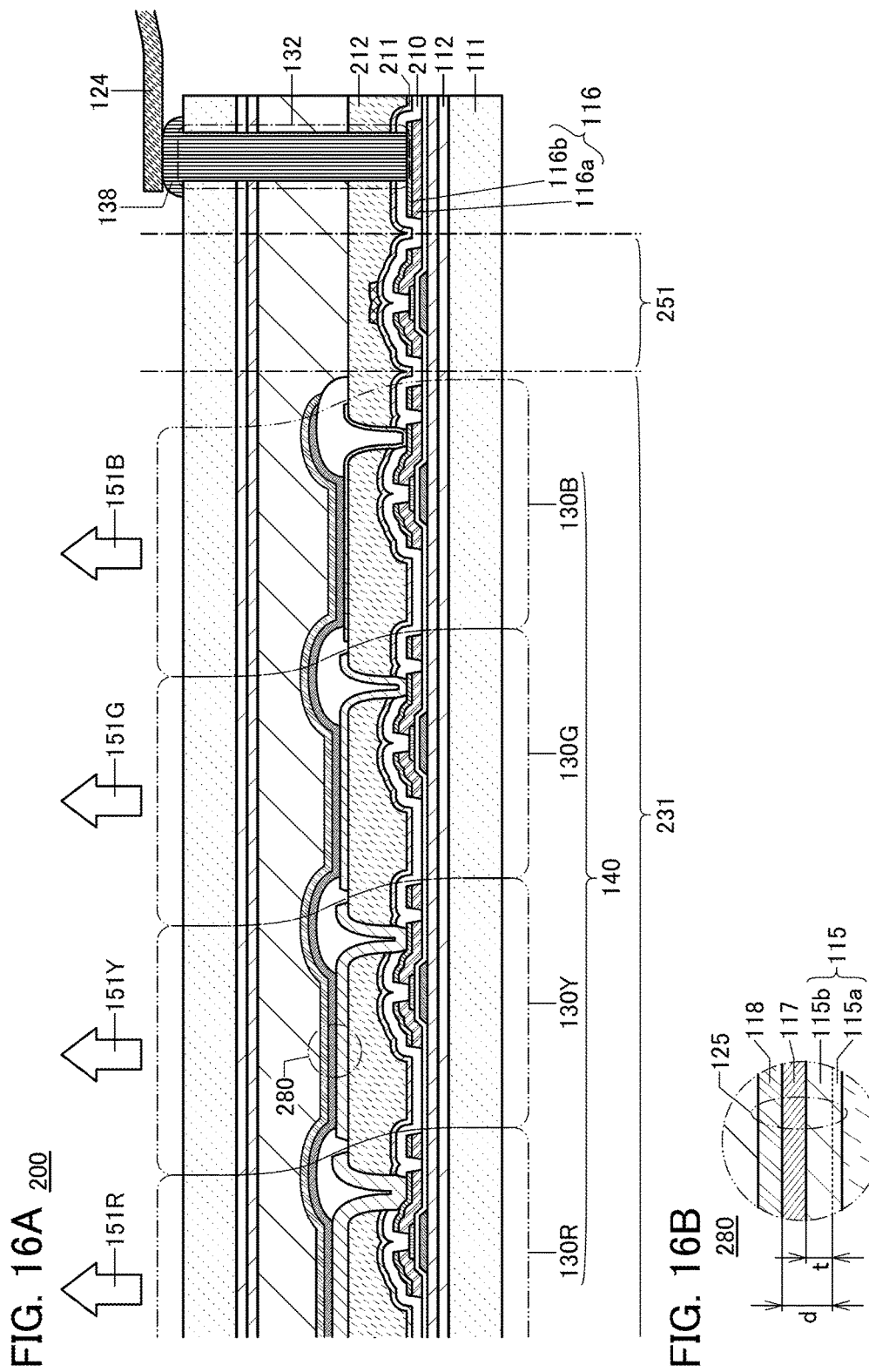

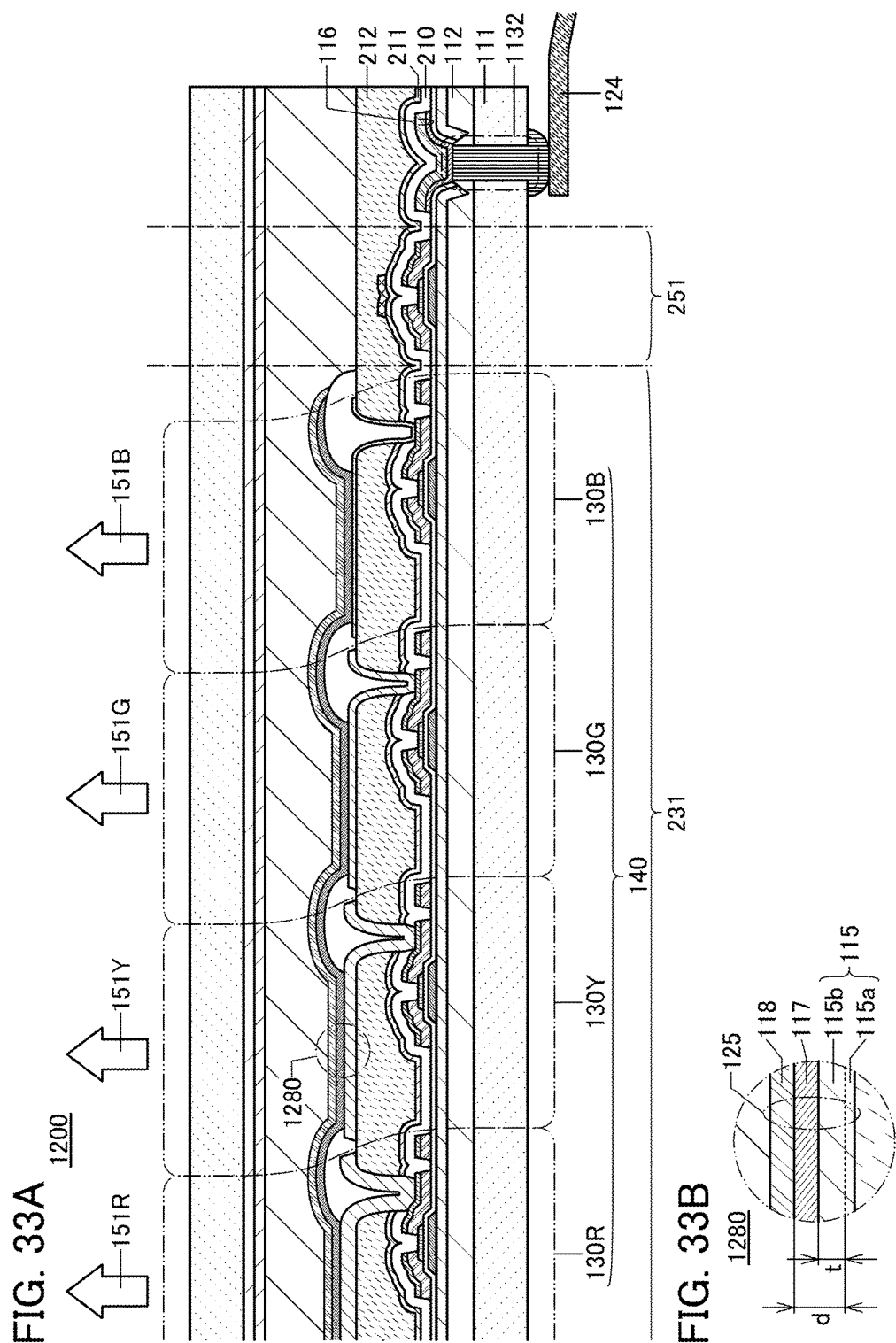

FIG. 36A1
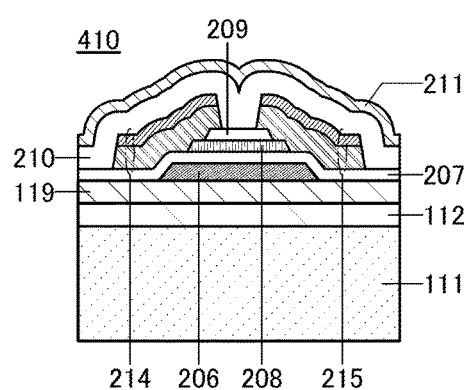
FIG. 36A2
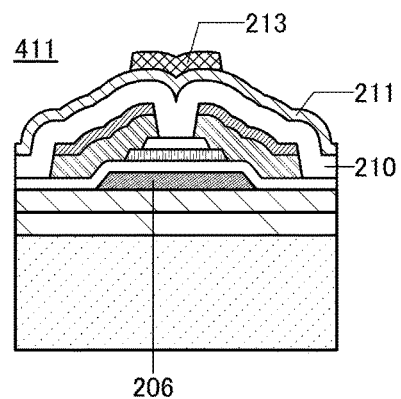
FIG. 36B1
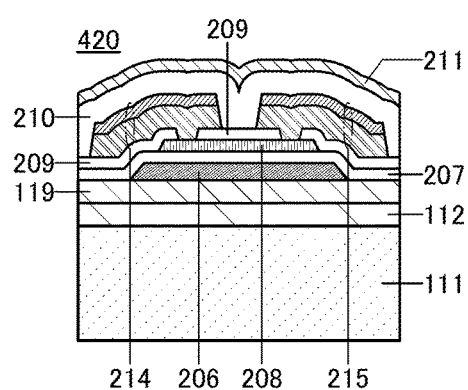
FIG. 36B2
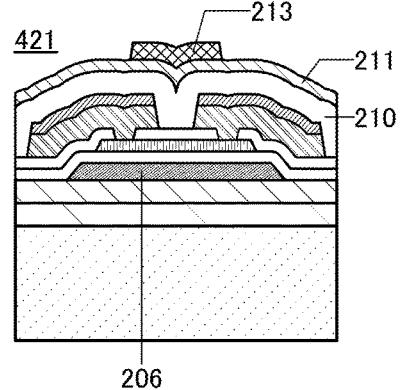

FIG. 37A1
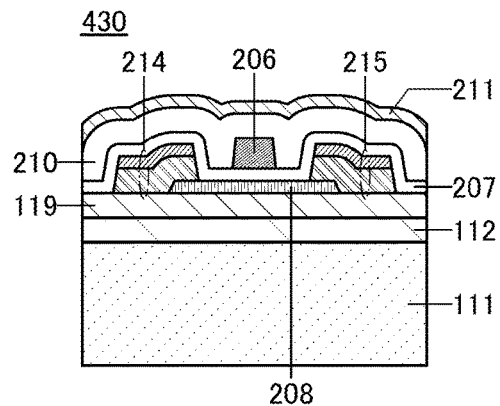
FIG. 37A2
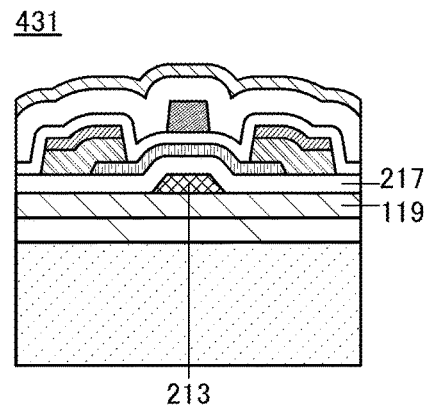
FIG. 37A3
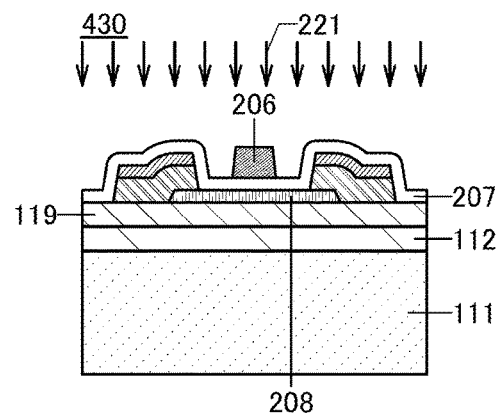
FIG. 37B1
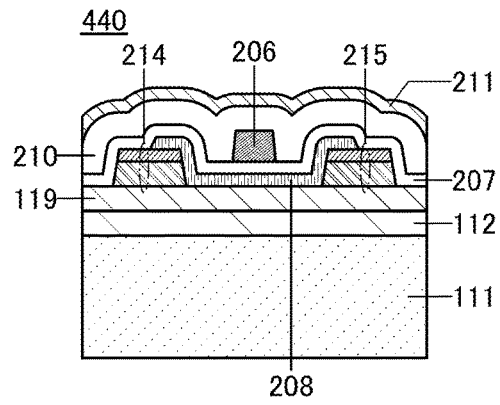
FIG. 37B2
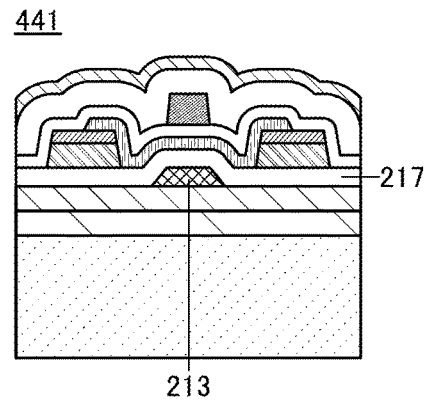

METHOD FOR MANUFACTURING DISPLAY DEVICE AND METHOD FOR MANUFACTURING ELECTRONIC DEVICE

BACKGROUND OF THE INVENTION

1. Field of the Invention

The present invention relates to a display device. The present invention also relates to a method for manufacturing the display device.

Note that one embodiment of the present invention is not limited to the above technical field.

Note that in this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic device, and the like may include a semiconductor element or a semiconductor circuit. Therefore, a display device, a light-emitting device, a lighting device, an electro-optical device, an electronic device, and the like include a semiconductor device in some cases.

2. Description of the Related Art

In recent years, research and development have been extensively conducted on liquid crystal elements as a display element used in a display region of a display device. In addition, research and development have been extensively conducted on light-emitting elements utilizing electroluminescence (EL). As a basic structure of these light-emitting elements, a layer containing a light-emitting substance is provided between a pair of electrodes. Voltage is applied to this light-emitting element to obtain light emission from the light-emitting substance.

Light-emitting elements are a self-luminous element; thus, a display device using the light-emitting elements has, in particular, advantages such as high visibility, no necessity of a backlight, and low power consumption. The display device using the light-emitting elements also has advantages in that it can be manufactured to be thin and lightweight and has high response speed.

A display device including the display elements can have flexibility; therefore, the use of a flexible substrate for the display device has been proposed.

As a method for manufacturing a display device using a flexible substrate, a technique has been developed in which a semiconductor element such as a thin film transistor is manufactured over a substrate such as a glass substrate or a quartz substrate, for example, the semiconductor element is fixed to another substrate (e.g., a flexible substrate) by using an organic resin, and then the semiconductor element is transferred from the glass substrate or the quartz substrate to the other substrate (Patent Document 1).

In some cases, over a light-emitting element that has been formed over a flexible substrate, another flexible substrate is provided in order to protect a surface of the light-emitting element or prevent entry of moisture or impurities from the outside.

REFERENCE

Patent Document

Patent Document

[Patent Document 1] Japanese Published Patent Application No. 2003-174153

SUMMARY OF THE INVENTION

In order to supply a signal or electric power to a display device using a flexible substrate, it is necessary that part of the flexible substrate be removed by a laser beam or an edged tool to expose an electrode so that an external electrode such as a flexible printed circuit (FPC) is connected to the electrode.

However, a method in which part of a flexible substrate is removed by a laser beam or with an edged tool has a problem in that an electrode included in a display device is damaged easily and the reliability and manufacturing yield of the display device are reduced easily. In addition, a display region and an electrode need to be provided with a sufficient space therebetween in order to prevent damage to the display region due to the above-described method; for this reason, signal attenuation, electric power attenuation, or the like due to an increase in wiring resistance is caused easily.

An object of one embodiment of the present invention is to provide a method for manufacturing a display device, which does not easily damage an electrode. Another object of one embodiment of the present invention is to provide a method for manufacturing a display device, which does not easily damage a display region. Another object of one embodiment of the present invention is to provide a highly reliable display device and a method for manufacturing the display device.

Another object of one embodiment of the present invention is to provide a display device, electronic device, or the like having high visibility. Another object of one embodiment of the present invention is to provide a display device, electronic device, or the like having high display quality. Another object of one embodiment of the present invention is to provide a display device, electronic device, or the like having high reliability. Another object of one embodiment of the present invention is to provide a display device, electronic device, or the like that is unlikely to be broken. Another object of one embodiment of the present invention is to provide a display device, electronic device, or the like with low power consumption.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

According to one embodiment of the present invention, a method for manufacturing a display device include a first process, a second process, a third process, a fourth process, a fifth process, a sixth process, and a seventh process. The first process includes a step of providing a first layer over a first surface of a first substrate, a step of providing a first insulating layer over the first layer, a step of providing an electrode over the first insulating layer, a step of providing a second insulating layer over the electrode, and a step of providing a display element over the second insulating layer. The second process includes a step of providing a second layer over a second surface of a second substrate, a step of providing a third insulating layer over the second layer, and a step of providing an opening by partly removing the second layer and the third insulating layer. The third process includes a step of overlapping the first substrate and the second substrate with each other with a bonding layer provided therebetween so that a region in which the first surface and the second surface face each other and in which the electrode and the opening overlap with each other is formed. The fourth process includes a step of peeling the first substrate from the first insulating layer together with the first layer. The fifth process includes a step of providing a third substrate so as to overlap with the first insulating layer. The sixth process includes a step of peeling the second substrate from the third insulating layer together with the second layer. The seventh process includes a step of providing a fourth substrate so as to overlap with the third insulating layer. In the third process, the bonding layer includes a first region in which the bonding layer and the opening overlap with each other, and the second insulating layer includes a second region in which the second insulating layer and the opening overlap with each other. In the sixth process, at least part of the bonding layer in the first region and at least part of the second insulating layer in the second region are peeled together with the second substrate so that part of the electrode is exposed.

In the first process, the surface of the electrode may be exposed to an atmosphere containing oxygen before the second insulating layer is provided. The atmosphere containing oxygen may be a plasma atmosphere.

Part of the electrode may be irradiated with light through the opening before the sixth process.

One embodiment of the present invention provides a method for manufacturing a display device, which does not easily damage an electrode. One embodiment of the present invention provides a method for manufacturing a display device, which does not easily damage a display region. One embodiment of the present invention provides a highly reliable display device and a method for manufacturing the display device.

One embodiment of the present invention provides a display device, electronic device, or the like having high visibility. One embodiment of the present invention provides a display device, electronic device, or the like having high display quality. One embodiment of the present invention provides a display device, electronic device, or the like having high reliability. One embodiment of the present invention provides a display device, electronic device, or the like that is unlikely to be broken. One embodiment of the present invention provides a display device, electronic device, or the like with low power consumption.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

FIGS. 6A to 6F illustrate a manufacturing process of one embodiment of a display device.

FIGS. 10A and 10B illustrate a manufacturing process of one embodiment of a display device.

FIGS. 16A and 16B are cross-sectional views illustrating one embodiment of a display device.

FIGS. 33A and 33B are cross-sectional views illustrating one embodiment of a display device.

FIGS. 36A1, 36A2, 36B1, and 36B2 are each a cross-sectional view of one embodiment of a transistor.

FIGS. 37A1, 37A2, 37A3, 37B1, and 37B2 are each a cross-sectional view illustrating one embodiment of a transistor.

DETAILED DESCRIPTION OF THE INVENTION

Figure 1A:
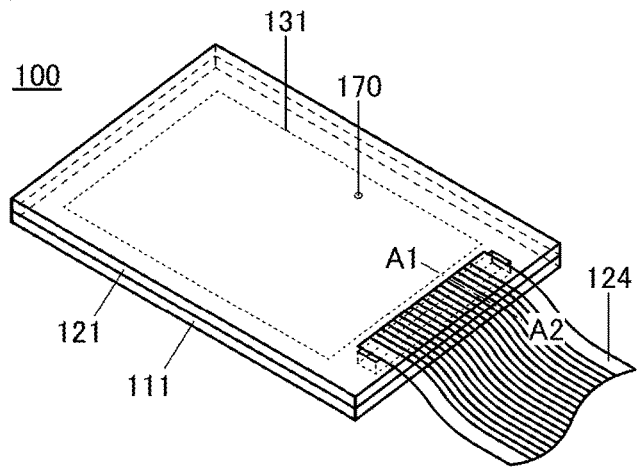
FIGS. 1A and 1B are a perspective view and a cross-sectional view illustrating one embodiment of a display device.

Embodiments will be described in detail with reference to the accompanying drawings. Note that the present invention is not limited to the description below, and it is understood easily by those skilled in the art that various changes and modifications can be made without departing from the spirit and scope of the present invention. Therefore, the present invention should not be construed as being limited to the description in the following embodiments. In the structures of the present invention to be described below, the same portions or portions having similar functions are denoted by the same reference numerals in different drawings, and explanation thereof will not be repeated.

The position, size, range, and the like of each component illustrated in the drawings and the like are not accurately represented in some cases to facilitate understanding of the invention. Therefore, the disclosed invention is not necessarily limited to the position, the size, range, and the like disclosed in the drawings and the like. For example, in the actual manufacturing process, a resist mask or the like might be unintentionally reduced in size by treatment such as etching, which might not be illustrated for easy understanding.

Especially in a top view (also referred to as a plan view), some components might not be illustrated for easy understanding.

In this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Functions of a source and a drain might be switched depending on operation conditions, for example, when a transistor having opposite polarity is employed or the direction of current flow is changed in circuit operation. Thus, it is difficult to define which is a source or a drain. Accordingly, the terms "source" and "drain" can be switched in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Accordingly, even when the expression "electrically connected" is used in this specification, there is a case in which no physical connection is made and a wiring is just extended in an actual circuit.

In this specification, a term "parallel" indicates that the angle formed between two straight lines is greater than or equal to −10° and less than or equal to 10°, and accordingly also includes the case where the angle is greater than or equal to −5° and less than or equal to 5°. A term "perpendicular" indicates that the angle formed between two straight lines is greater than or equal to 80° and less than or equal to 100°, and accordingly also includes the case where the angle is greater than or equal to 85° and less than or equal to 95°.

In this specification, in the case where an etching step is performed after a lithography process, a resist mask formed in the lithography process is removed after the etching step, unless otherwise specified.

A voltage usually refers to a potential difference between a given potential and a reference potential (e.g., a source potential or a ground potential (a GND potential)). A voltage can be referred to as a potential and vice versa.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. Moreover, a term with an ordinal number in this specification and the like might not be provided with any ordinal number in a claim.

Note that in this specification, the channel length refers to, for example, a distance, observed in a top view of a transistor, between a source (a source region or a source electrode) and a drain (a drain region or a drain electrode) in a region where a semiconductor (or a portion where a current flows in a semiconductor when the transistor is on) and a gate electrode overlap with each other or a region where a channel is formed. In one transistor, channel lengths are not necessarily the same in all regions. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths are not necessarily the same in all regions. In other words, the channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor is higher than the proportion of a channel region formed in a top surface of a semiconductor in some cases. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, an apparent channel width is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that a channel length, a channel width, an effective channel width, an apparent channel width, a surrounded channel width, and the like can be determined by analyzing a cross-sectional TEM image and the like.

Note that in the case where electric field mobility, a current value per channel width, and the like of a transistor are calculated, a surrounded channel width might be used for the calculation. In that case, a value might be different from one calculated by using an effective channel width.

Embodiment 1

Figure 1B:
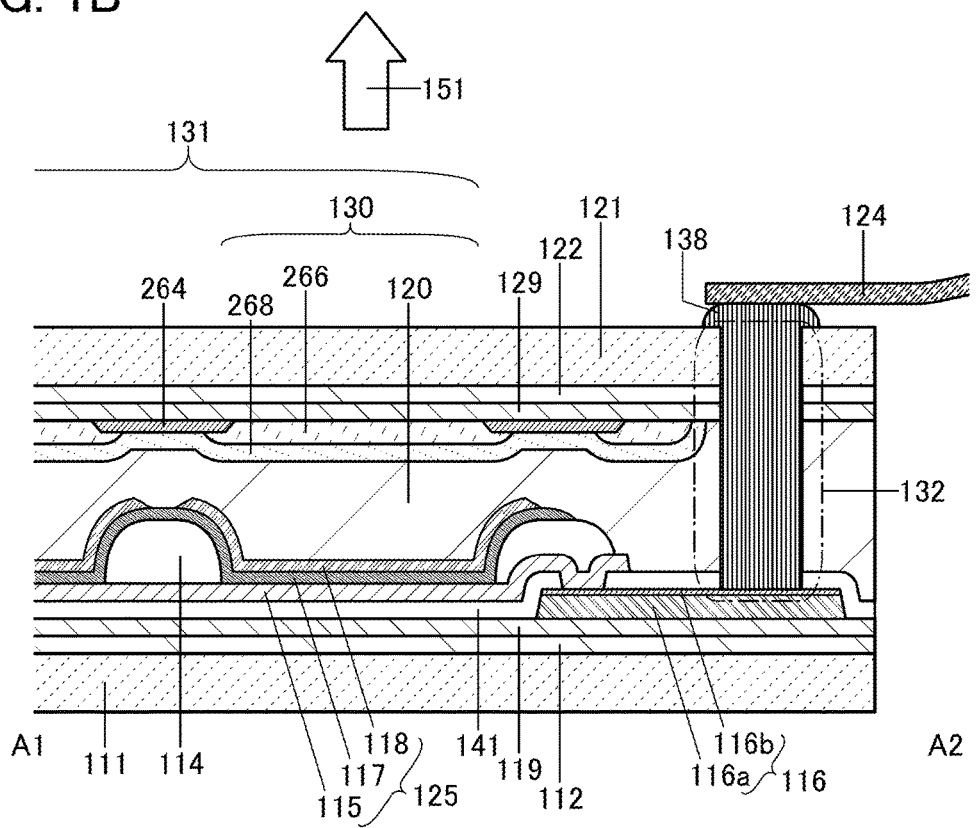

A structure example of a display device 100 of one embodiment of the present invention will be described with reference to FIGS. 1A and 1B, FIGS. 2A and 2B, FIGS. 3A and 3B, FIGS. 4A to 4E, FIGS. 5A to 5D, FIGS. 6A to 6F, FIGS. 7A to 7C, FIGS. 8A and 8B, FIGS. 9A and 9B, FIGS. 10A and 10B, FIGS. 11A and 11B, FIGS. 12A and 12B, and FIGS. 13A and 13B. FIG. 1A is a perspective view of the display device 100 to which an external electrode 124 is connected, and FIG. 1B is a cross-sectional view taken along the dashed-dotted line A1-A2 in FIG. 1A. Note that the display device 100 disclosed in this specification is a display device in which a light-emitting element is used as a display element. As the display device 100 of one embodiment of the present invention, a display device having a top-emission structure is described as an example. Note that the display device 100 can be a display device having a bottom-emission structure or a dual-emission structure.

<Structure of Display Device>

The display device 100 described in this embodiment includes a display region 131. The display region 131 includes a plurality of pixels 130. One pixel 130 includes at least one light-emitting element 125.

The display device 100 described in this embodiment includes an electrode 115, an EL layer 117, an electrode 118, a partition 114, and an electrode 116. The display device 100 further includes an insulating layer 141 over the electrode 116, and the electrode 115 and the electrode 116 are electrically connected to each other in an opening provided in the insulating layer 141. The partition 114 is provided over the electrode 115, the EL layer 117 is provided over the electrode 115 and the partition 114, and the electrode 118 is provided over the EL layer 117.

The light-emitting element 125 is provided over a substrate 111 with a bonding layer 112, an insulating layer 119, and the insulating layer 141 provided therebetween. The light-emitting element 125 includes the electrode 115, the EL layer 117, and the electrode 118.

The display device 100 described in this embodiment includes a substrate 121 provided over the electrode 118 with a bonding layer 120 provided therebetween. In addition, the substrate 121 is provided with a light-blocking layer 264, a coloring layer (also referred to as a color filter) 266, and an overcoat layer 268 with a bonding layer 122 and an insulating layer 129 provided therebetween.

Since the display device 100 described in this embodiment has a top-emission structure, light 151 emitted from the EL layer 117 is extracted from the substrate 121 side. The light 151 (e.g., white light) emitted from the EL layer 117 is partly absorbed when transmitted through the coloring layer 266 and converted into light with a specific color. In other words, the coloring layer 266 transmits light with a specific wavelength range). The coloring layer 266 can function as an optical filter layer for converting the light 151 into light of a different color.

Although a stacked-layer structure of an electrode 116a and an electrode 116b is described as the electrode 116 in this embodiment, the electrode 116 may have a single-layer structure or a stacked-layer structure of three or more layers.

Each of the substrate 121, the bonding layer 122, the insulating layer 129, the bonding layer 120, and the insulating layer 141 has an opening. The openings partly overlap with one another and each overlap with the electrode 116. In this specification and the like, these openings are collectively referred to as an opening 132. In the opening 132, the external electrode 124 and the electrode 116 are electrically connected to each other through an anisotropic conductive connection layer 138.

Figure 2A:
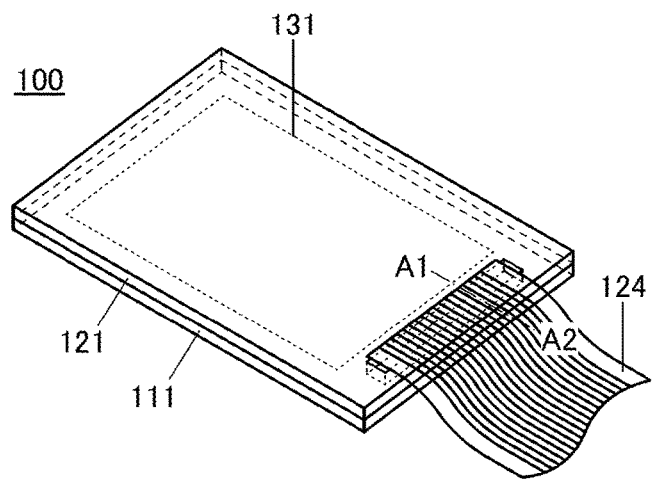
FIGS. 2A and 2B are a perspective view and a cross-sectional view illustrating one embodiment of a display device.
Figure 2B:
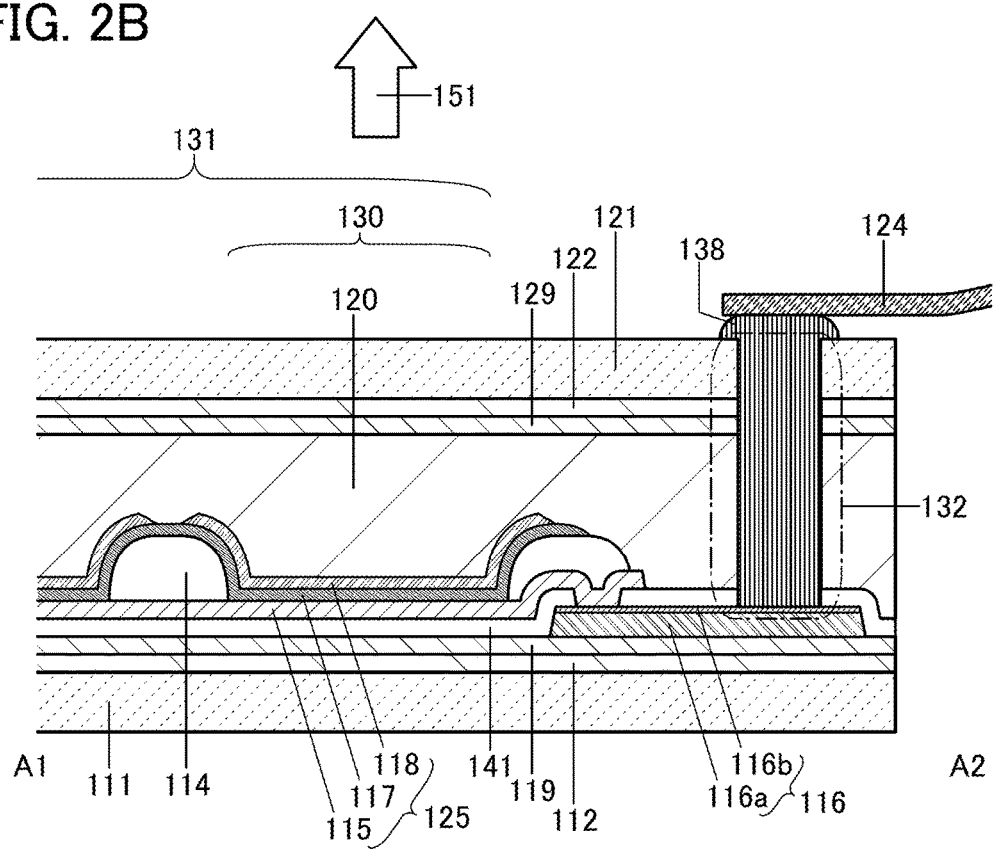

Note that as illustrated in FIGS. 2A and 2B, it is possible not to provide the light-blocking layer 264, the coloring layer 266, and the overcoat layer 268 in the display device 100. FIG. 2A is a perspective view of the display device 100 in which the light-blocking layer 264, the coloring layer 266, and the overcoat layer 268 are not provided, and FIG. 2B is a cross-sectional view taken along the dashed-dotted line A1-A2 in FIG. 2A.

In particular, in the case where the EL layer 117 is provided by what is called side-by-side patterning in which the colors of the lights 151 emitted from different pixels are different, the coloring layer 266 may be provided or is not necessarily provided.

When at least one or all of the light-blocking layer 264, the coloring layer 266, and the overcoat layer 268 are not provided, the display device 100 can achieve a reduction in manufacturing cost, yield improvement, or the like. Moreover, the light 151 can be emitted efficiently when the coloring layer 266 is not provided; therefore, luminance can be improved or power consumption can be reduced, for example.

On the other hand, when the light-blocking layer 264, the coloring layer 266, and the overcoat layer 268 are provided, reflection of external light is suppressed and thus a contrast ratio, color reproducibility, or the like can be improved.

Figure 3A:
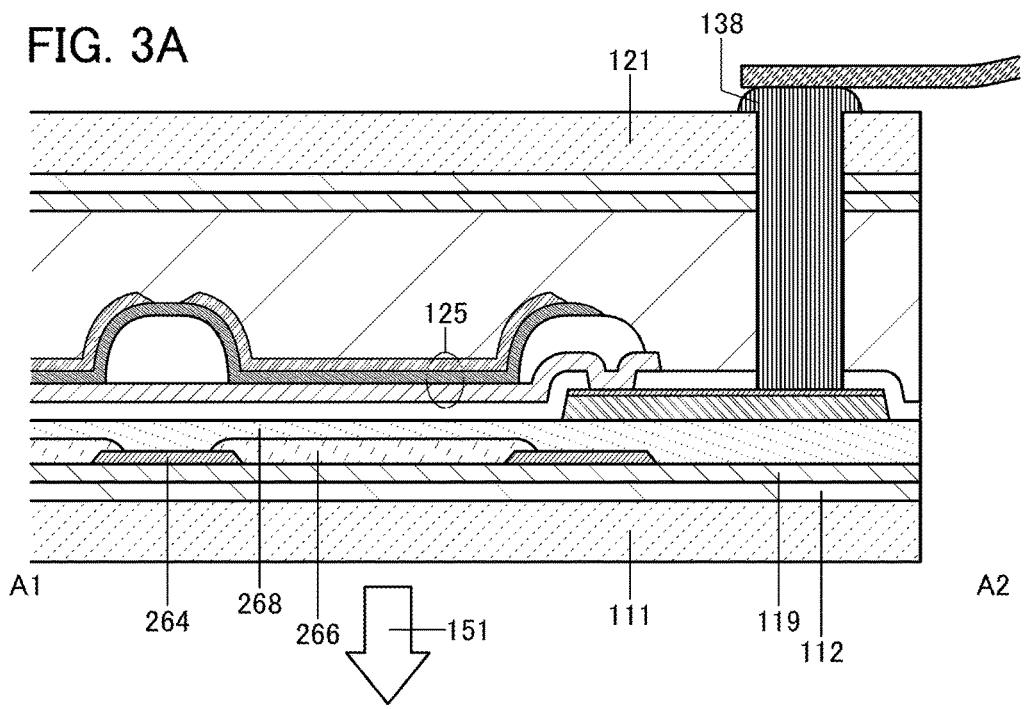
FIGS. 3A and 3B are cross-sectional views each illustrating one embodiment of a display device.
Figure 3B:
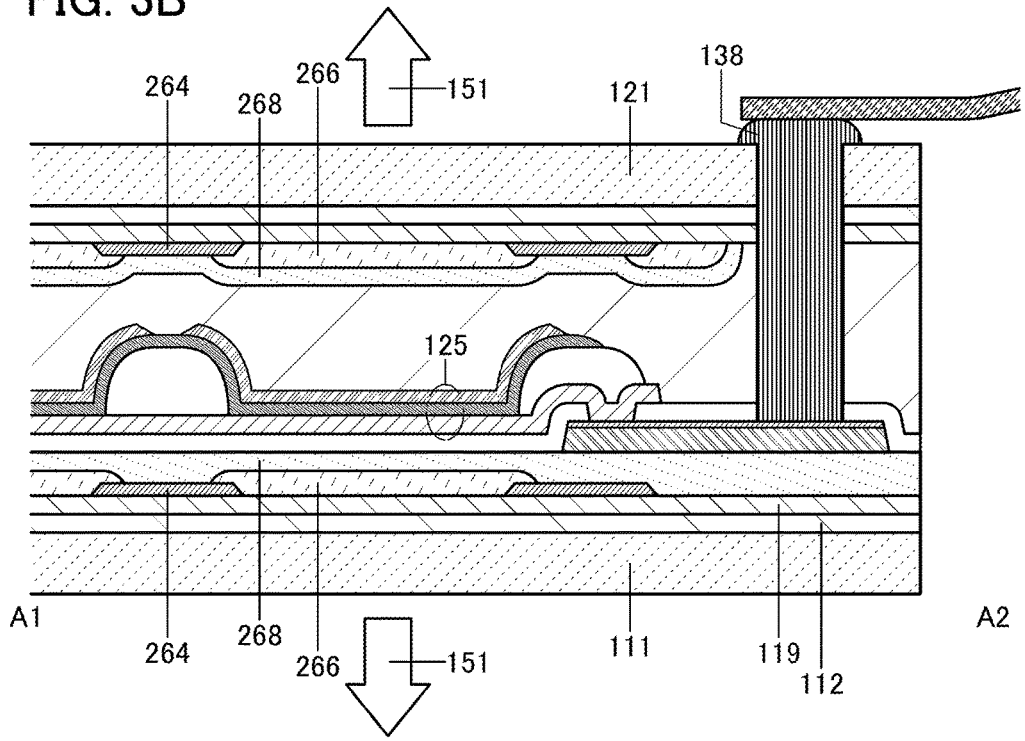

Note that in the case where the display device 100 has a bottom-emission structure, the light-blocking layer 264, the coloring layer 266, and the overcoat layer 268 may be provided on the substrate 111 side (see FIG. 3A). In the case where the display device 100 has a dual-emission structure, the light-blocking layer 264, the coloring layer 266, and the overcoat layer 268 may be provided on either or both of the substrate 111 side and the substrate 121 side (see FIG. 3B).

A switching element having a function of supplying a signal to the light-emitting element 125 may be provided between the light-emitting element 125 and the electrode 116. For example, a transistor may be provided between the light-emitting element 125 and the electrode 116.

A transistor is a kind of semiconductor element and enables amplification of current and/or voltage, switching operation for controlling conduction or non-conduction, or the like. By providing a transistor between the light-emitting element 125 and the electrode 116, an increase in the area of the display region 131 and a higher-resolution display can be achieved easily. Note that a resistor, an inductor, a capacitor, a rectifier element, or the like, without limitation to a switching element such as a transistor, can be provided in the display region 131.

[Substrates 111 and 121]

An organic resin material, a glass material that is thin enough to have flexibility, a metal material that is thin enough to have flexibility (including an alloy material), or the like can be used for the substrate 111 and/or the substrate 121. In the case where the display device 100 has a bottom-emission structure or a dual-emission structure, a material having a light-transmitting property with respect to light emitted from the EL layer 117 is used for the substrate 111. In the case where the display device 100 is a top-emission display device or a dual-emission display device, a material that transmits light emitted from the EL layer 117 is used for the substrate 121.

Particularly, the organic resin material has a specific gravity smaller than that of the glass material or the metal material. Thus, when an organic resin material is used for the substrate 111 and/or the substrate 121, the weight of the display device can be reduced.

The substrate 111 and/or the substrate 121 is/are preferably formed using a material with high toughness. In that case, a display device with high impact resistance that is less likely to be broken can be provided. The organic resin material and the metal material have higher toughness than the glass material in many cases. When the organic resin material or the metal material is used as the substrate 111 and/or the substrate 121, a display device that is less likely to be broken can be provided as compared with the case of using the glass material.

The metal material has higher thermal conductivity than the organic resin material or the glass material and thus can easily conduct heat to the whole substrate. Accordingly, a local temperature rise in the display device can be suppressed. The thickness of the substrate 111 and/or the substrate 121 using the metal material is preferably greater than or equal to 10 μm and less than or equal to 200 μm, or further preferably greater than or equal to 20 μm and less than or equal to 50 μm.

Although there is no particular limitation on the metal material used for the substrate 111 and/or the substrate 121, for example, aluminum, copper, nickel, an alloy such as an aluminum alloy or stainless steel can be used.

When a material with high thermal emissivity is used for the substrate 111 and/or the substrate 121, the surface temperature of the display device can be prevented from rising, leading to prevention of breakage or a decrease in reliability of the display device. For example, the substrate may have a stacked-layer structure of a layer formed using the metal material (hereinafter referred to as a "metal layer") and a layer with high thermal emissivity (e.g., a metal oxide or a ceramic material).

A hard coat layer (e.g., a silicon nitride layer) by which a surface of the display device is protected from damage, a layer (e.g., an aramid resin layer) which can disperse pressure, or the like may be stacked with the substrate 111 and/or the substrate 121.

The substrate 111 and/or the substrate 121 may have a stacked-layer structure of a plurality of layers using the above-described materials. In the case of a structure including a layer formed using a glass material (hereinafter referred to as a "glass layer"), barrier properties of the display device against water and oxygen can be particularly improved and thus a reliable display device can be provided.

For example, a flexible substrate in which a glass layer, a bonding layer, and a layer formed using the organic resin material (hereinafter referred to as an "organic resin layer") are stacked from the side closer to the display element can be used. The thickness of the glass layer is greater than or equal to 20 μm and less than or equal to 200 μm, or preferably greater than or equal to 25 μm and less than or equal to 100 μm. With such a thickness, the glass layer can have both a high barrier property against water and oxygen and a high flexibility. The thickness of the organic resin layer is greater than or equal to 10 μm and less than or equal to 200 μm, or preferably greater than or equal to 20 μm and less than or equal to 50 μm. With such an organic resin layer provided on an outer side than the glass layer, breakage or a crack of the glass layer can be inhibited, resulting in increased mechanical strength of the display device. With the substrate using a composite layer of the glass layer and the organic resin layer, a highly reliable flexible display device can be provided.

As a material that has flexibility and transmits visible light, which can be used for the substrate 111 and the substrate 121, the following can be used: a poly(ethylene terephthalate) resin (PET), a poly(ethylene naphthalate) resin (PEN), a poly(ether sulfone) resin (PES), a polyacrylonitrile resin, an acrylic resin, a polyimide resin, a poly(methyl methacrylate) resin, a polycarbonate resin, a poly-amide resin, a polycycloolefin resin, a polystyrene resin, a poly(amide imide) resin, a polypropylene resin, a polyester resin, a poly(vinyl halide) resin, an aramid resin, an epoxy resin, or the like. Alternatively, a mixture or a stack including any of these materials may be used. Note that the same material or different materials may be used for the substrate 111 and the substrate 121.

The thermal expansion coefficients of the substrate 121 and the substrate 111 are preferably less than or equal to 30 ppm/K, or further preferably less than or equal to 10 ppm/K. On surfaces of the substrate 121 and the substrate 111, a protective film having low water permeability may be formed; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also called prepreg) may be used as the substrate 121 and the substrate 111.

[Insulating Layer 119]

The insulating layer 119 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 119 may have, for example, a two-layer structure of silicon oxide and silicon nitride or a five-layer structure in which materials selected from the above are combined. The insulating layer 119 can be formed by a sputtering method, a CVD method, a thermal oxidation method, a coating method, a printing method, or the like.

The insulating layer 119 can prevent or reduce diffusion of an impurity element from the substrate 111, the bonding layer 112, or the like to the light-emitting element 125. The insulating layer 119 is preferably formed using an insulating film having low water permeability. For example, the water vapor permeability is lower than or equal to $1 \times 10^{-5}$ g/(m²·day), preferably lower than or equal to $1 \times 10^{-6}$ g/(m²·day), further preferably lower than or equal to $1 \times 10^{-7}$ g/(m²·day), or still further preferably lower than or equal to $1 \times 10^{-8}$ g/(m²·day).

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

[Electrode 116]

The electrode 116a can be formed using a conductive material. For example, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; or the like can be used. A semiconductor typified by polycrystalline silicon containing an impurity element such as phosphorus, or silicide such as nickel silicide may also be used. There is no particular limitation on the formation method of the conductive material, and a variety of formation methods such as an evaporation method, a CVD method, a sputtering method, and a spin coating method can be employed.

The electrode 116a can also be formed using a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, a conductive material containing nitrogen, such as titanium nitride, tantalum nitride, or tungsten nitride, can be used. It is also possible to use a stacked-layer structure formed using the above conductive material containing oxygen and a material containing the above metal element.

The electrode 116a may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure in which a titanium layer, an aluminum layer, and a titanium layer are stacked in this order are given. Alternatively, an alloy containing one or more elements selected from titanium, tantalum, tungsten, molybdenum, chromium, neodymium, and scandium may be used as the electrode 116a.

The electrode 116b can be formed using an element selected from tungsten, molybdenum, titanium, tantalum, niobium, nickel, cobalt, zirconium, ruthenium, rhodium, palladium, osmium, iridium, and silicon; an alloy containing any of the elements; or a compound containing any of the elements. The electrode 116b can also be formed to have a single-layer structure or a stacked-layer structure using any of the materials. Note that the crystalline structure of the electrode 116b may be amorphous, nanocrystal, microcrystalline, or polycrystalline.

In the case where the electrode 116b has a single-layer structure, the electrode 116b is preferably formed using tungsten, molybdenum, or a material containing tungsten and molybdenum. Alternatively, the electrode 116b is preferably formed using an oxide or oxynitride of tungsten, an oxide or oxynitride of molybdenum, or an oxide or oxynitride of a material containing tungsten and molybdenum.

[Insulating layer 141]

The insulating layer 141 can be formed using a material and a method that are similar to those of the insulating layer 119. For the insulating layer 141, a material containing oxygen is preferably used.

[Electrode 115]

The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a layer in contact with the EL layer 117 may be a light-transmitting layer, such as an indium tin oxide layer, and a layer having high reflectance (e.g., aluminum, an alloy containing aluminum, or silver) may be provided in contact with the layer.

For the conductive material that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. In addition, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used. An alloy of silver and copper is preferable because of its high heat resistance. Furthermore, a metal film or an alloy film may be stacked with a metal oxide film. For example, a metal film or an alloy film may be stacked with an aluminum alloy film, by which oxidation of the aluminum alloy film can be suppressed. Other examples of the metal film and the metal oxide film are titanium and titanium oxide, respectively. Alternatively, as described above, a light-transmitting conductive film and a film containing metal materials may be stacked. For example, a stack of silver and indium tin oxide (ITO), a stack of an alloy of silver and magnesium and indium tin oxide, or the like can be used.

The display device having a top-emission structure is described as an example in this embodiment. In the case of a display device having a bottom-emission structure or a dual emission structure, the electrode 115 may be formed using a light-transmitting conductive material.

As a light-transmitting conductive material, indium oxide, indium tin oxide, indium zinc oxide, zinc oxide, or zinc oxide to which gallium is added can be used, for example. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive layer. For example, a stack of ITO and an alloy of silver and magnesium is preferably used, in which case conductivity can be increased. Further alternatively, graphene or the like may be used.

[Partition 114]

The partition 114 is provided in order to prevent an electrical short circuit between the adjacent electrodes 118. In the case of using a metal mask for formation of the EL layer 117 described later, the partition 114 has a function of preventing the contact of metal mask with a region where the light-emitting element 125 is formed. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

[EL Layer 117]

A structure of the EL layer 117 is described in Embodiment 6.

[Electrode 118]

The electrode 118 is used as a cathode in this embodiment, and thus the electrode 118 is preferably formed using a material that has a low work function and can inject electrons into the EL layer 117 described later. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used as the electrode 118. As the buffer layer, an oxide of an alkaline earth metal, a halide, a magnesium-silver, or the like can also be used.

In the case where light emitted from the EL layer 117 is extracted through the electrode 118, the electrode 118 preferably has a property of transmitting visible light.

[Bonding Layers 120, 112, and 122]

A light curable adhesive, a reaction curable adhesive, a thermosetting adhesive, or an anaerobic adhesive can be used as the bonding layer 120, the bonding layer 112, and the bonding layer 122. For example, an epoxy resin, an acrylic resin, a silicone resin, a phenol resin, an imide resin, a poly(vinyl chloride) (PVC) resin, a poly(vinyl butyral) (PVB) resin, or an ethylene-vinyl acetate (EVA) resin can be used. In particular, a material with low moisture permeability, such as an epoxy resin, is preferable. Further alternatively, an adhesive sheet or the like may be used.

A drying agent having a size less than or equal to the wavelength of light emitted from the EL layer 117 is preferably mixed into the bonding layer 120 in the case where the display device has a top-emission structure or into the bonding layer 112 in the case where the display device has a bottom-emission structure, in which case the light-coupling efficiency does not decrease easily and entry of an impurity such as moisture into the display element can be suppressed. For the drying agent, a substance which adsorbs moisture by chemical adsorption, such as alkaline earth metal oxide, for example, calcium oxide or barium oxide; a substance which adsorbs moisture by physical adsorption, such as zeolite or silica gel; or the like can be used. Note that a filler (e.g., titanium oxide or zirconium) with a high refractive index may be mixed into the bonding layer 120.

[Anisotropic Conductive Connection Layer 138]

The anisotropic conductive connection layer 138 can be formed using any of various kinds of anisotropic conductive films (ACF), anisotropic conductive pastes (ACP), and the like.

The anisotropic conductive connection layer 138 is formed by curing a paste-form or sheet-form material that is obtained by mixing conductive particles to a thermosetting resin or a thermosetting and light curable resin. The anisotropic conductive connection layer 138 exhibits an anisotropic conductive property by light irradiation or thermocompression bonding. As the conductive particles used for the anisotropic conductive connection layer 138, for example, particles of a spherical organic resin coated with a thin-film metal such as Au, Ni, or Co can be used.

<Method for Manufacturing Display Device>

Next, a method for manufacturing the display device 100 is described with reference to FIGS. 4A to 4E, FIGS. 5A to 5D, FIGS. 6A to 6F, FIGS. 7A to 7C, FIGS. 8A and 8B, and FIGS. 9A and 9B. FIGS. 4A to 9B are cross-sectional views taken along the dashed-dotted line A1-A2 in FIGS. 1A and 1B and FIGS. 2A and 2B.

<<1. Manufacture of element substrate 171>>

First, a method for manufacturing an element substrate 171 is described as an example. Note that in this embodiment, a substrate 101 over which the light-emitting element 125 is formed is referred to as the element substrate 171.

[Formation of peeling layer 113]

Figure 4A:
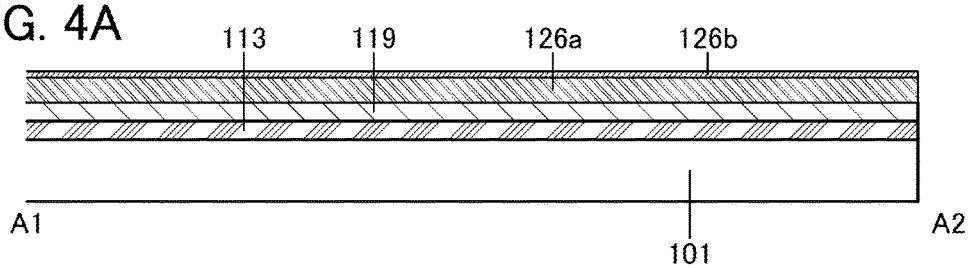
FIGS. 4A to 4E illustrate a manufacturing process of one embodiment of a display device.
Figure 4B:
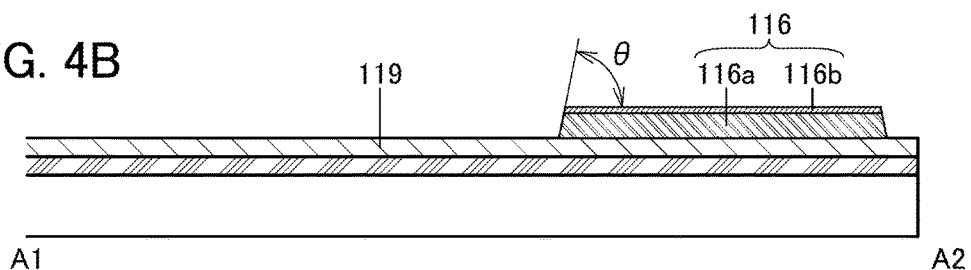

First, a peeling layer 113 is formed over the substrate 101 (see FIG. 4A). The substrate 101 may be exemplified by a semiconductor substrate (e.g., a single crystal substrate or a silicon substrate), an SOI substrate having heat resistance to the processing temperature in this embodiment, a glass substrate, a quartz substrate, a sapphire substrate, a ceramic substrate, a plastic substrate, a metal substrate, a stainless steel substrate, a substrate including stainless steel foil, a tungsten substrate, and a substrate including tungsten foil. As an example of a glass substrate, a barium borosilicate glass substrate, an aluminoborosilicate glass substrate, and soda lime glass substrate can be given.

The peeling layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The peeling layer 113 can also be formed to have a single-layer structure or a stacked-layer structure using any of the materials. Note that the crystalline structure of the peeling layer 113 may be amorphous, microcrystalline, or polycrystalline. The peeling layer 113 can also be formed using a metal oxide such as aluminum oxide, gallium oxide, zinc oxide, titanium dioxide, indium oxide, indium tin oxide, indium zinc oxide, or an oxide including indium, gallium, and zinc (In—Ga—Zn—O, IGZO).

The peeling layer 113 can be formed by a sputtering method, a CVD method, a coating method, a printing method, or the like. Note that the coating method includes a spin coating method, a droplet discharge method, and a dispensing method.

In the case where the peeling layer 113 has a single-layer structure, the peeling layer 113 is preferably formed using tungsten, molybdenum, or a material containing tungsten and molybdenum. Alternatively, the peeling layer 113 is preferably formed using an oxide or oxynitride of tungsten, an oxide or oxynitride of molybdenum, or an oxide or oxynitride of a material containing tungsten and molybdenum.

In the case where the peeling layer 113 has a stacked-layer structure including, for example, a layer containing tungsten and a layer containing an oxide of tungsten, the layer containing an oxide of tungsten may be formed as follows: the layer containing tungsten is formed first and then an insulating oxide layer is formed in contact therewith, so that the layer containing an oxide of tungsten is formed at the interface between the layer containing tungsten and the insulating oxide layer. Alternatively, the layer containing an oxide of tungsten may be formed by performing thermal oxidation treatment, oxygen plasma treatment, treatment with an oxidizing solution such as ozone water, or the like on the surface of the layer containing tungsten. Moreover, an insulating layer may be provided between the substrate 101 and the peeling layer 113.

In this embodiment, aluminoborosilicate glass is used for the substrate 101. As the peeling layer 113, a tungsten layer is formed over the substrate 101 by a sputtering method.
[Formation of insulating layer 119]

Next, the insulating layer 119 is formed over the peeling layer 113 (see FIG. 4A). The insulating layer 119 can prevent or reduce diffusion of an impurity element from the substrate 101 or the like. After the substrate 101 is replaced with the substrate 111, the insulating layer 119 can prevent or reduce diffusion of an impurity element from the substrate 111, the bonding layer 112, or the like to the light-emitting element 125. The thickness of the insulating layer 119 is preferably greater than or equal to 30 nm and less than or equal to 2 μm, further preferably greater than or equal to 50 nm and less than or equal to 1 μm, or still further preferably greater than or equal to 50 nm and less than or equal to 500 nm. In this embodiment, the insulating layer 119 is formed by stacking a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film by a plasma CVD method from the substrate 101 side.

Note that it is preferable to expose the surface of the peeling layer 113 to an atmosphere containing oxygen before the formation of the insulating layer 119.

As the gas used in the atmosphere containing oxygen, oxygen, dinitrogen monoxide, nitrogen dioxide, carbon dioxide, carbon monoxide, or the like can be used. A mixed gas of a gas containing oxygen and another gas may be used. For example, a mixed gas of a gas containing oxygen and a rare gas, for example, a mixed gas of carbon dioxide and argon may be used. Oxidizing the surface of the peeling layer 113 can facilitate peeling of the substrate 101 performed later.

In this embodiment, a sample is placed in a treatment chamber of a plasma CVD apparatus, and then dinitrogen monoxide is supplied to the treatment chamber and the plasma atmosphere is generated. After that, the sample surface is exposed to the plasma atmosphere. Subsequently, the insulating layer 119 is formed on the sample surface.
[Formation of electrode 116]

Next, a conductive layer 126a and a conductive layer 126b for forming the electrode 116 are formed over the insulating layer 119. First, as the conductive layer 126a, a three-layer metal film in which a layer of aluminum is provided between two layers of molybdenum is formed over the insulating layer 119 by a sputtering method. Subsequently, as the conductive layer 126b, a layer of tungsten is formed over the conductive layer 126a by a sputtering method (see FIG. 4A).

After that, a resist mask is formed over the conductive layer 126b, and the conductive layers 126a and 126b are etched into a desired shape using the resist mask. In the above-described manner, the electrode 116 (the electrodes 116a and 116b) is formed. The resist mask can be formed by a lithography method, a printing method, an inkjet method, or the like as appropriate. Formation of the resist mask by an inkjet method needs no photomask; thus, manufacturing cost can be reduced.

The etching of the conductive layers 126a and 126b may be performed by a dry etching method, a wet etching method, or both of them. In the case where the conductive layers 126a and 126b are etched by a wet etching method, a solution obtained by mixing phosphoric acid, acetic acid, and nitric acid, a solution containing oxalic acid, a solution containing phosphoric acid, or the like can be used as an etchant. After the etching treatment, the resist mask is removed (see FIG. 4B).

When the electrode 116 (including other electrodes and wirings formed using the same layer) has a taper-shaped end portion, the coverage with a layer that covers the side surfaces of the electrode 116 can be improved. Specifically, the end portion has a taper angle θ of 80° or less, preferably 60° or less, or further preferably 45° or less. Note that the "taper angle" refers to an inclination angle formed by a side surface and a bottom surface. A taper angle smaller than 90° is called forward tapered angle and a taper angle larger than or equal to 90° is called inverse tapered angle (see FIG. 4B).

Alternatively, the cross-sectional shape of the end portion of the electrode 116 has a plurality of steps, so that the coverage with the layer formed thereon can be improved. The above description is not limited to the electrode 116 and, when the end portion of each layer has a forward taper shape or a step-like shape in a cross section, a phenomenon that a layer formed to cover the end portion is cut (disconnection) at the end portion can be prevented, so that the coverage becomes favorable.

[Formation of Insulating Layer 127]

Figure 4C:
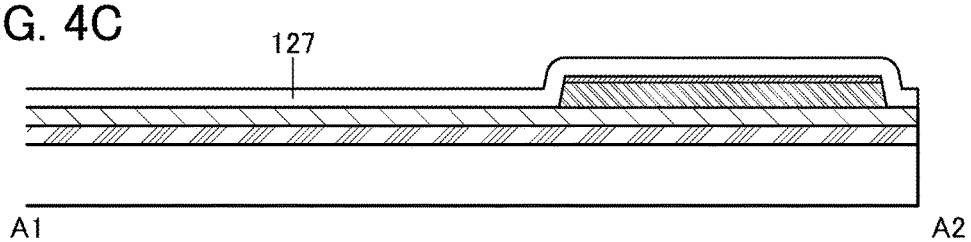

Next, an insulating layer 127 is formed over the electrode 116 and the insulating layer 119 (see FIG. 4C). In this embodiment, a silicon oxynitride film is formed by a plasma CVD method as the insulating layer 127. It is preferable to oxidize the surface of the electrode 116b prior to the formation of the insulating layer 127. For example, it is preferable to expose the surface of the electrode 116b to an atmosphere of a gas containing oxygen or an atmosphere of plasma containing oxygen before the formation of the insulating layer 127. Oxidizing the surface of the electrode 116b can facilitate formation of the opening 132 performed later.

In this embodiment, the sample is placed in a treatment chamber of a plasma CVD apparatus, and then dinitrogen monoxide is supplied to the treatment chamber and the plasma atmosphere is generated. After that, the sample surface is exposed to the plasma atmosphere. Subsequently, a silicon oxynitride film is formed on the sample surface.

Figure 4D:
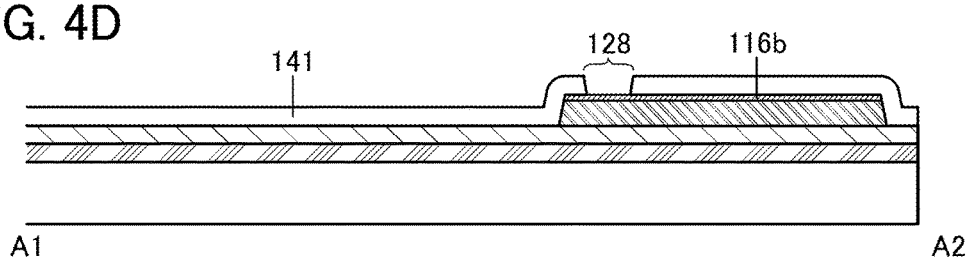

Next, a resist mask is formed over the insulating layer 127, and part of the insulating layer 127 overlapping with the electrode 116 is selectively removed using the resist mask, so that the insulating layer 141 having an opening 128 is formed (see FIG. 4D). The etching of the insulating layer 127 may be performed by a dry etching method, a wet etching method, or both of them. At this time, an oxide on the surface of the electrode 116b overlapping with the opening 128 is also removed.

[Formation of Electrode 115]

Figure 4E:
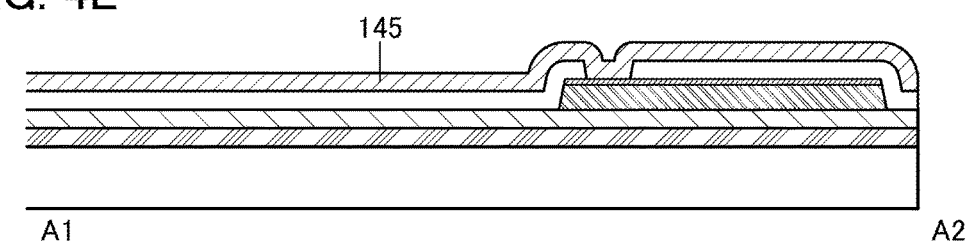

Next, a conductive layer 145 for forming the electrode 115 is formed over the insulating layer 127 (see FIG. 4E). The conductive layer 145 can be formed using a material and a method that are similar to those of the conductive layer 126a (electrode 116a).

Figure 5A:
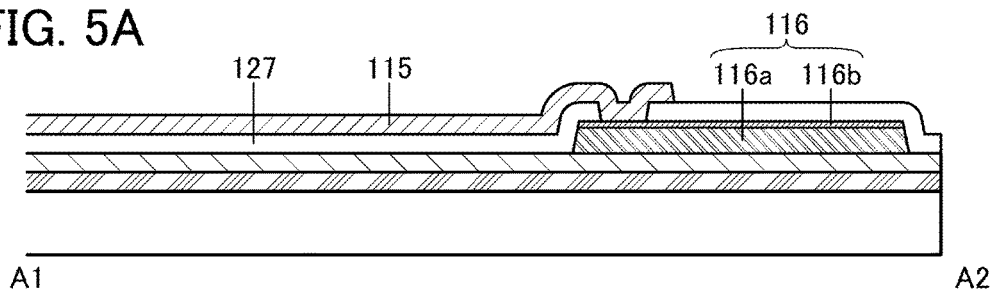
FIGS. 5A to 5D illustrate a manufacturing process of one embodiment of a display device.

Next, a resist mask is formed over the conductive layer 145, and part of the conductive layer 145 is selectively removed using the resist mask, so that the electrode 115 is formed (see FIG. 5A). The etching of the conductive layer 145 may be performed by a dry etching method, a wet etching method, or both of them. In this embodiment, the conductive layer 145 (electrode 115) is formed using a material in which indium tin oxide is stacked over silver. The electrode 115 and the electrode 116 are electrically connected to each other through the opening 128.

[Formation of Partition 114]

Figure 5B:
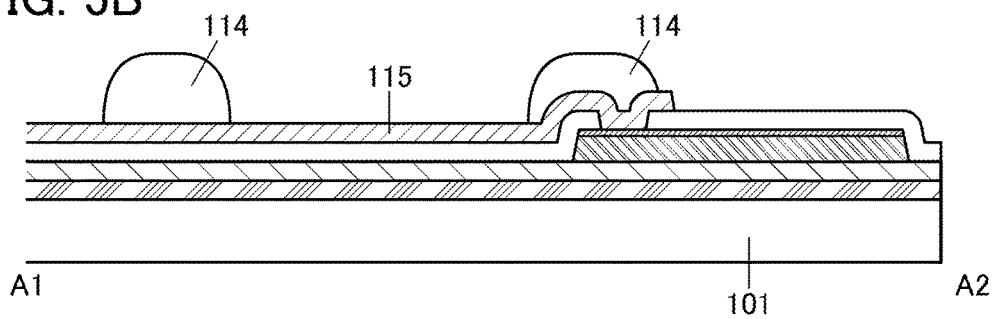

Next, the partition 114 is formed (see FIG. 5B). In this embodiment, the partition 114 is formed in such a manner that a photosensitive organic resin material is applied by a coating method and processed into a desired shape. In this embodiment, the partition 114 is formed using a photosensitive polyimide resin. [Formation of EL Layer 117]

Figure 5C:
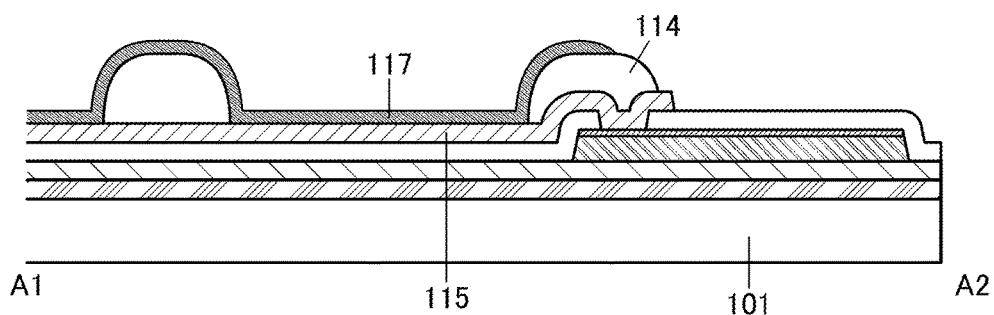
Figure 5D:
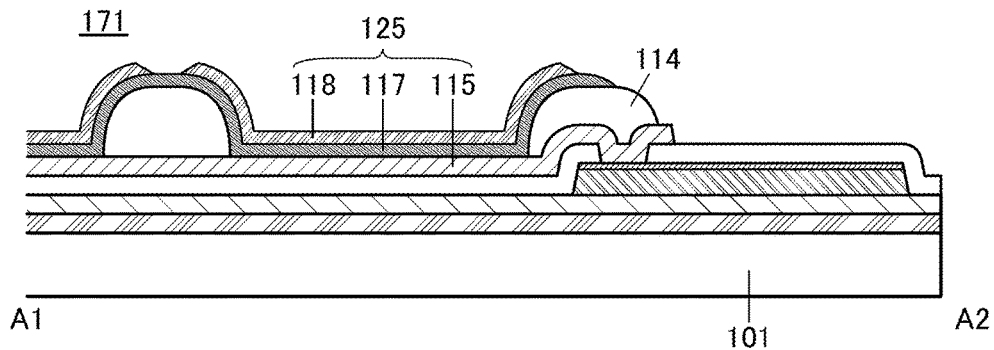

Next, the EL layer 117 is formed over the electrode 115 and the partition 114 (see FIG. 5C).

[Formation of Electrode 118]

Next, the electrode 118 is formed over the EL layer 117. In this embodiment, an alloy of magnesium and silver is used for the electrode 118. The electrode 118 can be formed by an evaporation method, a sputtering method, or the like (see FIG. 5D).

<<2. Manufacture of counter substrate 181>>

Next, a method for manufacturing a counter substrate 181 is described as an example. Note that in this embodiment, a substrate 102 over which the coloring layer 266 and the like are formed is referred to as the counter substrate 181.

[Formation of Peeling Layer 143]

First, a peeling layer 143 is formed over the substrate 102 (see FIG. 6A). The substrate 102 can be formed using a material similar to that of the substrate 101. Note that the same material or different materials may be used for the substrate 101 and the substrate 102. The peeling layer 143 can be formed in a manner similar to that of the peeling layer 113. Moreover, an insulating layer may be provided between the substrate 102 and the peeling layer 143. In this embodiment, aluminoborosilicate glass is used for the substrate 102. The peeling layer 143 is formed of tungsten over the substrate 102 by a sputtering method.

Note that it is preferable to expose the surface of the peeling layer 143 to an atmosphere containing oxygen or a plasma atmosphere containing oxygen after the formation of the peeling layer 143. Oxidizing the surface of the peeling layer 143 can facilitate peeling of the substrate 102 performed later.

[Formation of Insulating Layer 149]

Next, an insulating layer 149 is formed over the peeling layer 143 (see FIG. 6A). The insulating layer 149 can be formed using a material and a method that are similar to those of the insulating layer 119. In this embodiment, the insulating layer 149 is formed by stacking a 200-nm-thick silicon oxynitride film, a 140-nm-thick silicon nitride oxide film, and a 100-nm-thick silicon oxynitride film by a plasma CVD method from the substrate 102 side.

[Formation of Peeling Layer 123 and Insulating Layer 129]

Subsequently, a resist mask is formed over the insulating layer 149, and part of the insulating layer 149 and part of the peeling layer 143 are selectively removed using the resist mask, so that a peeling layer 123 and the insulating layer 129 having an opening 139 are formed. The resist mask can be formed by a lithography method, a printing method, an inkjet method, or the like as appropriate. Formation of the resist mask by an inkjet method needs no photomask; thus, manufacturing cost can be reduced.

The etching of the insulating layer 149 and the peeling layer 143 may be performed by a dry etching method, a wet etching method, or both of them. After the etching treatment, the resist mask is removed (see FIG. 6B).

[Formation of Light-Blocking Layer 264]

Next, a layer 274 for forming the light-blocking layer 264 is formed over the insulating layer 129 (see FIG. 6C). The layer 274 may have a single-layer structure or a stacked-layer structure including two or more layers. Examples of a material for the layer 274 are a metal material including chromium, titanium, nickel, or the like; an oxide material including chromium, titanium, nickel, or the like; and a resin material including a metal material, a pigment, or dye.

In the case where the layer 274 is formed using the metal material, the oxide material, or the resin material, a resist mask is formed over the layer 274, and the layer 274 is etched into a desired shape using the resist mask, so that the light-blocking layer 264 is formed (see FIG. 6D). With a macromolecular material in which carbon black is dispersed, direct writing of the light-blocking layer 264 can be performed over the insulating layer 129 by an inkjet method.

The light-blocking layer 264 has functions of blocking light emitted from an adjacent display element and suppressing color mixture between adjacent display elements.

[Formation of Coloring Layer 266]

Next, the coloring layer 266 is formed over the insulating layer 129 (see FIG. 6E). The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer 266 is formed in a desired position with any of various materials by a printing method, an inkjet method, or a photolithography method. At this time, the coloring layer 266 is preferably provided so as to partly overlap with the light-blocking layer 264 because light leakage can be reduced. Color display can be performed by providing the coloring layers 266 of different colors in different pixels.

Figure 7A:
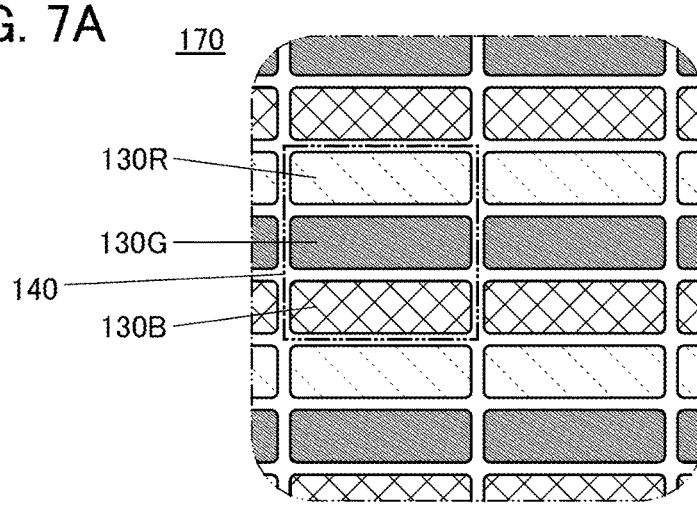
FIGS. 7A to 7C each illustrate an example of a pixel configuration of one embodiment of a display device.
Figure 7B:
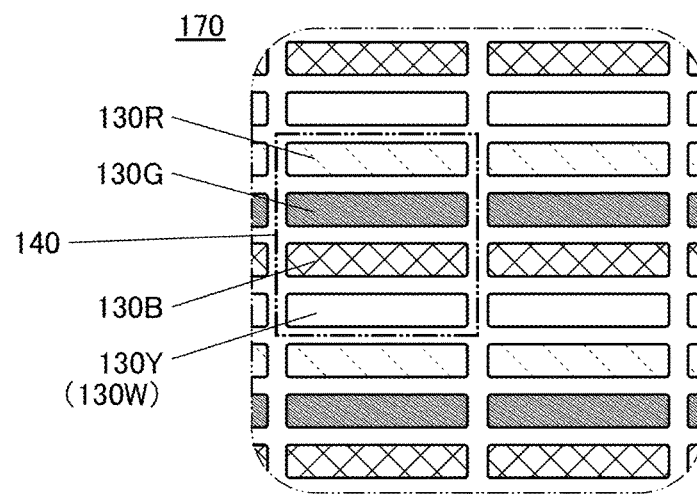
Figure 7C:
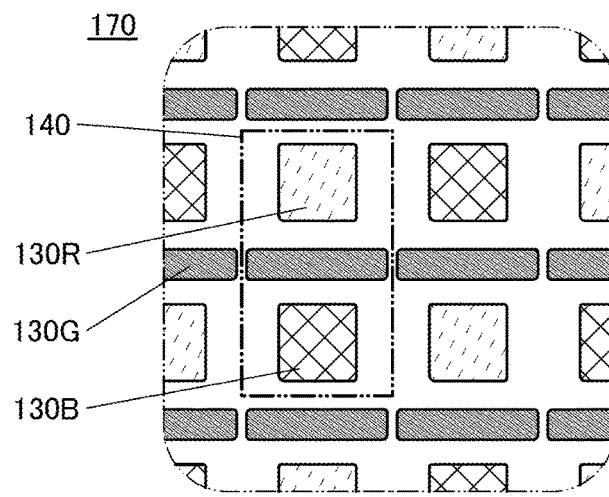

Here, examples of a pixel configuration for achieving color display are described with reference to FIGS. 7A to 7C. FIGS. 7A to 7C are enlarged plan views of a region 170 in the display region 131 of FIG. 1A. For example, as illustrated in FIG. 7A, full color display can be achieved in such a manner that the red, green, and blue coloring layers 266 are used so as to correspond to three pixels 130 which serves as one pixel 140. At this time, the pixel 130 functions as a subpixel of the pixel 140. In FIG. 7A, the pixel 130 emitting red light, the pixel 130 emitting green light, and the pixel 130 emitting blue light are illustrated as a pixel 130R, a pixel 130G, and a pixel 130B, respectively. Note that the colors of the coloring layers 266 may be a color other than red, green, and blue; for example, the coloring layer 266 may be yellow, cyan, magenta, or the like.

As illustrated in FIG. 7B, four pixels 130 may be collectively used as one pixel 140. For example, the coloring layers 266 corresponding to the four pixels 130 may be red, green, blue, and yellow. In FIG. 7B, the pixel 130 emitting red light, the pixel 130 emitting green light, the pixel 130 emitting blue light, and the pixel 130 emitting yellow light are illustrated as a pixel 130R, a pixel 130G, a pixel 130B, and a pixel 130Y, respectively. By increasing the number of subpixels (pixels 130) included in one pixel 140, the color reproducibility can be particularly improved. Thus, the display quality of the display device can be improved.

Alternatively, the coloring layers 266 corresponding to the four pixels 130 may be red, green, blue, and white. With the pixel 130 emitting white light (a pixel 130W), the luminance of the display region can be increased. Note that in the case of the pixel 130 emitting white light, it is not necessary to provide the coloring layer 266. Without a white coloring layer 266, there is no luminance reduction at the time of transmitting light through the coloring layer 266; thus, the luminance of the display region can be increased. Moreover, power consumption of the display device can be reduced. On the other hand, color temperature of white light can be controlled with the white coloring layer 266. Thus, the display quality of the display device can be improved. Depending on the intended use of the display device, the two pixels 130 may be used as one pixel 140.

Note that the occupation areas or shapes of the pixels 130 may be the same or different. In addition, arrangement is not limited to stripe arrangement. For example, delta arrangement, Bayer arrangement, pentile arrangement, or the like can be used. FIG. 7C illustrates an example of pentile arrangement.

[Formation of Overcoat Layer 268]

Next, the overcoat layer 268 is formed over the light-blocking layer 264 and the coloring layer 266 (see FIG. 6F).

For the overcoat layer 268, an organic insulating layer of an acrylic resin, an epoxy resin, a polyimide resin, or the like can be used. With the overcoat layer 268, an impurity or the like contained in the coloring layer 266 can be inhibited from diffusing into the light-emitting element 125 side, for example. Note that the overcoat layer 268 is not necessarily formed.

A light-transmitting conductive film may be formed as the overcoat layer 268, by which the light 151 emitted from the light-emitting element 125 can pass through the overcoat layer 268 and ionized impurities can be prevented from passing through the overcoat layer 268.

The light-transmitting conductive film can be formed using, for example, the above-described light-transmitting conductive material. A metal film that is thin enough to have a light-transmitting property can also be used.

Through the above steps, the counter substrate 181 can be formed. Note that the counter substrate 181 may not be provided with the coloring layer 266 or the like.

<<3. Attachment of Element Substrate 171 and Counter Substrate 181>>

Next, the element substrate 171 and the counter substrate 181 are attached to each other with the bonding layer 120 provided therebetween. At the attachment, the light-emitting element 125 included in the element substrate 171 and the coloring layer 266 included in the counter substrate 181 are arranged so as to face each other (see FIG. 8A).

<<4. Peeling of Substrate 101 and Substrate 102 and Attachment of Substrate 111 and Substrate 121 >>

Next, an example of a method for replacing the substrate 101 with the substrate 111 and then replacing the substrate 102 with the substrate 121 is described.

[Peeling of Substrate 101]

Figure 8A:
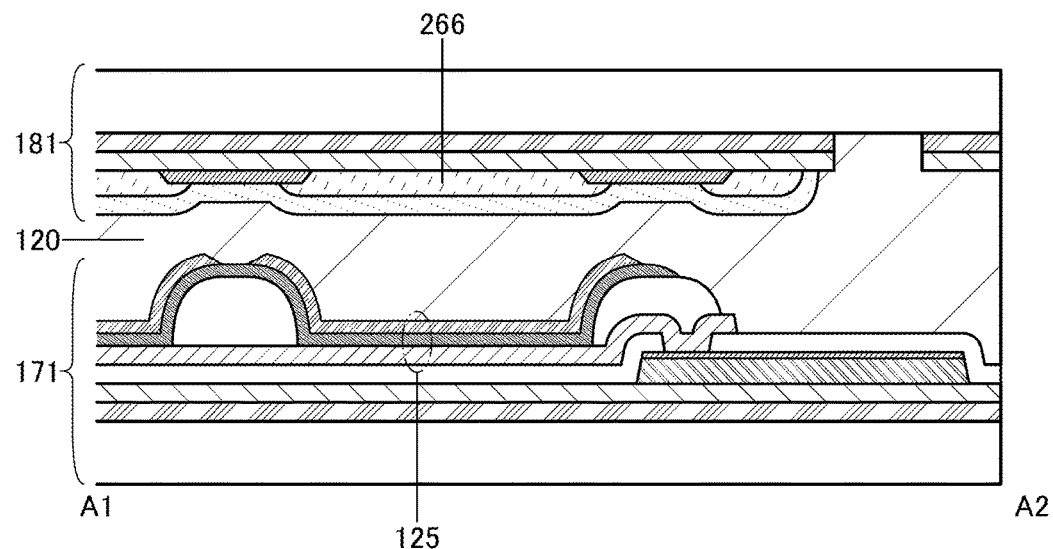
FIGS. 8A and 8B illustrate a manufacturing process of one embodiment of a display device.
Figure 8B:
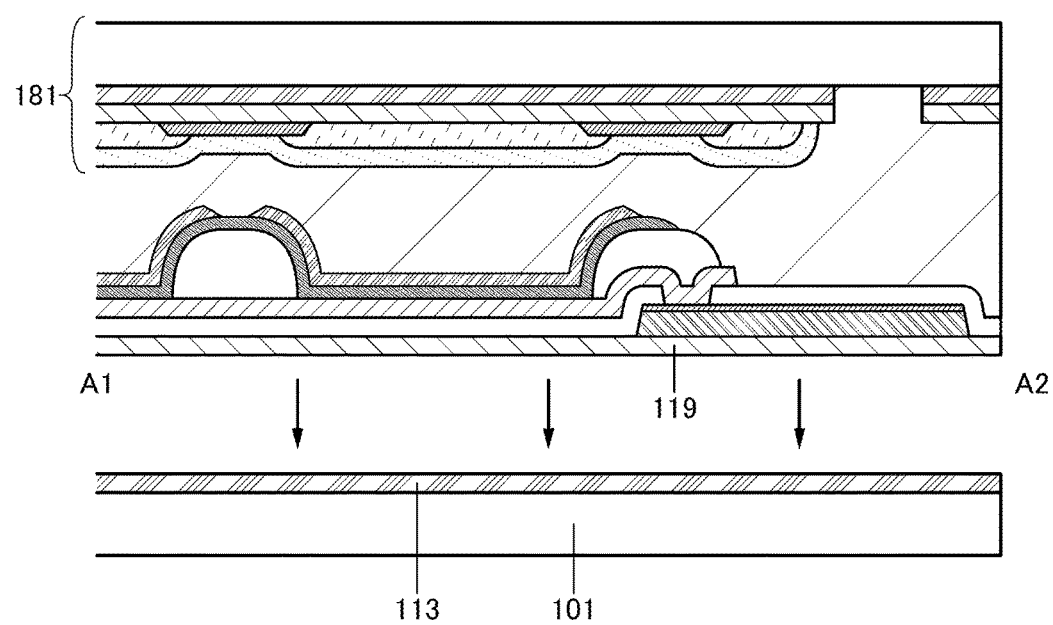

First, the substrate 101 included in the element substrate 171 is peeled off from the insulating layer 119 together with the peeling layer 113 (see FIG. 8B). As a peeling method, mechanical force (a peeling process with a human hand or a gripper, a separation process by rotation of a roller, ultrasonic waves, or the like) may be used. For example, a cut is made in the interface between the peeling layer 113 and the insulating layer 119 from the side surface of the element substrate 171 with a sharp edged tool, by laser beam irradiation, or the like, and water is injected into the cut. The interface between the peeling layer 113 and the insulating layer 119 absorbs water by capillarity action, so that the substrate 101 can be peeled off easily from the insulating layer 119 together with the peeling layer 113.

[Attachment of Substrate 111]

Figure 9A:
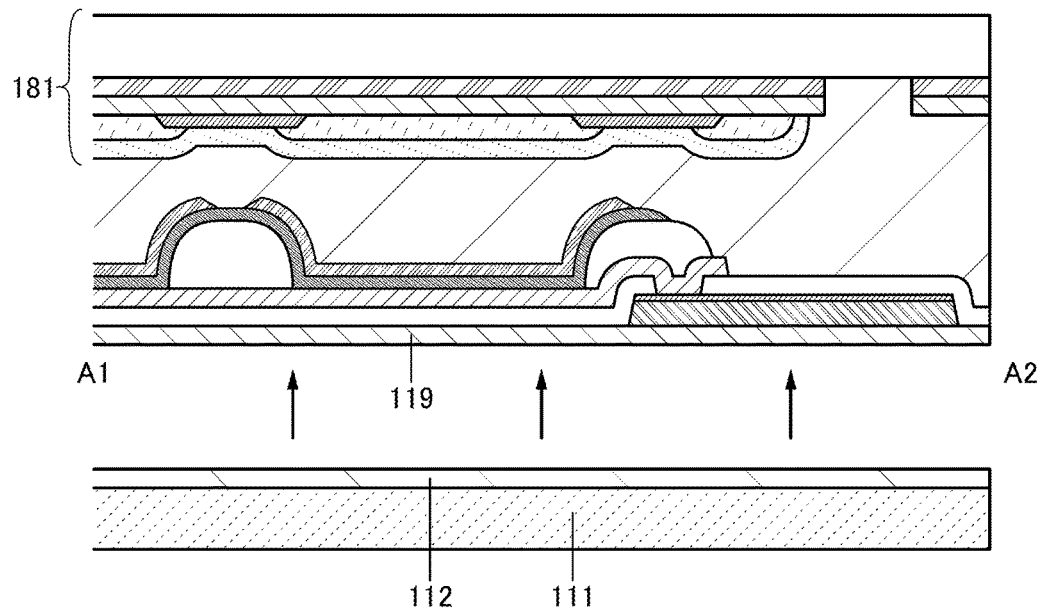
FIGS. 9A and 9B illustrate a manufacturing process of one embodiment of a display device.

Next, the substrate 111 is attached to the insulating layer 119 with the bonding layer 112 provided therebetween (see FIG. 9A).

[Peeling of Substrate 102]

Next, the substrate 102 included in the counter substrate 181 is peeled off from the insulating layer 129 together with the peeling layer 143.

Figure 9B:
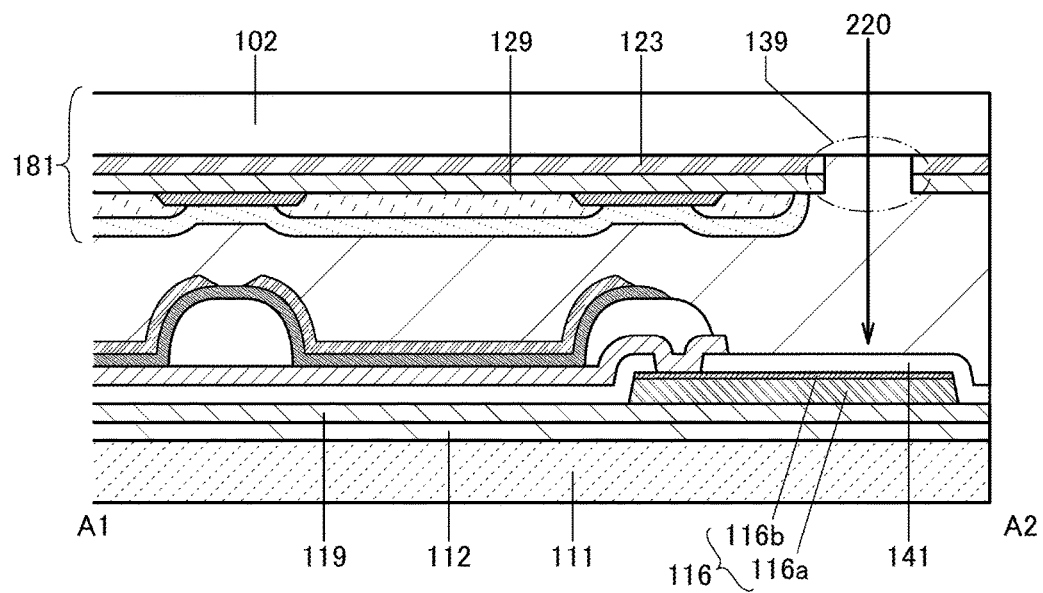

Note that before the substrate 102 is peeled off, at least part of the electrode 116b may be irradiated with light 220 through the opening 139 as illustrated in FIG. 9B. As the light 220, infrared light, visible light, or ultraviolet light emitted from a halogen lamp, a high pressure mercury lamp, or the like can be used. In addition, as the light 220, a continuous wave laser beam or a pulsed laser beam can be used. In particular, the pulsed laser beam is preferable because pulsed laser beam with high energy can be emitted instantaneously. The wavelength of the light 220 is preferably 400 nm to 1.2 μm, further preferably 500 nm to 900 nm, or still further preferably 500 nm to 700 nm. In the case of the pulsed laser beam used as the light 220, the pulse width is preferably 1 ns (nanosecond) to 1 μs (microsecond), further preferably 5 ns to 500 ns, or still further preferably 5 ns to 100 ns. For example, a pulsed laser beam with the wavelength of 532 nm and the pulse width of 10 ns may be used.

By irradiation with the light 220, the temperature of the electrode 116b rises, and adhesion between the electrode 116b and the insulating layer 141 is lowered because of thermal stress, emission of gas that remains in the layer, or the like. As a result, the insulating layer 141 is easily peeled off from the electrode 116b.

FIG. 10A illustrates a state in which the substrate 102 included in the counter substrate 181 is peeled off from the insulating layer 129 together with the peeling layer 143. An opening 132a is formed by removal of the bonding layer 120 overlapping with the opening 139 and the insulating layer 141 overlapping with the opening 139 at the peeling. Note that the substrate 102 is preferably arranged such that the opening 139 is placed on the inner side than the electrode 116, in which case the opening 132a can be formed easily. That is, it is preferable that the opening 132a be formed on the inner side than the end portion of the electrode 116 in the cross-sectional view. The width W1 of the opening 132a is preferably smaller than the width W2 of the surface of the electrode 116 (see FIG. 10B).

[Attachment of Substrate 121]

Next, the substrate 121 having an opening 132b is attached to the insulating layer 129 with the bonding layer 122 provided therebetween (see FIG. 10B). The substrate 121 and the insulating layer 129 are attached to each other so that the opening 132a overlaps with the opening 132b. In this embodiment, the openings 132a and 132b are collectively referred to as an opening 132. The surface of the electrode 116 is exposed from the opening 132.

Figure 11A:
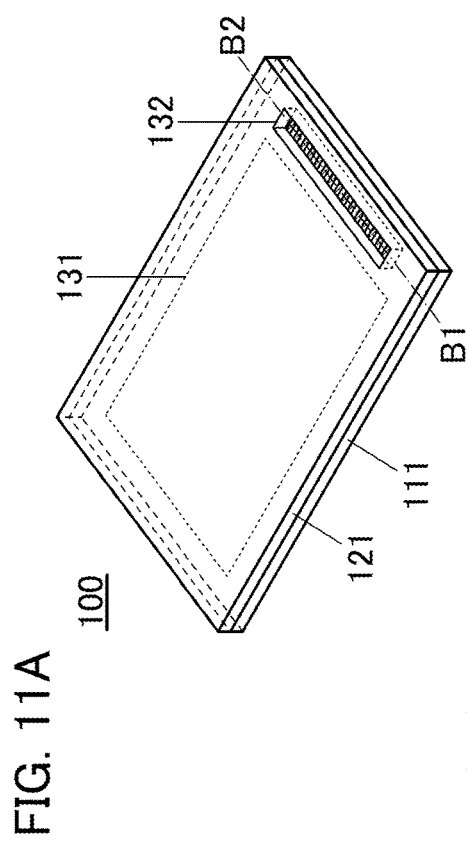
FIGS. 11A and 11B are a perspective view and a cross-sectional view illustrating one embodiment of a display device.
Figure 11B:
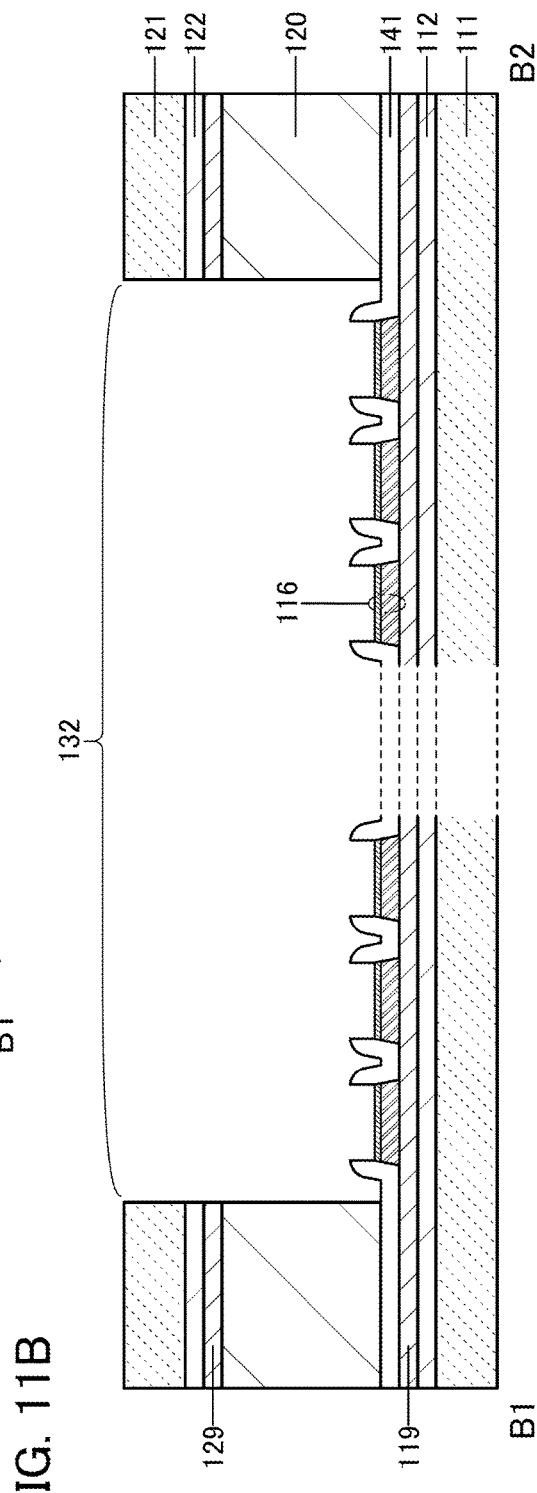
Figure 12A:
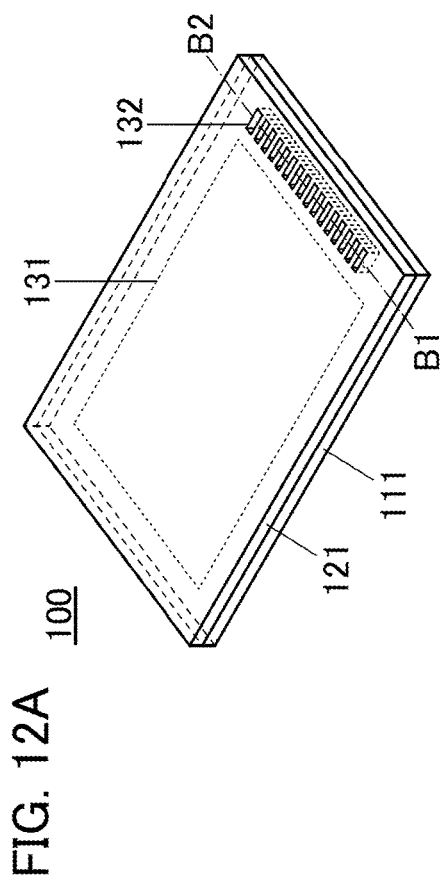
FIGS. 12A and 12B are a perspective view and a cross-sectional view illustrating one embodiment of a display device.
Figure 12B:
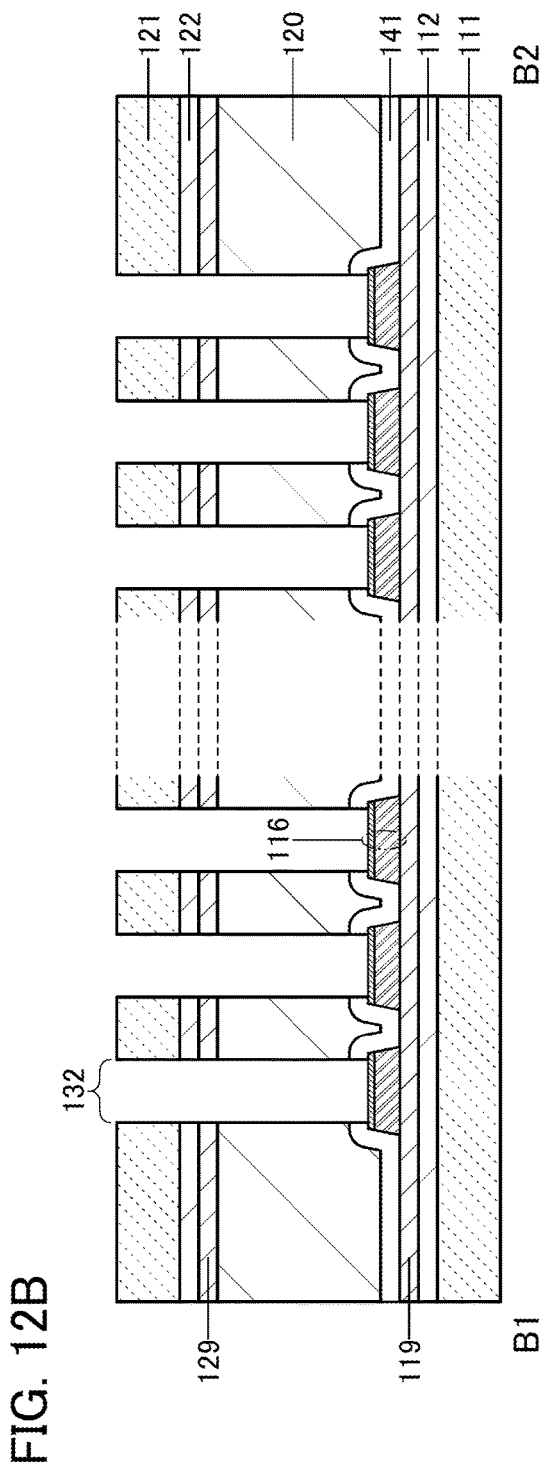

In the display device 100 of one embodiment of the present invention, a plurality of electrodes 116 may be provided in one opening 132 or the opening 132 may be provided for each electrode 116. FIG. 11A is a perspective view of the display device 100 in which a plurality of electrodes 116 are provided in one opening 132, and FIG. 11B is a cross-sectional view taken along the dashed-dotted line B1-B2 in FIG. 11A. FIG. 12A is a perspective view of the display device 100 in which the opening 132 is provided for each electrode 116, and FIG. 12B is a cross-sectional view taken along the dashed-dotted line B1-B2 in FIG. 12A.

The opening 132 is provided on the inner side than the end portion of the substrate 121 in a plan view, so that the outer edge of the opening 132 can be supported by the substrate 121 and the substrate 111. Thus, the mechanical strength of a region where the external electrode 124 and the electrode 116 are connected to each other is unlikely to decrease, and unintentional deformation of the connected region can be reduced. Note that an effect of reducing the deformation of the connected region can be improved in the case where the opening 132 is provided for each electrode 116 as compared with the case where a plurality of electrodes 116 are provided in one opening 132 (see FIG. 12B). According to one embodiment of the present invention, breakage of the display device 100 can be prevented, and the reliability of the display device 100 can be improved.

Figure 13A:
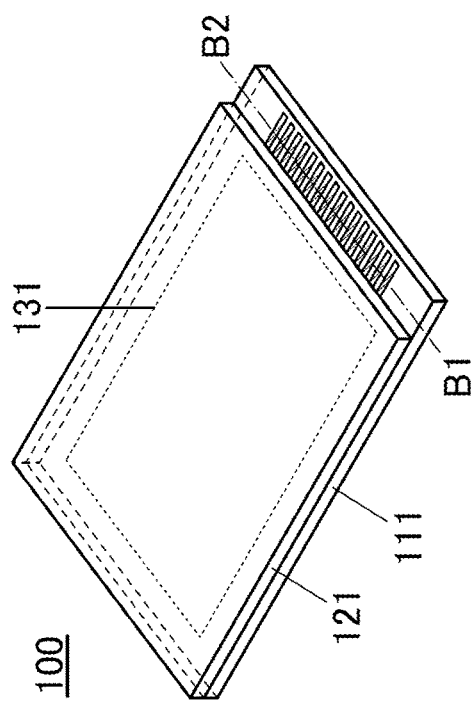
FIGS. 13A and 13B are a perspective view and a cross-sectional view illustrating one embodiment of a display device.
Figure 13B:
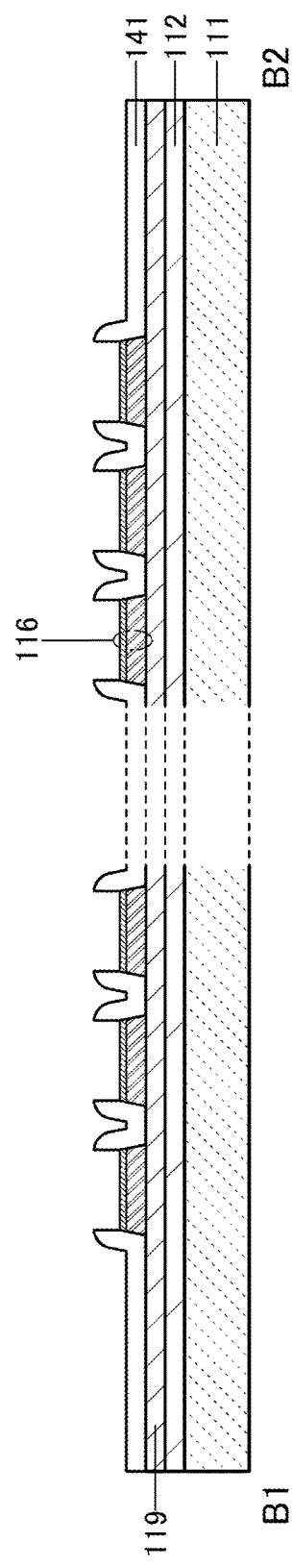

The surface of the electrode 116 may be exposed in such a manner that the opening 132 is not provided and the substrate 121 is attached to the insulating layer 129 so that the end portion of the substrate 111 and the end portion of the substrate 121 do not align with each other. FIG. 13A is a perspective view of the display device 100 in which the surface of the electrode 116 is exposed so that the end portion of the substrate 111 and the end portion of the substrate 121 do not align with each other, and FIG. 13B is a cross-sectional view taken along the dashed-dotted line B1-B2 in FIG. 13A. Note that FIG. 13A illustrates, as an example, the case where the substrate 121 which is smaller than the substrate 111 is provided over the substrate 111; however, the substrate 121 and the substrate 111 may be the same in size or the substrate 121 may be larger than the substrate 111.

The display device 100 illustrated in FIGS. 13A and 13B does not have the opening 132 in the substrate 121; therefore, there is no need to perform alignment of the opening 132 and the electrode 116. According to one embodiment of the present invention, the productivity of the display device 100 can be improved.

According to one embodiment of the present invention, part of the substrate 121 does not need to be removed by a laser beam or with an edged tool because the opening 132 provided to expose the surface of the electrode 116 is not necessary; thus, the electrode 116 and the display region 131 are not damaged easily.

Alternatively, one or more of layers each formed using a material having a specific function, such as an anti-reflection layer, a light diffusion layer, a microlens array, a prism sheet, a retardation plate, or a polarizing plate, (hereinafter referred to as "functional layers") may be provided on an outer side than the substrate 111 or the substrate 121 from which the light 151 is emitted. As the anti-reflection layer, for example, a circularly polarizing plate or the like can be used. With the functional layer, a display device having a higher display quality can be achieved. Moreover, power consumption of the display device can be reduced.

Figure 14A:
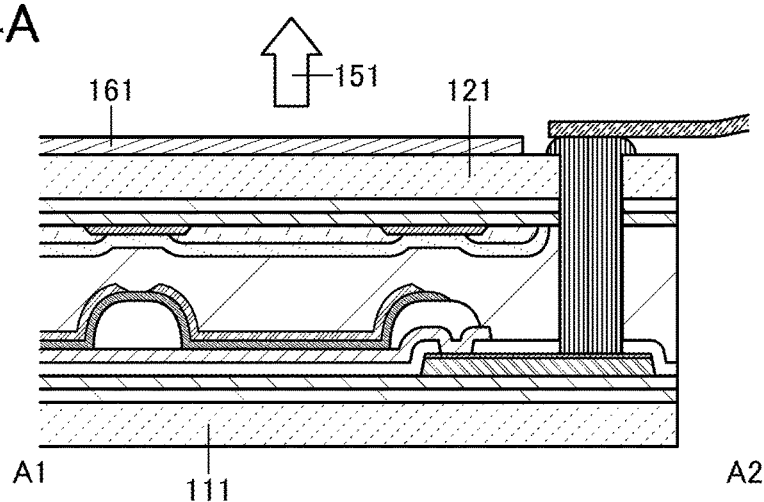
FIGS. 14A to 14C are each a cross-sectional view illustrating one embodiment of a display device.
Figure 14B:
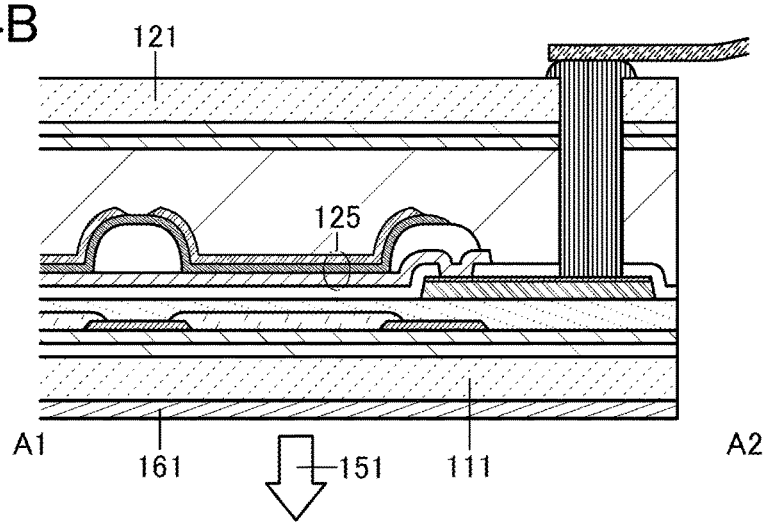
Figure 14C:
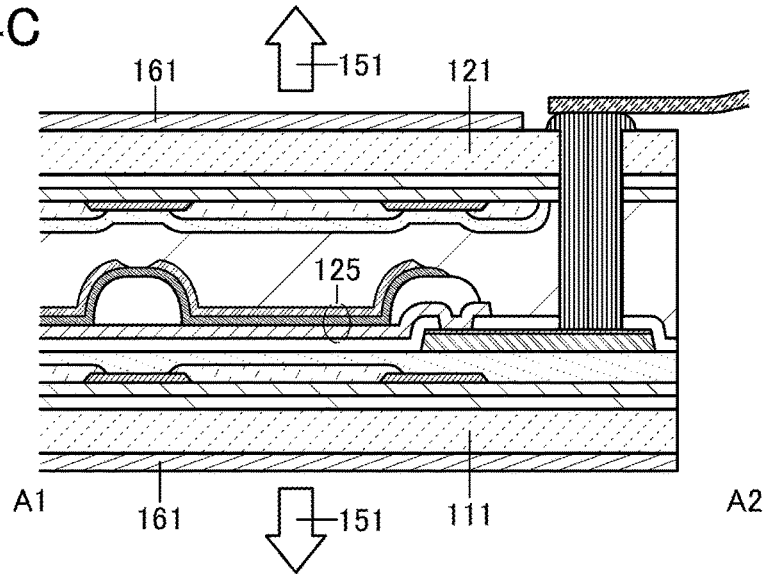

FIG. 14A is a cross-sectional view of the display device 100 having a top-emission structure including a functional layer 161. FIG. 14B is a cross-sectional view of the display device 100 having a bottom-emission structure including the functional layer 161. FIG. 14C is a cross-sectional view of the display device 100 having a dual-emission structure including the functional layer 161.

For the substrate 111 or the substrate 121, a material having a specific function may be used. For example, a circularly polarizing plate may be used as the substrate 111 or the substrate 121. Alternatively, for example, the substrate 111 or the substrate 121 may be formed using a retardation plate, and a polarizing plate may be provided so as to overlap with the substrate. As another example, the substrate 111 or the substrate 121 may be formed using a prism sheet, and a circularly polarizing plate may be provided so as to overlap with the substrate. With the use of the material having a specific function for the substrate 111 or the substrate 121, improvement of display quality and reduction of the manufacturing cost can be achieved.

[Formation of External Electrode 124]

Next, the anisotropic conductive connection layer 138 is formed in and on the opening 132, and the external electrode 124 for inputting electric power or a signal to the display device 100 is formed over the anisotropic conductive connection layer 138 (see FIGS. 1A and 1B). The electrode 116 is electrically connected to the external electrode 124 through the anisotropic conductive connection layer 138. Thus, electric power or a signal can be input to the display device 100. Note that an FPC can be used as the external electrode 124. A metal wire can also be used as the external electrode 124. Although the anisotropic conductive connection layer 138 may be used to connect the metal wire and the electrode 116 to each other, the connection can be made by a wire bonding method without using the anisotropic conductive connection layer 138. Alternatively, the metal wire and the electrode 116 can be connected to each other by a soldering method.

This embodiment can be implemented in an appropriate combination with any of the structures described in the other embodiments.

Embodiment 2

Figure 15A:
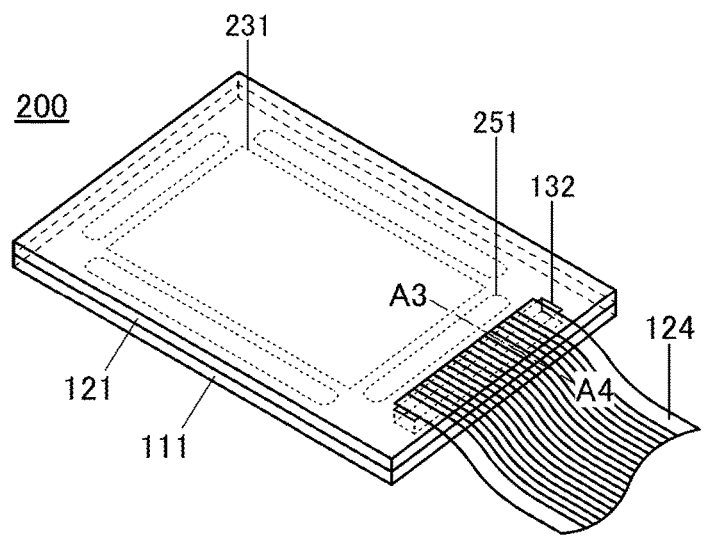
FIGS. 15A and 15B are a perspective view and a cross-sectional view illustrating one embodiment of a display device.
Figure 15B:
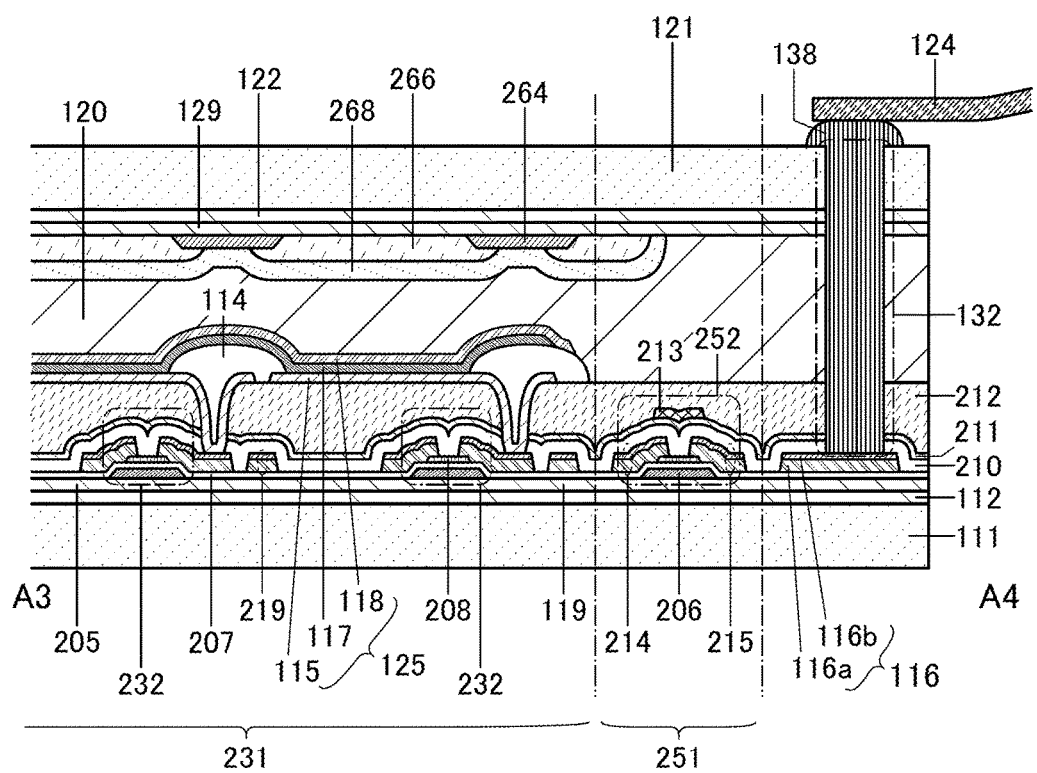

In this embodiment, a display device 200 having a structure different from the structure of the display device 100 described in the above embodiment will be described with reference to FIGS. 15A and 15B. FIG. 15A is a top view of the display device 200, and FIG. 15B is a cross-sectional view taken along the dashed-dotted line A3-A4 in FIG. 15A.

<Structure of Display Device>

The display device 200 described in this embodiment includes a display region 231 and a peripheral circuit 251. The display device 200 further includes the electrode 116 and the light-emitting element 125 including the electrode 115, the EL layer 117, and the electrode 118. A plurality of light-emitting elements 125 are formed in the display region 231. A transistor 232 for controlling the amount of light emitted from the light-emitting element 125 is connected to each light-emitting element 125.

The electrode 116 is electrically connected to the external electrode 124 through the anisotropic conductive connection layer 138 formed in the opening 132. In addition, the electrode 116 is electrically connected to the peripheral circuit 251.

The peripheral circuit 251 includes a plurality of transistors 252. The peripheral circuit 251 has a function of determining which of the light-emitting elements 125 in the display region 231 is supplied with a signal from the external electrode 124.

In the display device 200 illustrated in FIGS. 15A and 15B, the substrate 111 and the substrate 121 are attached to each other with the bonding layer 120 provided therebetween. An insulating layer 205 is formed over the substrate 111 with the bonding layer 112 provided therebetween. The insulating layer 205 is preferably formed as a single layer or a multilayer using any of silicon oxide, silicon nitride, silicon oxynitride, silicon nitride oxide, aluminum oxide, aluminum oxynitride, and aluminum nitride oxide. The insulating layer 205 can be formed by a sputtering method, a CVD method, a thermal oxidation method, a coating method, a printing method, or the like.

The insulating layer 205 functions as a base layer and can prevent or reduce diffusion of impurity elements from the substrate 111, the bonding layer 112, or the like to the transistor or the light-emitting element.

The transistor 232, the transistor 252, the electrode 116, and a wiring 219 are formed over the insulating layer 205. Although a channel-etched transistor that is a type of bottom-gate transistor is illustrated as the transistor 232 and/or the transistor 252 in this embodiment, a channel-protective transistor, a top-gate transistor, or the like can also be used. Alternatively, an inverted staggered transistor or a forward staggered transistor can also be used. It is also possible to use a dual-gate transistor, in which a semiconductor layer in which a channel is formed is provided between two gate electrodes. Furthermore, the transistor is not limited to a transistor having a single-gate structure; a multi-gate transistor having a plurality of channel formation regions, such as a double-gate transistor may be used.

As the transistor 232 and the transistor 252, a transistor with any of a variety of structures such as a planar type, a FIN-type, and a Tri-Gate type can be used.

The transistor 232 and the transistor 252 may have the same structure or different structures. However, the size (e.g., channel length and channel width) or the like of each transistor can be adjusted as appropriate.

The transistor 232 and the transistor 252 each include an electrode 206 that can function as a gate electrode, an insulating layer 207 that can function as a gate insulating layer, a semiconductor layer 208, an electrode 214 that can function as one of a source electrode and a drain electrode, and an electrode 215 that can function as the other of the source electrode and the drain electrode.

The wiring 219, the electrode 214, and the electrode 215 can be formed at the same time as the electrode 116 using part of the conductive layers for forming the electrode 116. The insulating layer 207 can be formed using a material and a method similar to those of the insulating layer 205.

The semiconductor layer 208 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used. In the case of using an oxide semiconductor for the semiconductor layer 208, a c-axis aligned crystalline oxide semiconductor (CAAC-OS), a polycrystalline oxide semiconductor, a microcrystalline oxide semiconductor, a nanocrystalline oxide semiconductor (nc-OS), an amorphous oxide semiconductor, or the like can be used.

Note that an oxide semiconductor has an energy gap as wide as 3.0 eV or more and high visible-light transmissivity. In a transistor obtained by processing an oxide semiconductor under appropriate conditions, it is possible to realize an extremely low off-state current (current flowing between a source and drain in an off state of a transistor). For example, the off-state current per 1 μm of a channel width can be less than or equal to 100 zA ($1 \times 10^{-19}$ A), less than or equal to 10 zA ($1 \times 10^{-20}$ A), and further less than or equal to 1 zA ($1 \times 10^{-21}$ A) when the source-drain voltage is 3.5 V at 25° C. Therefore, a display device with low power consumption can be achieved.

In the case where an oxide semiconductor is used for the semiconductor layer 208, an insulating layer containing oxygen is preferably used as an insulating layer in contact with the semiconductor layer 208. For the insulating layer in contact with the semiconductor layer 208, it is particularly preferable to use an insulating layer from which oxygen is released by heat treatment.

An insulating layer 210 is formed over the transistor 232 and the transistor 252, and an insulating layer 211 is formed over the insulating layer 210. The insulating layer 210 functions as a protective insulating layer and can prevent or reduce diffusion of impurity elements from a layer above the insulating layer 210 to the transistor 232 and the transistor 252. The insulating layer 210 can be formed using a material and a method similar to those of the insulating layer 205.

An interlayer insulating layer 212 is formed over the insulating layer 211. The interlayer insulating layer 212 is able to absorb the unevenness caused by the transistor 232 and the transistor 252. Planarization treatment may be performed on a surface of the interlayer insulating layer 212. The planarization treatment may be, but not particularly limited to, polishing treatment (e.g., chemical mechanical polishing (CMP)) or dry etching treatment.

Forming the interlayer insulating layer 212 using an insulating material having a planarization function can omit polishing treatment. As the insulating material having a planarization function, for example, an organic material such as a polyimide resin or an acrylic resin can be used. Other than the above-described organic materials, it is also possible to use a low-dielectric constant material (low-k material) or the like. Note that the interlayer insulating layer 212 may be formed by stacking a plurality of insulating films formed of these materials.

Over the insulating layer 211, the light-emitting element 125 and the partition 114 for separating the adjacent light-emitting elements 125 are formed.

The substrate 121 is provided with the light-blocking layer 264, the coloring layer 266, and the overcoat layer 268. The display device 200 is what is called a top-emission light-emitting device, in which light emitted from the light-emitting element 125 is extracted from the substrate 121 side through the coloring layer 266.

The light-emitting element 125 is electrically connected to the transistor 232 through an opening formed in the interlayer insulating layer 212, insulating layer 211 and the insulating layer 210.

With a micro optical resonator (also referred to as microcavity) structure which allows light emitted from the EL layer 117 to resonate, lights with different wavelengths and narrowed spectra even when one EL layer 117 is used for different light-emitting elements 125.

FIGS. 16A and 16B are cross-sectional views of the display device 200 in which the light-emitting element 125 has a microcavity structure, for example. Note that FIG. 16A corresponds to a cross-sectional view taken along the vicinity of the dashed-dotted line A3-A4 in FIG. 15A. FIG. 16B is an enlarged view of a portion 280 in FIG. 16A.

In the case where the light-emitting element 125 has a microcavity structure, the electrode 118 is formed using a conductive material (a semi-transmissive material) which transmits and reflect a certain amount of light of the incident light, and the electrode 115 is formed using a stack of a conductive material having high reflectance (the reflectance of visible light is 50% or more and 100% or less, or preferably 70% or more and 100% or less) and a conductive material having high transmittance (the transmittance of visible light is 50% or more and 100% or less, or preferably 70% or more and 100% or less). Here, the electrode 115 is formed of a stack of an electrode 115a formed using a conductive material that reflects light and an electrode 115b formed using a conductive material that transmits light. The electrode 115b is provided between the EL layer 117 and the electrode 115a (see FIG. 16B). The electrode 115a functions as a reflective electrode, and the electrode 118 functions as a semi-reflective electrode.

For example, the electrode 118 may be formed using a conductive material containing silver (Ag) or a conductive material containing aluminum (Al) having a thickness of 1 nm to 30 nm, or preferably 1 nm to 15 nm. In this embodiment, as the electrode 118, a 10-nm-thick conductive material containing silver and magnesium is used.

The electrode 115a may be formed using a conductive material containing silver (Ag) or a conductive material containing aluminum (Al) having a thickness of 50 nm to 500 nm, or preferably 50 nm to 200 nm. In this embodiment, the electrode 115a is formed using a 100-nm-thick conductive material containing silver.

For the electrode 115b, a conductive oxide containing indium (In) or a conductive oxide containing zinc (Zn) having a thickness of 1 nm to 200 nm or preferably 5 nm to 100 nm may be used. In this embodiment, indium tin oxide is used for the electrode 115b. Furthermore, a conductive oxide may be provided under the electrode 115a.

By changing the thickness t of the electrode 115b, a distance d from the interface between the electrode 118 and the EL layer 117 to the interface between the electrode 115a and the electrode 115b can be set to an arbitral value. The light-emitting elements 125 having different emission spectra for respective pixels can be provided even when one EL layer 117 is used by changing the thickness t of the electrode 115b in each pixel. Thus, color purity of each emission color is improved and a display device having favorable color reproducibility can be achieved. It is not necessary to independently form the EL layer 117 in each pixel depending on the emission color; therefore, the number of manufacturing steps of the display device can be reduced and thus the productivity can be improved. Furthermore, a high-definition display device can be achieved easily.

Note that a method for adjusting the distance d is not limited to the above method. For example, the distance d may be adjusted by changing the film thickness of the EL layer 117.

FIG. 16A shows an example in which the pixel 130R, the pixel 130G, the pixel 130B, and the pixel 130Y that emit red light 151R, green light 151G, blue light 151B, and yellow light 151Y, respectively, are used as one pixel 140. Note that one embodiment of the present invention is not limited to this example. As the pixel 140, subpixels that emit lights of red, green, blue, yellow, cyan, magenta, and white may be combined as appropriate. For example, the pixel 140 may be formed of the following three subpixels: the pixel 130R, the pixel 130G, and the pixel 130B.

Figure 17:
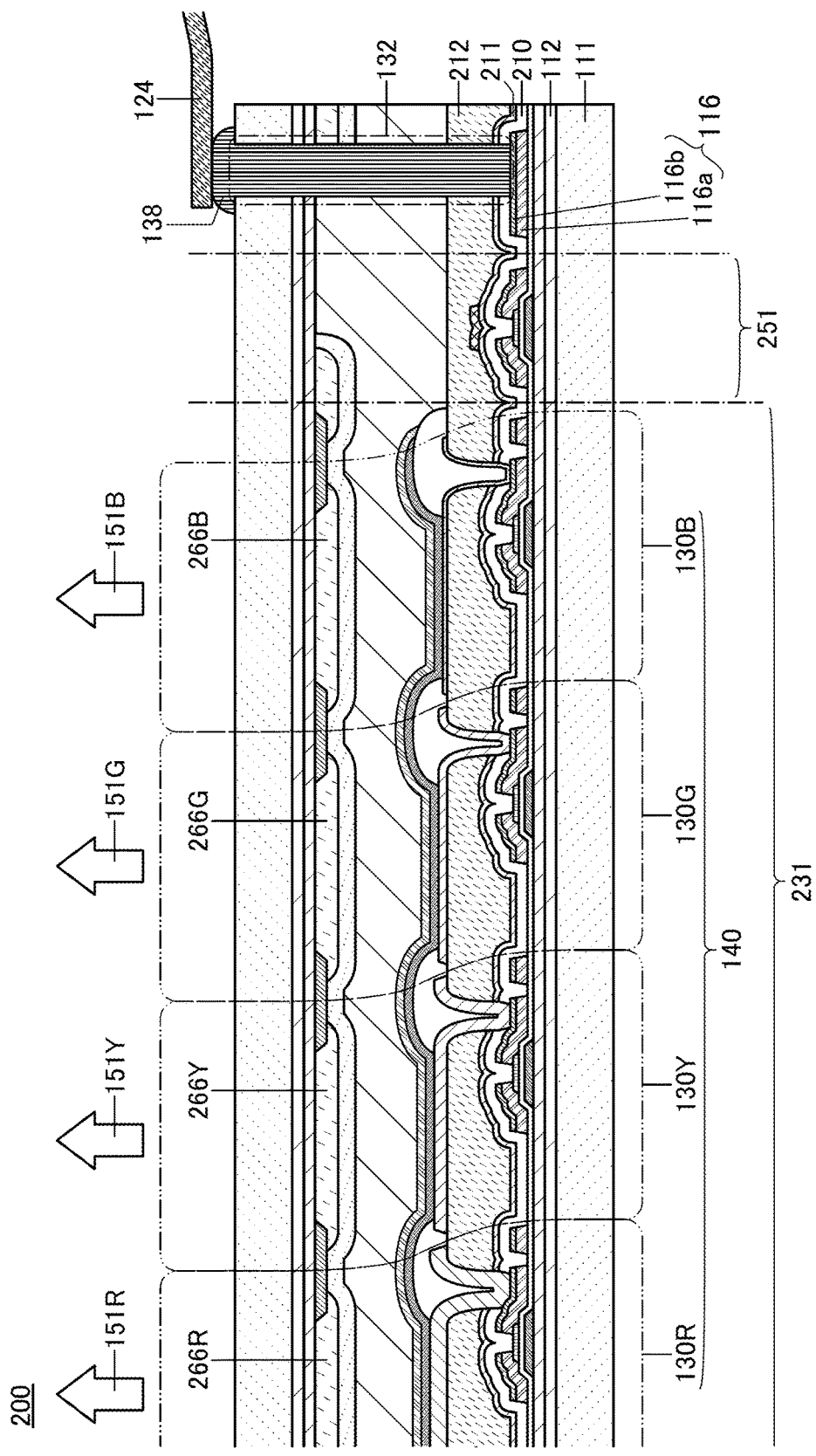
FIG. 17 is a cross-sectional view illustrating one embodiment of a display device.

The coloring layer 266 may be provided in a position overlapping with the light-emitting element 125 so that the light 151 is emitted outside through the coloring layer 266. FIG. 17 shows a structure example in the case where which the coloring layer 266 is combined with the display device 200 illustrated in FIGS. 16A and 16B. In the display device 200 illustrated in FIG. 17, a coloring layer 266R, a coloring layer 266G, a coloring layer 266B, and a coloring layer 266Y that transmit light in a red wavelength band, light in a green wavelength band, light in a blue wavelength band, and light in a yellow wavelength band, respectively, are provided so as to overlap with the pixel 130R that emits the red light 151R, the pixel 130G that can emit the green light 151G, the pixel 130B that can emit the blue light 151B, and the pixel 130Y that can emit the yellow light 151Y, respectively.

By using the pixel 130Y in addition to the pixel 130R, the pixel 130G, and the pixel 130B, the color reproducibility of the display device can be increased. In the case where the pixel 140 is formed of only the pixel 130R, the pixel 130G, and the pixel 130B, all of the pixels 130R, 130G, and 130B need to emit light when white light is emitted from the pixel 140. When the pixel 130Y is provided in addition to the pixel 130R, the pixel 130G, and the pixel 130B, white light can be obtained by emitting light only from the pixel 130B and the pixel 130Y Thus, since white light can be obtained even without light emission from the pixel 130R and the pixel 130G, power consumption of the display device can be reduced.

Moreover, the pixel 130W that can emit white light 151W may be used instead of the pixel 130Y The use of the pixel 130W instead of the pixel 130Y allows emission of white light by emitting light only from the pixel 130W; therefore, power consumption of the display device can be further reduced.

Note that in the case of using the pixel 130W, a coloring layer is not necessarily provided in the pixel 130W. Without a coloring layer, the luminance of the display region is improved and a display device having favorable visibility can be achieved. Moreover, power consumption of the display device can be further reduced.

The pixel 130W may be provided with a coloring layer 266W that transmits light of substantially whole of the visible region. The color temperature of the white light 151W can be changed by providing the coloring layer 266W that transmits light of substantially whole of the visible region in the pixel 130W. Accordingly, a display device having a high display quality can be achieved.

The color purity of the light 151 can be further improved by using the light-emitting element 125 having a microcavity structure and the coloring layer 266 in combination. Therefore, the color reproducibility of the display device 200 can be improved. In addition, light that enters from the outside is mostly absorbed by the coloring layer 266; therefore, reflection of the light that enters from the outside on the display region 231 is suppressed and thus the visibility of the display device can be improved. Accordingly, a display device having a high display quality can be achieved.

Although an active matrix display device is described as an example of the display device in this embodiment, one embodiment of the present invention can also be applied to a passive matrix display device. Moreover, one embodiment of the present invention can also be applied to a display device having a bottom-emission structure or a dual-emission structure.

This embodiment can be implemented in an appropriate combination with any of the structures described in the other embodiments.

Embodiment 3

Figure 18A:
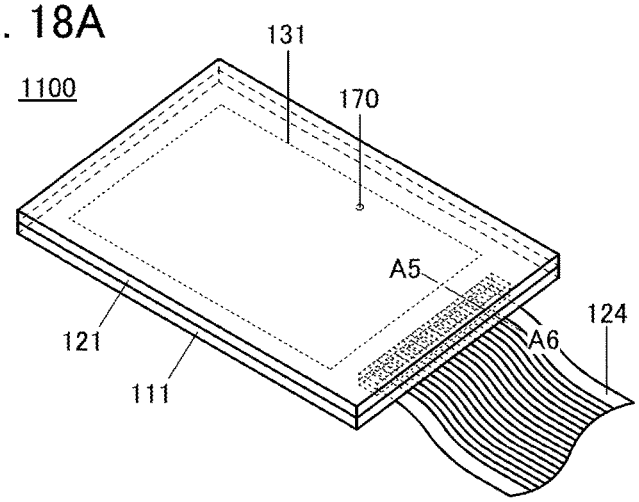
FIGS. 18A and 18B are a perspective view and a cross-sectional view illustrating one embodiment of a display device.
Figure 18B:
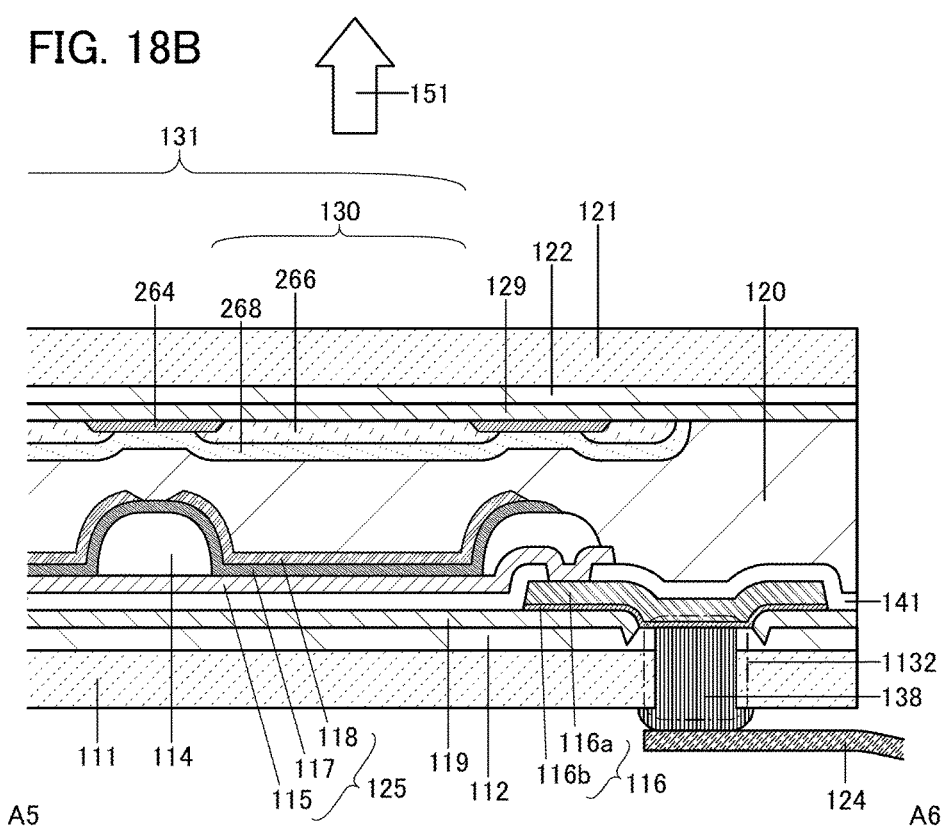

A structure example of a display device 1100 of one embodiment of the present invention will be described with reference to FIGS. 18A and 18B, FIGS. 19A and 19B, FIGS. 20A and 20B, FIGS. 21A to 21D, FIGS. 22A to 22D, FIGS. 23A to 23C, FIGS. 24A to 24E, FIGS. 25A and 25B, FIGS. 26A and 26B, FIGS. 27A and 27B, FIGS. 28A and 28B, FIGS. 29A and 29B, FIGS. 30A and 30B, and FIGS. 31A to 31C. FIG. 18A is a perspective view of the display device 1100 to which the external electrode 124 is connected, and FIG. 18B is a cross-sectional view taken along the dashed-dotted line A5-A6 in FIG. 18A. The display device 1100 disclosed in this specification is a display device in which a light-emitting element is used as a display element. As the display device 1100 of one embodiment of the present invention, a display device having a top-emission structure is described as an example. Note that the display device 1100 can be a display device having a bottom-emission structure or a dual-emission structure.

<Structure of Display Device>

The display device 1100 described in this embodiment includes the display region 131. The display region 131 includes a plurality of pixels 130. One pixel 130 includes at least one light-emitting element 125.

The display device 1100 described in this embodiment includes the light-emitting element 125, the partition 114, and the electrode 116. The display device 1100 further includes the insulating layer 141 over the electrode 116, and the electrode 115 and the electrode 116 are electrically connected to each other in an opening provided in the insulating layer 141. The partition 114 is provided over the electrode 115, the EL layer 117 is provided over the electrode 115 and the partition 114, and the electrode 118 is provided over the EL layer 117.

The light-emitting element 125 is provided over the substrate 111 with the bonding layer 112, the insulating layer 119, and the insulating layer 141 provided therebetween. The light-emitting element 125 includes the electrode 115, the EL layer 117, and the electrode 118.

The display device 1100 described in this embodiment includes the substrate 121 provided over the electrode 118 with the bonding layer 120 provided therebetween. The substrate 121 is provided with the light-blocking layer 264, the coloring layer 266, and the overcoat layer 268 with the bonding layer 122 and the insulating layer 129 provided therebetween.

Since the display device 1100 described in this embodiment has a top-emission structure, the light 151 emitted from the EL layer 117 is emitted from the substrate 121 side. The light 151 emitted from the EL layer 117 is partly absorbed when transmitted through the coloring layer 266 and converted into a specific color. In other words, the coloring layer 266 transmits light in a specific wavelength region. The coloring layer 266 functions as an optical filter layer for converting the light 151 into light of a different color.

Although a stacked-layer structure of the electrode 116a and the electrode 116b is described as the electrode 116 in this embodiment, the electrode 116 may have a single-layer structure or a stacked-layer structure of three or more layers.

Each of the substrate 111, the bonding layer 112, and the insulating layer 119 has an opening. The openings partly overlap with one another and each overlap with the electrode 116. In this specification and the like, these openings are collectively referred to as an opening 1132. In the opening 1132, the external electrode 124 and the electrode 116 are electrically connected to each other through the anisotropic conductive connection layer 138.

Figure 19A:
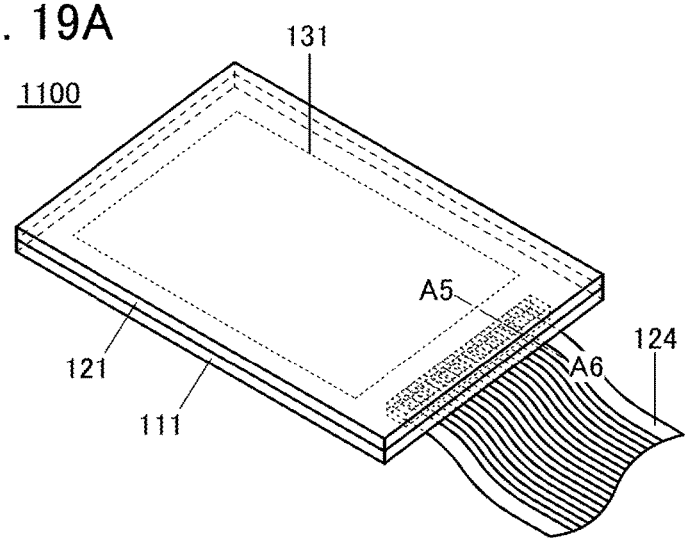
FIGS. 19A and 19B are a perspective view and a cross-sectional view illustrating one embodiment of a display device.
Figure 19B:
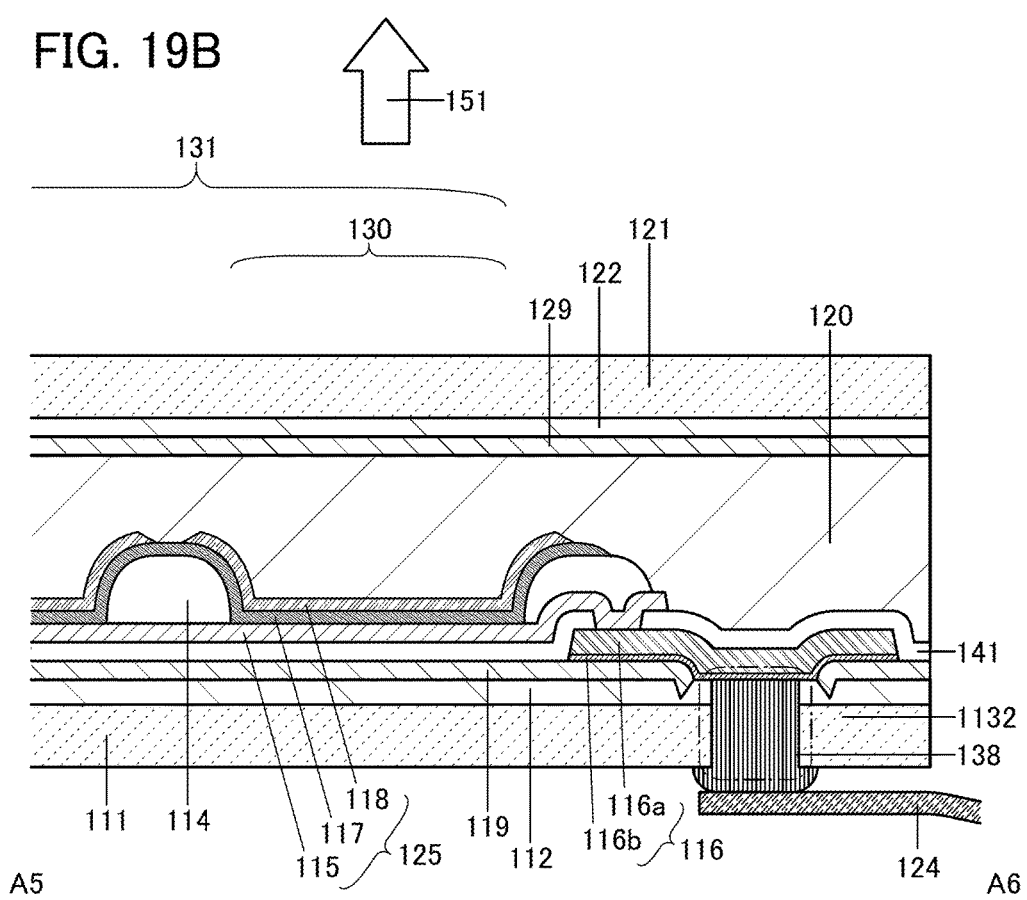

Note that as illustrated in FIGS. 19A and 19B, it is possible not to provide the light-blocking layer 264, the coloring layer 266, and the overcoat layer 268 in the display device 1100. FIG. 19A is a perspective view of the display device 1100 in which the light-blocking layer 264, the coloring layer 266, and the overcoat layer 268 are not provided, and FIG. 19B is a cross-sectional view taken along the dashed-dotted line A5-A6 in FIG. 19A.

In particular, in the case where the EL layer 117 is provided by what is called side-by-side patterning in which the colors of the lights 151 emitted from different pixels are different, the coloring layer 266 may be provided or is not necessarily provided.

When at least one or all of the light-blocking layer 264, the coloring layer 266, and the overcoat layer 268 are not provided, the display device 1100 can achieve a reduction in manufacturing cost, yield improvement, or the like. Moreover, the light 151 can be emitted efficiently when the coloring layer 266 is not provided; therefore, luminance can be improved or power consumption can be reduced, for example.

On the other hand, when the light-blocking layer 264, the coloring layer 266, and the overcoat layer 268 are provided, reflection of external light is suppressed and thus a contrast ratio, color reproducibility, or the like can be improved.

Figure 20A:
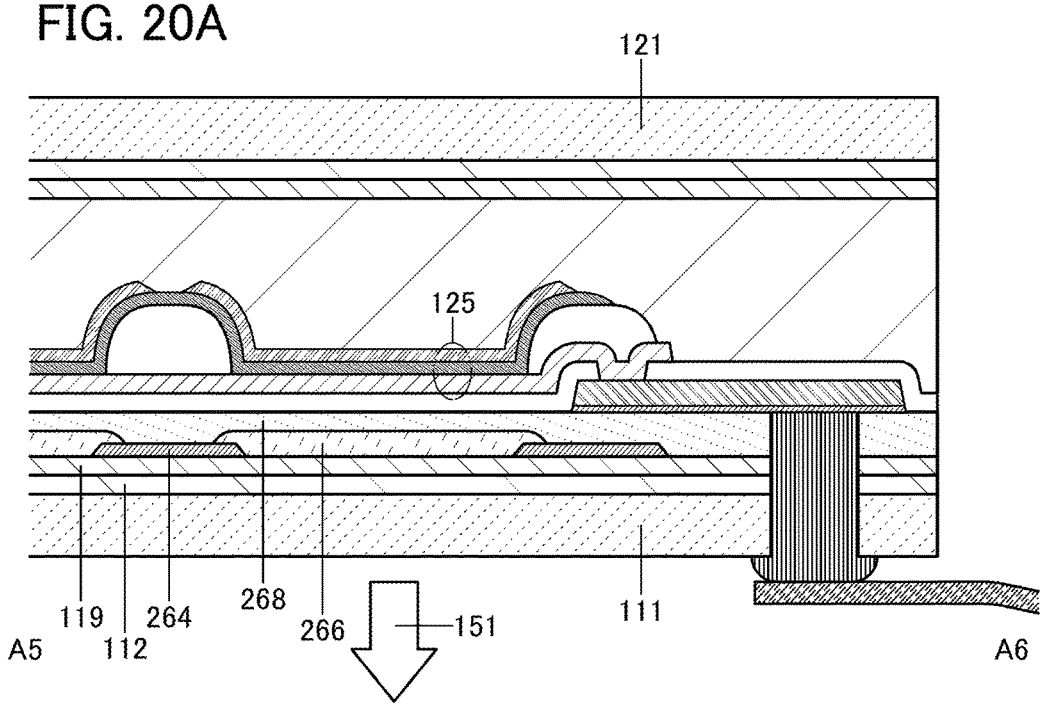
FIGS. 20A and 20B are cross-sectional views each illustrating one embodiment of a display device.
Figure 20B:
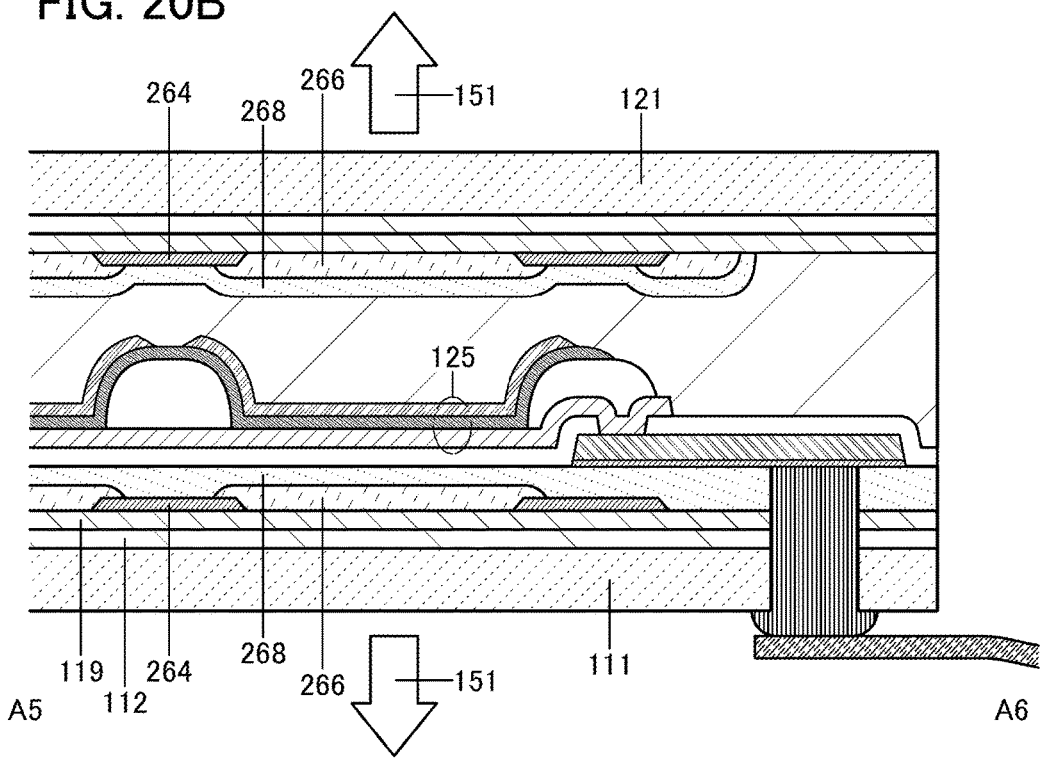

Note that in the case where the display device 1100 has a bottom-emission structure, the light-blocking layer 264, the coloring layer 266, and the overcoat layer 268 may be provided on the substrate 111 side (see FIG. 20A). In the case where the display device 1100 has a dual-emission structure, the light-blocking layer 264, the coloring layer 266, and the overcoat layer 268 may be provided on either or both of the substrate 111 side and the substrate 121 side (see FIG. 20B).

A switching element having a function of supplying a signal to the light-emitting element 125 may be provided between the light-emitting element 125 and the electrode 116. For example, a transistor may be provided between the light-emitting element 125 and the electrode 116.

A transistor is a kind of semiconductor element and enables amplification of current and/or voltage, switching operation for controlling conduction or non-conduction, or the like. By providing a transistor between the light-emitting element 125 and the electrode 116, an increase in the area of the display region 131 and a higher-resolution display can be achieved easily. Note that a resistor, an inductor, a capacitor, a rectifier element, or the like, without limitation to a switching element such as a transistor, can be provided in the display region 131.

The display device 1100 can be manufactured using a material similar to that of the display device 100 described in Embodiment 1. Therefore, detailed description of the composition material of the display device 1100 is not made here.

<Method for Manufacturing Display Device>

Next, a method for manufacturing the display device 1100 is described with reference to FIGS. 21A to 21D, FIGS. 22A to 22D, FIGS. 23A to 23C, FIGS. 24A to 24E, FIGS. 25A and 25B, FIGS. 26A and 26B, and FIGS. 27A and 27B. FIGS. 21A to 27B are cross-sectional views taken along the dashed-dotted line A5-A6 in FIGS. 18A and 18B. Note that the description in Embodiment 1 is referred to for the components which are common to those in the method for manufacturing the display device 100 to avoid repetition of the same description. In this embodiment, description is made mainly on components different from those in the method for manufacturing the display device 100.

<<1. Manufacture of Element Substrate 1171>>

First, a method for manufacturing an element substrate 1171 is described as an example. Note that in this embodiment, the substrate 101 over which the light-emitting element 125 is formed is referred to as the element substrate 1171.

[Formation of Peeling Layer 144]

Figure 21A:
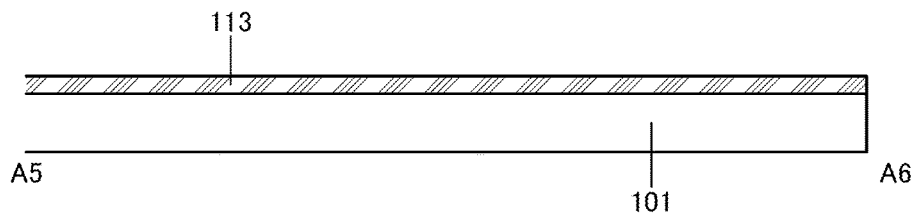
FIGS. 21A to 21D illustrate a manufacturing process of one embodiment of a display device.

First, the peeling layer 113 is formed over the substrate 101 (see FIG. 21A). In this embodiment, aluminoborosilicate glass is used for the substrate 101. The peeling layer 113 is formed of tungsten over the substrate 101 by a sputtering method.

Figure 21B:
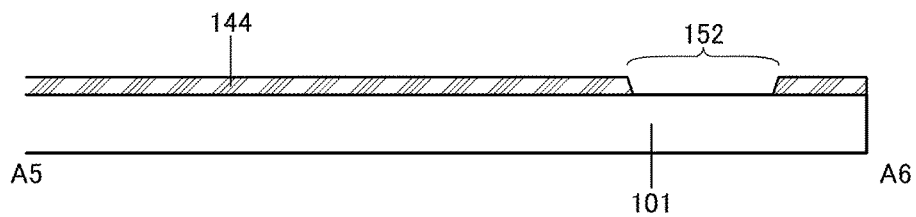

Subsequently, a resist mask is formed over the peeling layer 113, and part of the peeling layer 113 is selectively removed using the resist mask, so that the peeling layer 144 having an opening 152 is formed (see FIG. 21B).

[Formation of Insulating Layer 119]

Figure 21C:
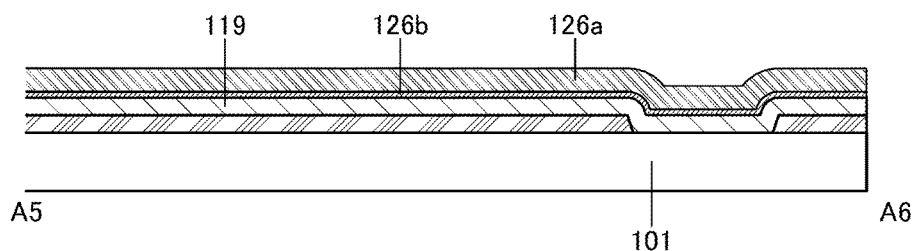
Figure 21D:
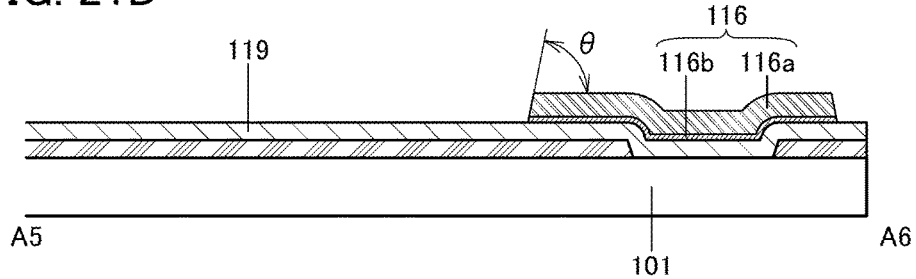

Next, the insulating layer 119 is formed over the peeling layer 144 (see FIG. 21C). In this embodiment, the insulating layer 119 is formed by stacking a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film by a plasma CVD method from the substrate 101 side.

Note that it is preferable to expose the surface of the peeling layer 144 to an atmosphere containing oxygen before the formation of the insulating layer 119.

In this embodiment, a sample is placed in a treatment chamber of a plasma CVD apparatus, and then dinitrogen monoxide is supplied to the treatment chamber and the plasma atmosphere is generated. After that, the sample surface is exposed to the plasma atmosphere. Subsequently, the insulating layer 119 is formed on the sample surface.

[Formation of Electrode 116]

Next, the conductive layers 126a and 126b for forming the electrode 116 are formed over the insulating layer 119. First, as the conductive layer 126b, a tungsten film is formed over the insulating layer 119 by a sputtering method. Subsequently, as the conductive layer 126a, a three-layer metal film in which a layer of aluminum is provided between two layers of molybdenum is formed over the conductive layer 126b by a sputtering method (see FIG. 21C).

After that, a resist mask is formed over the conductive layer 126a, and the conductive layers 126a and 126b are etched into a desired shape using the resist mask. In the above-described manner, the electrode 116 (electrodes 116a and 116b) can be formed (see FIG. 21D).

When the electrode 116 (including other electrodes and wirings formed using the same layer) has a taper-shaped end portion, the coverage with a layer that covers the side surfaces of the electrode 116 can be improved. Specifically, the end portion has a taper angle θ of 80° or less, preferably 60° or less, or further preferably 45° or less (see FIG. 21D). Alternatively, the cross-sectional shape of the end portion of the electrode 116 has a plurality of steps, so that the coverage with the layer formed thereon can be improved.

[Formation of Insulating Layer 127]

Figure 22A:
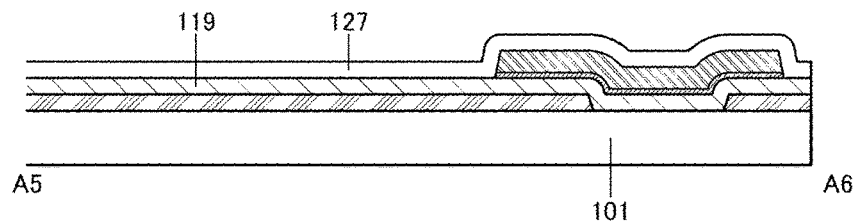
FIGS. 22A to 22D illustrate a manufacturing process of one embodiment of a display device.

Next, the insulating layer 127 is formed over the electrode 116 and the insulating layer 119 (see FIG. 22A). In this embodiment, a silicon oxynitride film is formed by a plasma CVD method as the insulating layer 127.

Figure 22B:
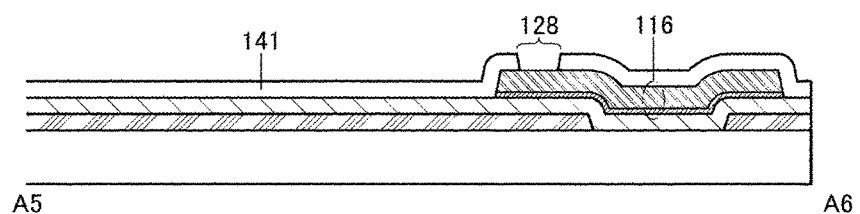

Next, a resist mask is formed over the insulating layer 127, and part of the insulating layer 127 overlapping with the electrode 116 is selectively removed using the resist mask, so that the insulating layer 141 having the opening 128 is formed (see FIG. 22B).

[Formation of Electrode 115]

Figure 22C:
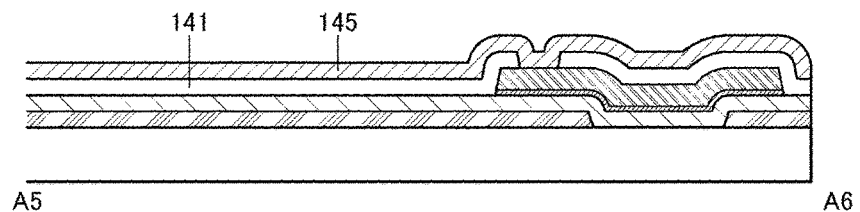

Next, the conductive layer 145 for forming the electrode 115 is formed over the insulating layer 141 (see FIG. 22C). The conductive layer 145 can be formed using a material and a method that are similar to those of the conductive layer 126a (electrode 116a).

Figure 22D:
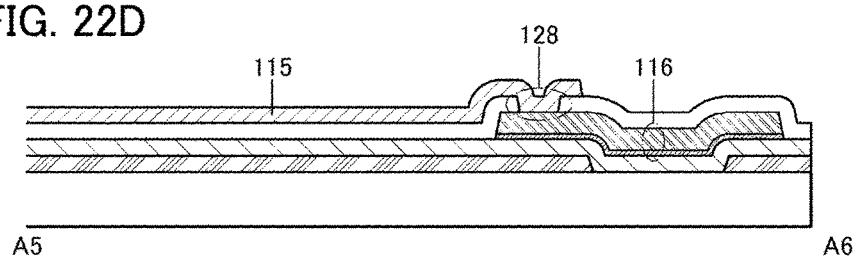

Next, a resist mask is formed over the conductive layer 145, and part of the conductive layer 145 is selectively removed using the resist mask, so that the electrode 115 is formed (see FIG. 22D). In this embodiment, the conductive layer 145 (electrode 115) is formed using a material in which indium tin oxide is stacked over silver. The electrode 115 and the electrode 116 are electrically connected to each other through the opening 128.

[Formation of Partition 114]

Figure 23A:
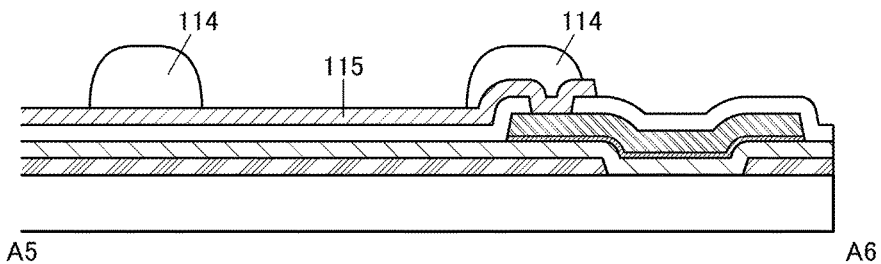
FIGS. 23A to 23C illustrate a manufacturing process of one embodiment of a display device.

Next, the partition 114 is formed over the electrode 115 (see FIG. 23A). In this embodiment, the partition 114 is formed in such a manner that a photosensitive organic resin material is applied by a coating method and processed into a desired shape. In this embodiment, the partition 114 is formed using a photosensitive polyimide resin.

[Formation of EL Layer 117]

Figure 23B:
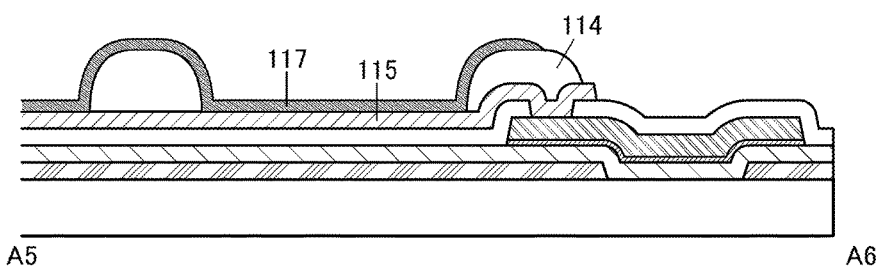
Figure 23C:
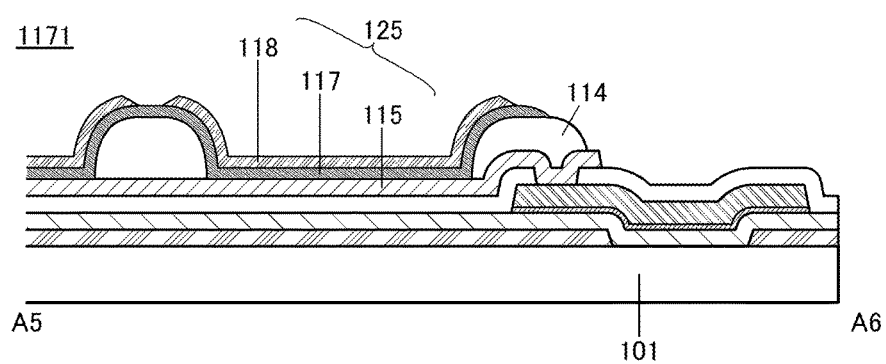

Next, the EL layer 117 is formed over the electrode 115 and the partition 114 (see FIG. 23B).

[Formation of Electrode 118]

Next, the electrode 118 is formed over the EL layer 117. In this embodiment, an alloy of magnesium and silver is used for the electrode 118 (see FIG. 23 C).

<<2. Manufacture of Counter Substrate 1181>>

Next, a method for manufacturing a counter substrate 1181 is described as an example.

[Formation of Peeling Layer 143]

Figure 24A:
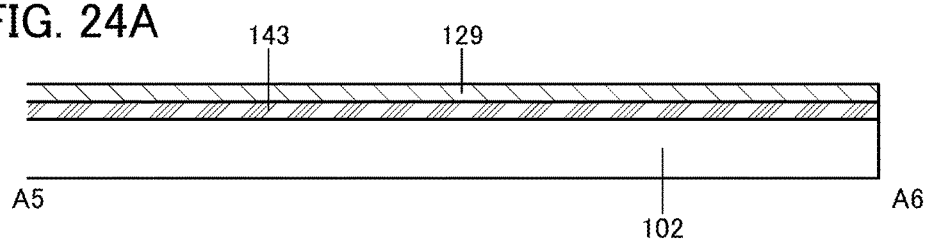
FIGS. 24A to 24E illustrate a manufacturing process of one embodiment of a display device.

First, the peeling layer 143 is formed over the substrate 102 (see FIG. 24A). In this embodiment, aluminoborosilicate glass is used for the substrate 102. The peeling layer 143 is formed of tungsten over the substrate 102 by a sputtering method.

It is preferable to expose the surface of the peeling layer 143 to an atmosphere containing oxygen or a plasma atmosphere containing oxygen after the formation of the peeling layer 143. Oxidizing the surface of the peeling layer 143 can facilitate peeling of the substrate 102 performed later.

[Formation of Insulating Layer 129]

Next, the insulating layer 129 is formed over the peeling layer 143 (see FIG. 24A). The insulating layer 129 can be formed using a material and a method that are similar to those of the insulating layer 119. In this embodiment, the insulating layer 129 is formed by stacking a 200-nm-thick silicon oxynitride film, a 140-nm-thick silicon nitride oxide film, and a 100-nm-thick silicon oxynitride film by a plasma CVD method from the substrate 102 side.

[Formation of Light-Blocking Layer 264]

Figure 24B:
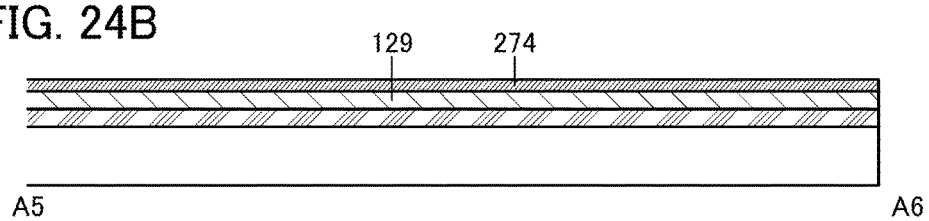
Figure 24C:
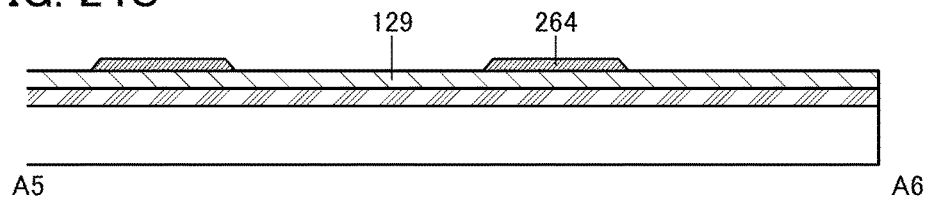

Next, the layer 274 for forming the light-blocking layer 264 is formed over the insulating layer 129 (see FIG. 24B). Next, a resist mask is formed over the layer 274, and part of the layer 274 is selectively removed using the resist mask, so that the light-blocking layer 264 is formed (see FIG. 24C).

[Formation of Coloring Layer 266]

Figure 24D:
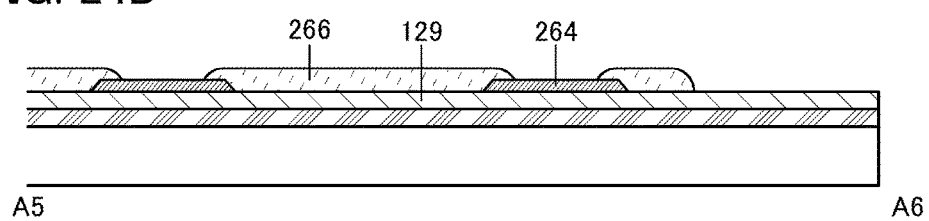

Next, the coloring layer 266 is formed over the insulating layer 149 (see FIG. 24D). Color display can be performed by providing the coloring layers 266 of different colors in different pixels.

[Formation of Overcoat Layer 268]

Figure 24E:
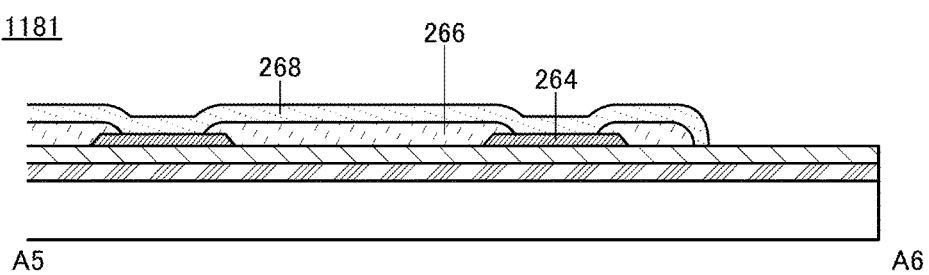

Next, the overcoat layer 268 is formed over the light-blocking layer 264 and the coloring layer 266 (see FIG. 24E).

Through the above steps, the counter substrate 1181 can be formed. Note that the counter substrate 1181 may not be provided with the coloring layer 266 or the like.

<<3. Attachment of Element Substrate 1171 and Counter Substrate 1181>>

Next, the element substrate 1171 and the counter substrate 1181 are attached to each other with the bonding layer 120 provided therebetween. At the attachment, the light-emitting element 125 included in the element substrate 1171 and the coloring layer 266 included in the counter substrate 1181 are arranged so as to face each other (see FIG. 25A).

[Peeling of Substrate 102]

Figure 25A:
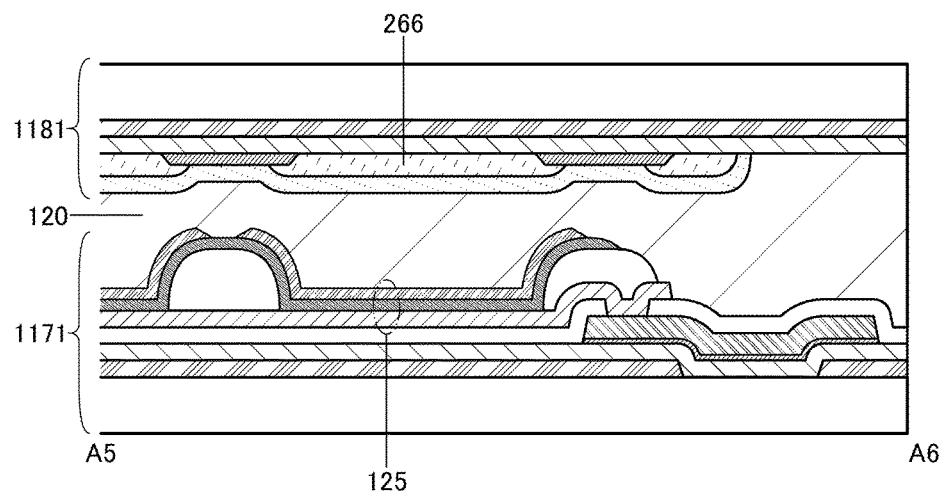
FIGS. 25A and 25B illustrate a manufacturing process of one embodiment of a display device.
Figure 25B:
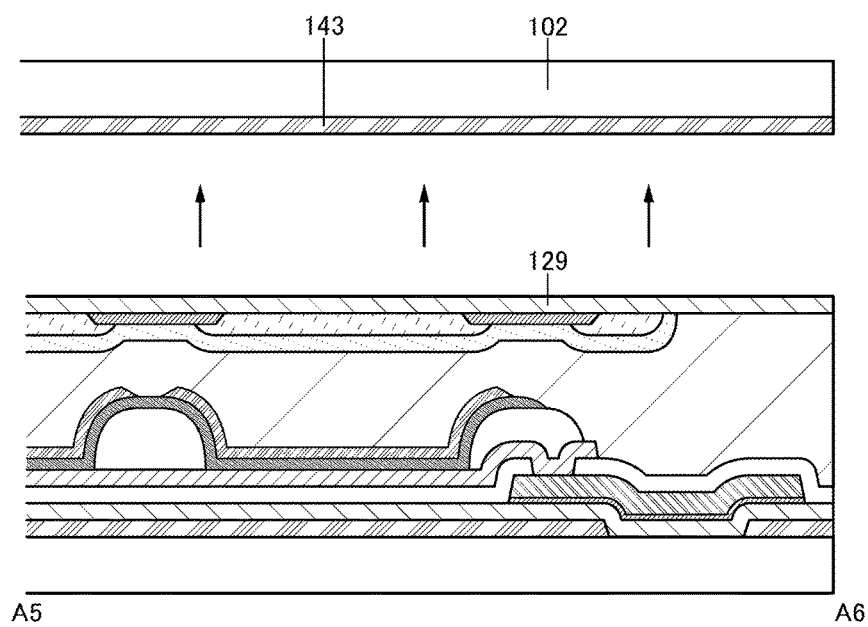

Next, the substrate 102 included in the counter substrate 1181 is peeled off from the insulating layer 129 together with the peeling layer 143 (see FIG. 25B). As a peeling method, mechanical force (a peeling process with a human hand or a gripper, a separation process by rotation of a roller, ultrasonic waves, or the like) may be used. For example, a cut is made in the interface between the peeling layer 143 and the insulating layer 129 from the side surface of the counter substrate 1181 with a sharp edged tool, by laser beam irradiation, or the like, and water is injected into the cut. The interface between the peeling layer 143 and the insulating layer 129 absorbs water by capillarity action, so that the substrate 102 can be peeled off easily from the insulating layer 129 together with the peeling layer 143.

[Attachment of Substrate 121]

Figure 26A:
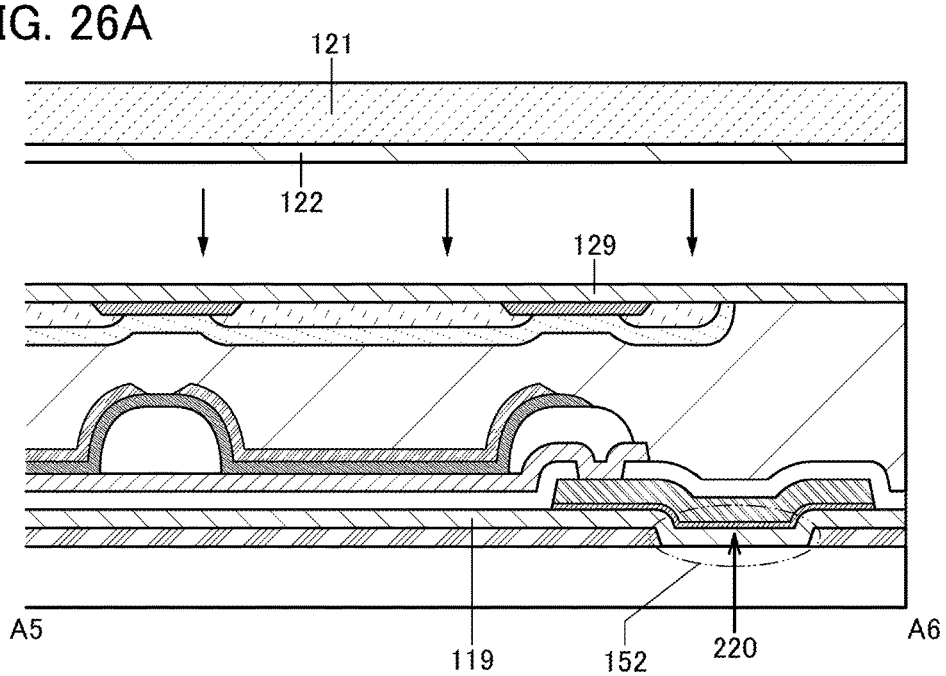
FIGS. 26A and 26B illustrate a manufacturing process of one embodiment of a display device.

Next, the substrate 121 is attached to the insulating layer 129 with the bonding layer 122 provided therebetween (see FIG. 26A).

[Peeling of Substrate 101]

Next, the substrate 101 included in the element substrate 1171 is peeled off from the insulating layer 119 together with the peeling layer 144.

Note that before the substrate 101 is peeled off, at least part of the electrode 116b may be irradiated with the light 220 through the opening 152 as illustrated in FIG. 26A.

By irradiation with the light 220, the temperature of the electrode 116b rises, and adhesion between the electrode 116b and the insulating layer 119 is lowered because of thermal stress, emission of gas that remains in the layer, or the like. As a result, the insulating layer 119 is easily peeled off from the electrode 116b.

Figure 26B:
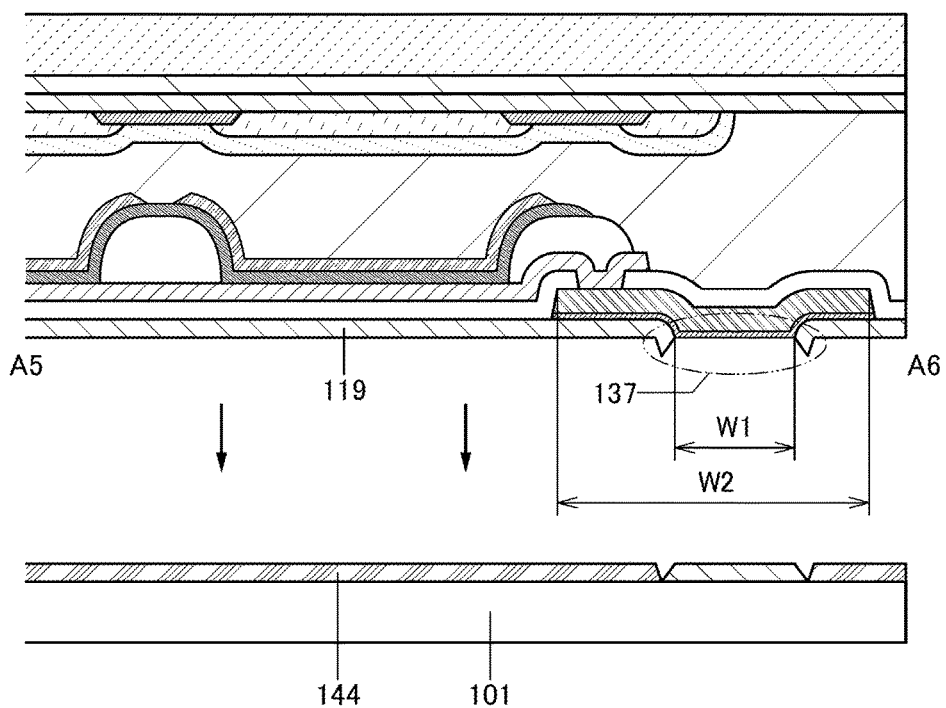

FIG. 26B illustrates a state in which the substrate 101 included in the element substrate 1171 is peeled off from the insulating layer 119 together with the peeling layer 144. An opening 137 is formed by removal of the insulating layer 119 overlapping with the opening 152 at the peeling. Note that the substrate 101 is preferably arranged such that the opening 152 is placed on the inner side than the electrode 116, in which case the opening 137 can be formed easily. That is, it is preferable that the opening 137 be formed on the inner side than the end portion of the electrode 116 in the cross-sectional view. The width W1 of the opening 137 is preferably smaller than the width W2 of the surface of the electrode 116.

[Attachment of Substrate 111]

Figure 27A:
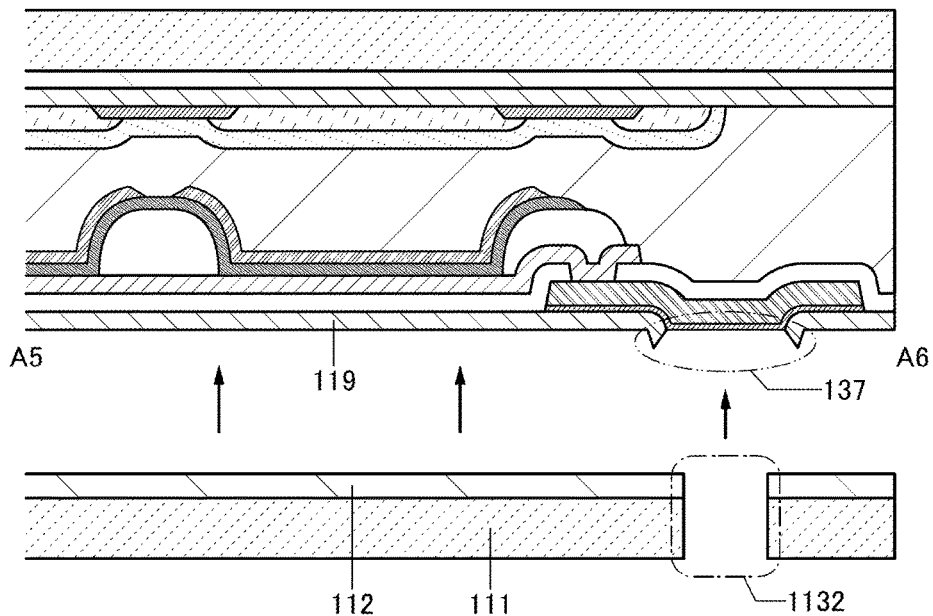
FIGS. 27A and 27B illustrate a manufacturing process of one embodiment of a display device.
Figure 27B:
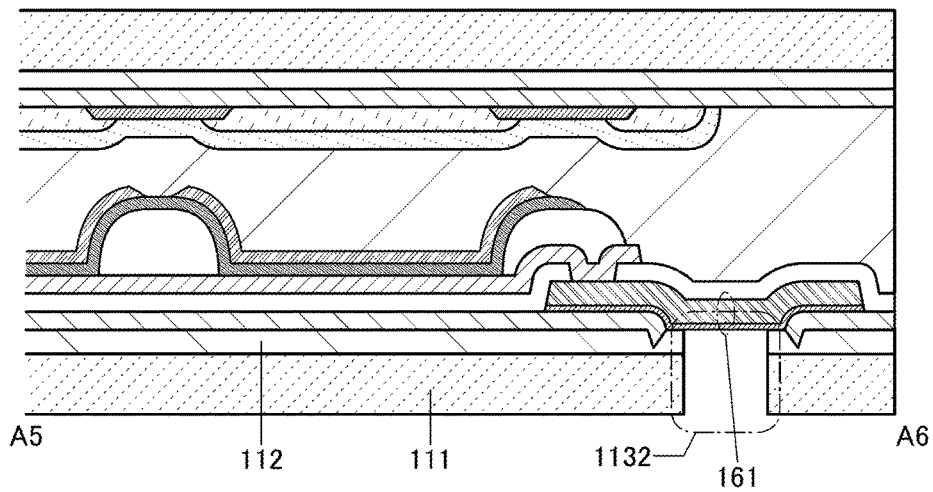

Next, the substrate 111 having the opening 1132 is attached to the insulating layer 119 with the bonding layer 112 provided therebetween (see FIG. 27A). The substrate 111 and the insulating layer 119 are attached to each other so that the opening 1132 overlaps with the opening 137. The surface of the electrode 116 is exposed on the inner side than the opening 1132 (see FIG. 27B).

Figure 28A:
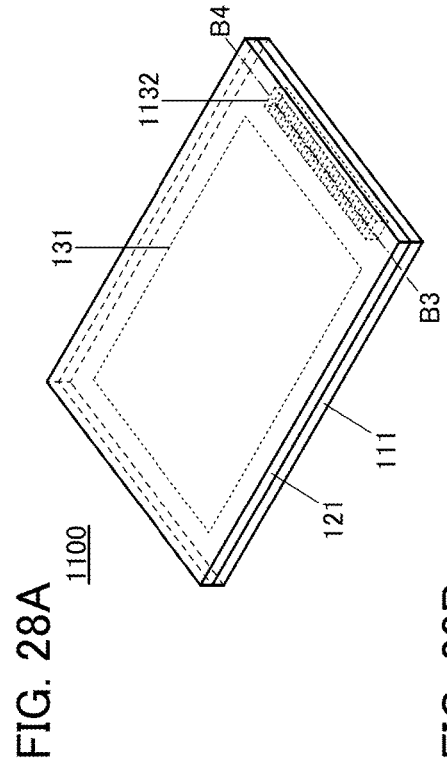
FIGS. 28A and 28B are a perspective view and a cross-sectional view illustrating one embodiment of a display device.
Figure 28B:
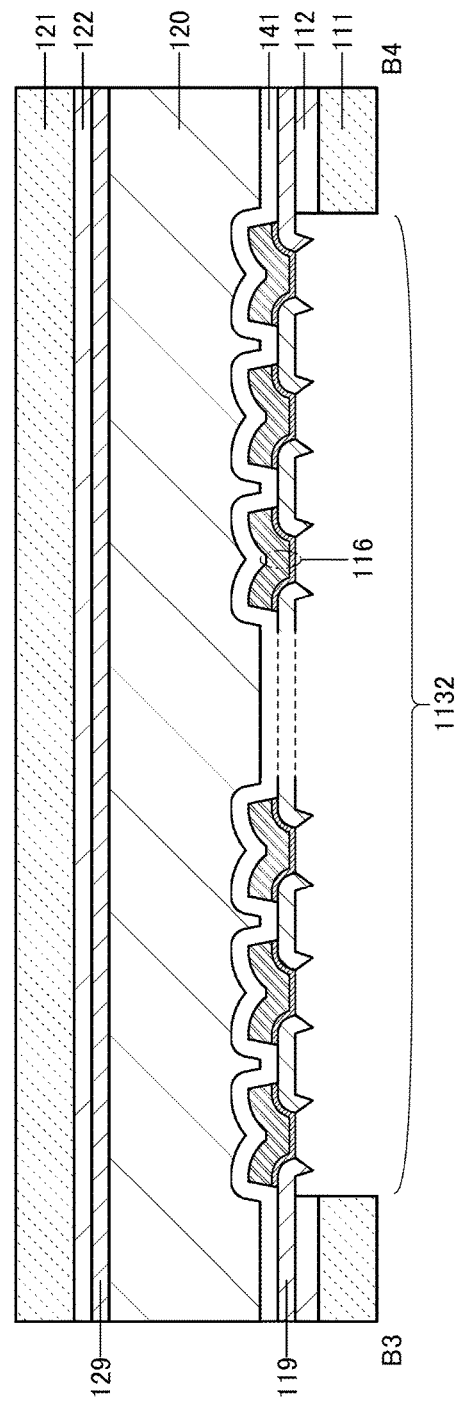
Figure 29A:
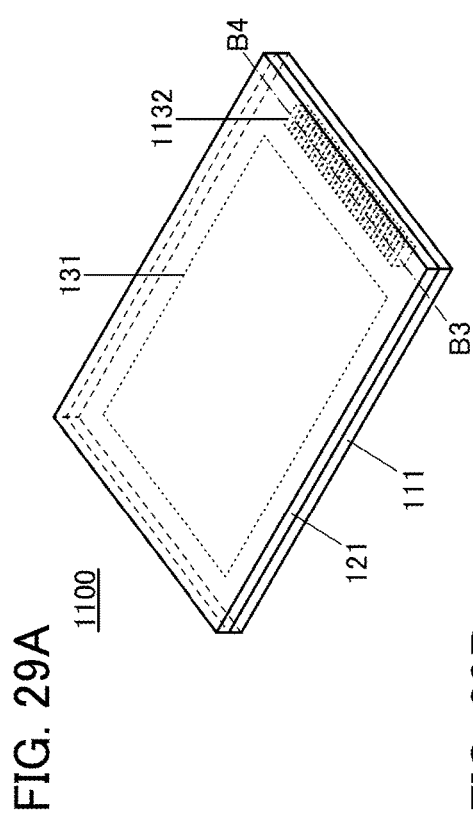
FIGS. 29A and 29B are a perspective view and a cross-sectional view illustrating one embodiment of a display device.
Figure 29B:
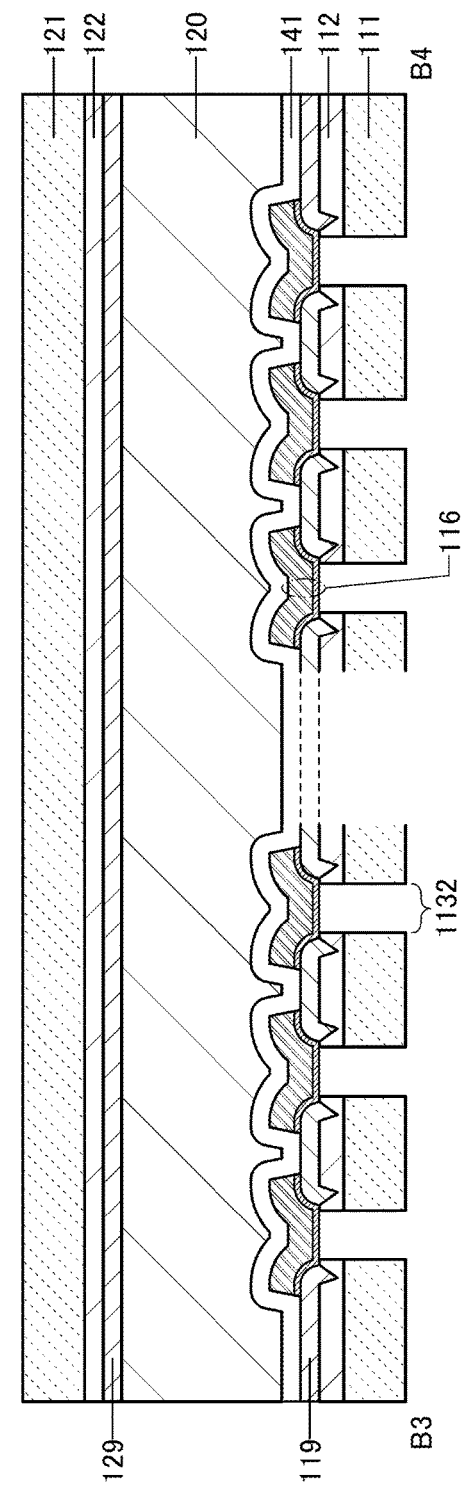

In the display device 1100 of one embodiment of the present invention, a plurality of electrodes 116 may be provided in one opening 1132 or the opening 1132 may be provided for each electrode 116. FIG. 28A is a perspective view of the display device 1100 in which a plurality of electrodes 116 are provided in one opening 1132, and FIG. 28B is a cross-sectional view taken along the dashed-dotted line B3-B4 in FIG. 28A. FIG. 29A is a perspective view of the display device 1100 in which the opening 1132 is provided for each electrode 116, and FIG. 29B is a cross-sectional view taken along the dashed-dotted line B3-B4 in FIG. 29A.

The opening 1132 is provided on the inner side than the end portion of the substrate 111 in a plan view, so that the outer edge of the opening 1132 can be supported by the substrate 111 and the substrate 121. Thus, the mechanical strength of a region where the external electrode 124 and the electrode 116 are connected to each other is unlikely to decrease, and unintentional deformation of the connected region can be reduced. Note that an effect of reducing the deformation of the connected region can be improved in the case where the opening 1132 is provided for each electrode 116 as compared with the case where a plurality of electrodes 116 are provided in one opening 1132 (see FIG. 28B). According to one embodiment of the present invention, breakage of the display device 1100 can be prevented, and the reliability of the display device 1100 can be improved.

Figure 30A:
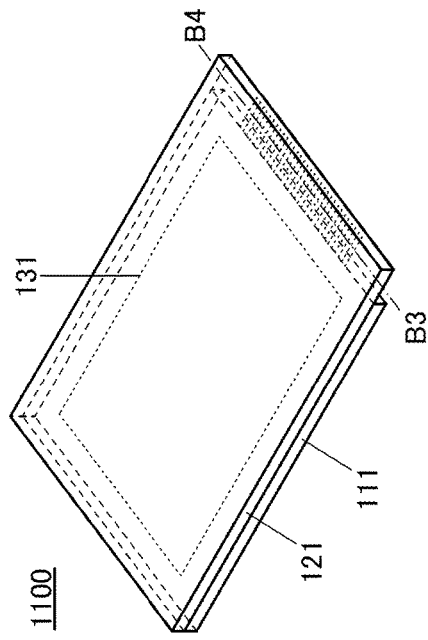
FIGS. 30A and 30B are a perspective view and a cross-sectional view illustrating one embodiment of a display device.
Figure 30B:
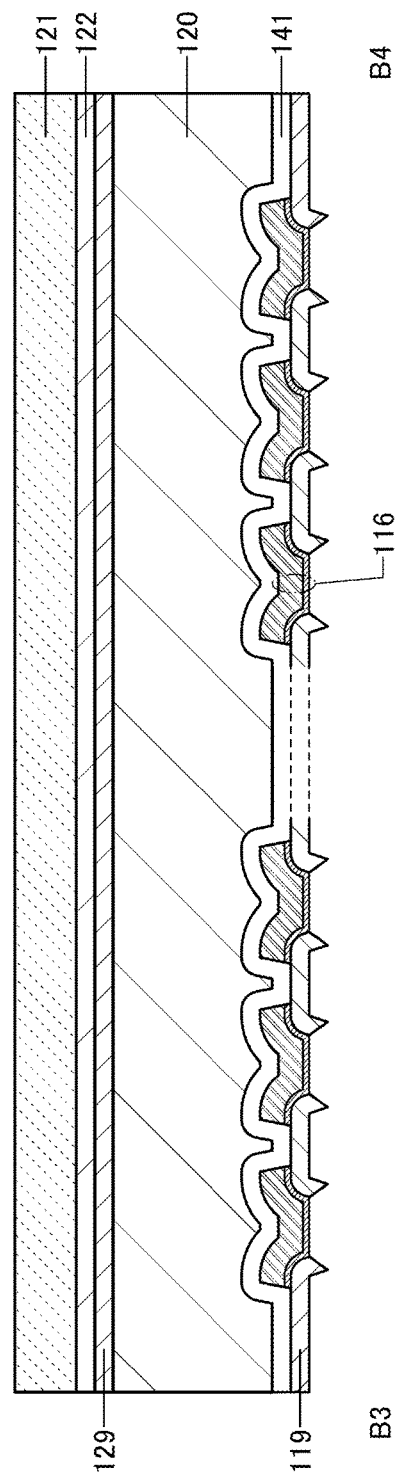

The surface of the electrode 116 may be exposed in such a manner that the opening 1132 is not provided and the substrate 111 is attached to the insulating film 129 so that the end portion of the substrate 111 and the end portion of the substrate 121 do not align with each other. FIG. 30A is a perspective view of the display device 1100 in which the surface of the electrode 116 is exposed so that the end portion of the substrate 111 and the end portion of the substrate 121 do not to align with each other, and FIG. 30B is a cross-sectional view taken along the dashed-dotted line B3-B4 in FIG. 30A. Note that FIG. 30A illustrates as an example the case where the substrate 111 which is smaller than the substrate 121 is provided to be overlapped with the substrate 121; however, the substrate 111 and the substrate 121 may be the same in size or the substrate 111 may be larger than the substrate 121.

The display device 1100 illustrated in FIGS. 30A and 30B does not have the opening 1132 in the substrate 111; therefore, there is no need to perform alignment of the opening 1132 and the electrode 116. According to one embodiment of the present invention, the productivity of the display device 1100 can be improved.

According to one embodiment of the present invention, part of the substrate 111 does not need to be removed by a laser beam or with an edged tool because the opening 1132 provided to expose the surface of the electrode 116 is not necessary; thus, the electrode 116 and the display region 131 are not damaged easily.

Alternatively, one or more functional layers 161 may be provided on an outer side than the substrate 111 or the substrate 121 from which the light 151 is emitted.

Figure 31A:
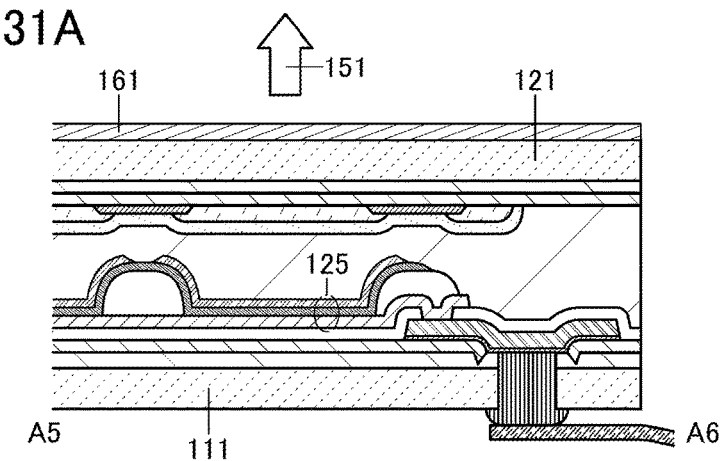
FIGS. 31A to 31C are cross-sectional views each illustrating one embodiment of a display device.
Figure 31B:
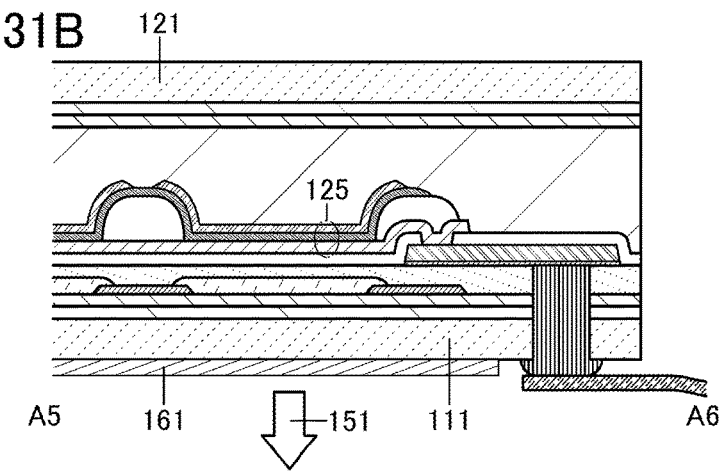
Figure 31C:
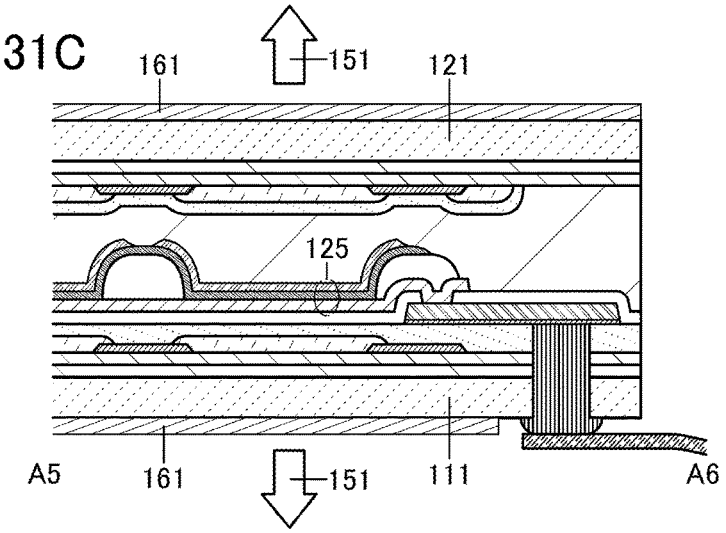

FIG. 31A is a cross-sectional view of the display device 1100 having a top-emission structure including the functional layer 161. FIG. 31B is a cross-sectional view of the display device 1100 having a bottom-emission structure including the functional layer 161. FIG. 31C is a cross-sectional view of the display device 1100 having a dual-emission structure including the functional layer 161.

[Formation of External Electrode 124]

Next, the anisotropic conductive connection layer 138 is formed in and on the opening 1132, and the external electrode 124 for inputting electric power or a signal to the display device 1100 is formed over the anisotropic conductive connection layer 138 (see FIGS. 18A and 18B). The electrode 116 is electrically connected to the external electrode 124 through the anisotropic conductive connection layer 138. Thus, electric power or a signal can be input to the display device 1100.

This embodiment can be implemented in an appropriate combination with any of the structures described in the other embodiments.

Embodiment 4

Figure 32A:
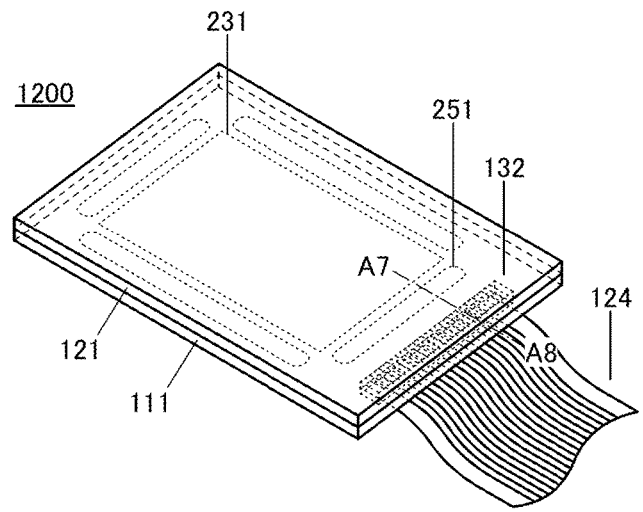
FIGS. 32A and 32B are a perspective view and a cross-sectional view illustrating one embodiment of a display device.
Figure 32B:
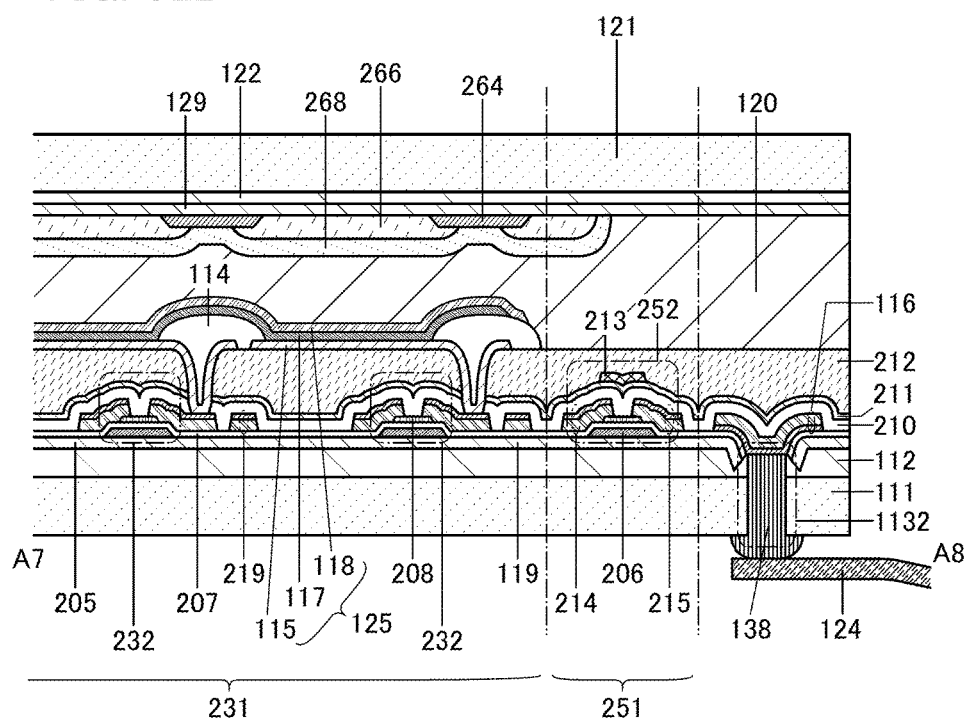

In this embodiment, a display device 1200 having a structure different from the structure of the display device 1100 described in the above embodiment will be described with reference to FIGS. 32A and 32B. FIG. 32A is a top view of the display device 1200, and FIG. 32B is a cross-sectional view taken along the dashed-dotted line A7-A8 in FIG. 32A.

<Structure of Display Device>

The display device 1200 described in this embodiment includes the display region 231 and the peripheral circuit 251. The display device 1200 further includes the electrode 116 and the light-emitting element 125 including the electrode 115, the EL layer 117, and the electrode 118. A plurality of light-emitting elements 125 are formed in the display region 231. The transistor 232 for controlling the amount of light emitted from the light-emitting element 125 is connected to each light-emitting element 125.

The electrode 116 is electrically connected to the external electrode 124 through the anisotropic conductive connection layer 138 formed in the opening 1132. The electrode 116 is electrically connected to the peripheral circuit 251.

Figure 34:
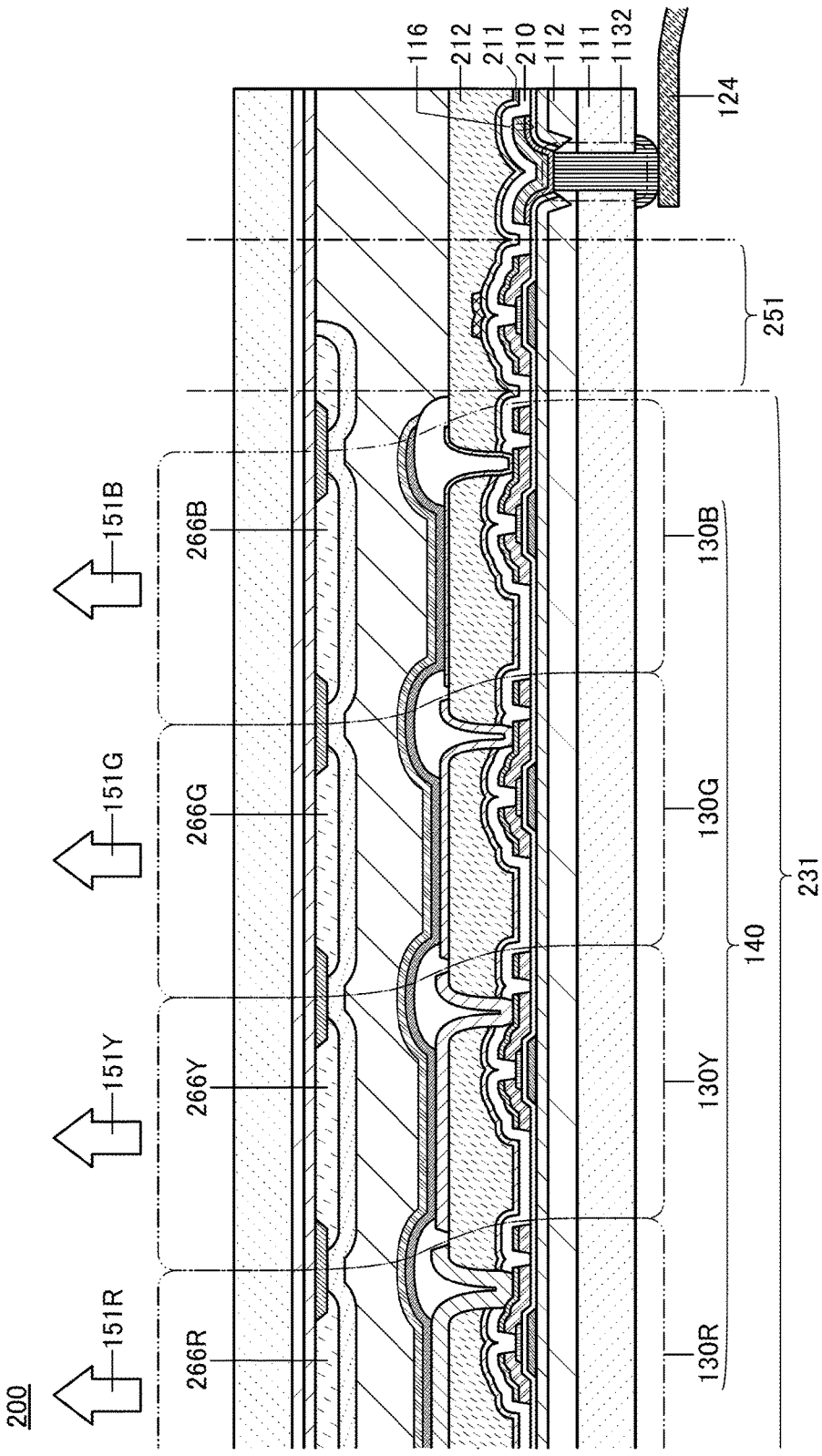
FIG. 34 is a cross-sectional view illustrating one embodiment of a display device.

FIGS. 33A and 33B are cross-sectional views of the display device 1200 in which the light-emitting element 125 has a microcavity structure. Note that FIG. 33A corresponds to a cross-sectional view taken along the vicinity of the dashed-dotted line A7-A8 in FIG. 32A. FIG. 33B is an enlarged view of a portion 1280 in FIG. 33A. FIG. 34 shows a structure example in which the coloring layer 266 is combined with the display device 1200 illustrated in FIGS. 33A and 33B.

Note that the structure of the display device 1200 which is not described in this embodiment can be understood by referring to the description on the display device 200 in Embodiment 2. Thus, detailed description thereof in this embodiment is omitted.

This embodiment can be implemented in an appropriate combination with any of the structures described in the other embodiments.

Embodiment 5

Figure 35A:
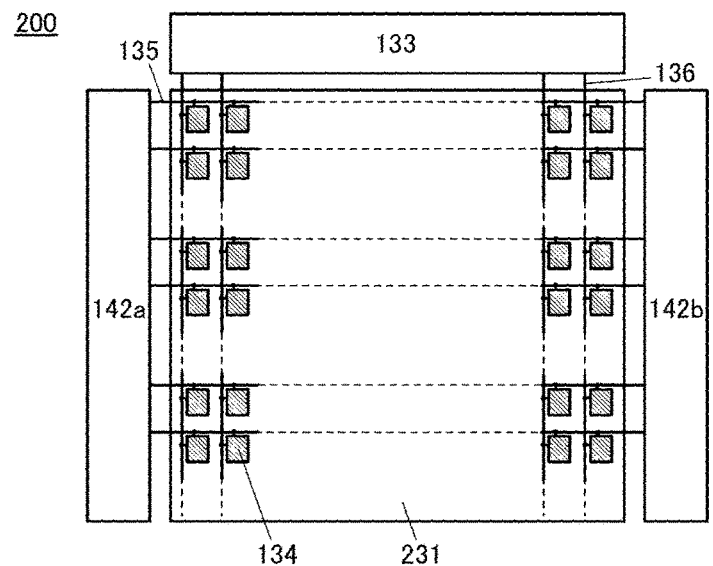
FIGS. 35A to 35C are a block diagram and circuit diagrams illustrating one embodiment of a display device.

In this embodiment, a specific structure example of the display device 200 will be described with reference to FIGS. 35A to 35C. FIG. 35A is a block diagram illustrating the structure example of the display device 200.

The display device 200 illustrated in FIG. 35A includes the display region 231, a driver circuit 142a, a driver circuit 142b, and a driver circuit 133. The driver circuits 142a, 142b, and 133 collectively correspond to the peripheral circuit 251 described in the above embodiments. The driver circuits 142a, 142b, and 133 may be collectively referred to as a driver circuit portion.

The driver circuits 142a and 142b function as, for example, scan line driver circuits. The driver circuit 133 functions as, for example, a signal line driver circuit. Note that one of the driver circuits 142a and 142b may be omitted. Alternatively, some sort of circuit facing the driver circuit 133 with the display region 231 provided therebetween may be provided.

The display device 200 includes m wirings 135 that are arranged substantially parallel to each other and whose potentials are controlled by the driver circuit 142a and/or the driver circuit 142b, and n wirings 136 that are arranged substantially parallel to each other and whose potentials are controlled by the driver circuit 133. The display region 231 includes a plurality of pixel circuits 134 arranged in matrix. One pixel circuit 134 is used for driving one subpixel (the pixel 130).

Each of the wirings 135 is electrically connected to the n pixel circuits 134 in a given row among the pixel circuits 134 arranged in m rows and n columns in the display region 231. Each of the wirings 136 is electrically connected to the m pixel circuits 134 in a given column among the pixel circuits 134 arranged in m rows and n columns. Note that m and n are each an integer of 1 or more.

[Example of Pixel Circuit for Light-Emitting Display Device]

Figure 35B:
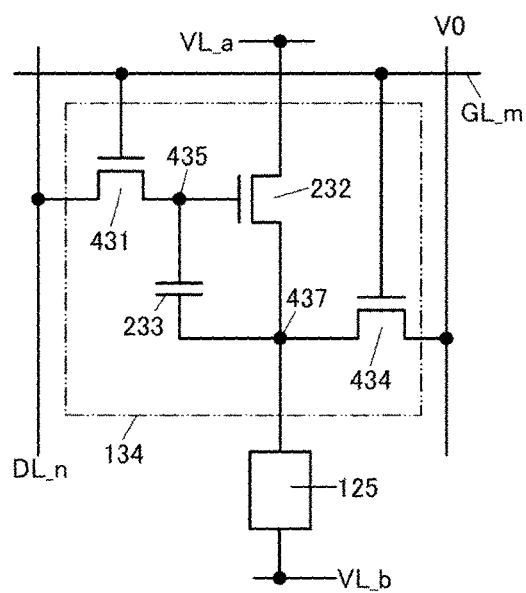
Figure 35C:
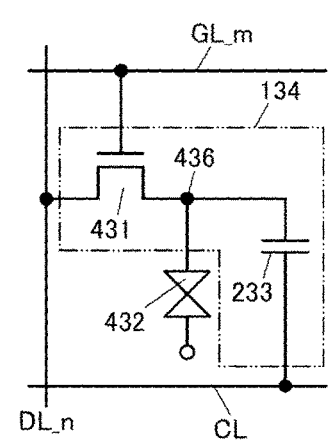

FIGS. 35B and 35C illustrate circuit structures that can be used for the pixel circuits 134 in the display device in FIG. 35A.

The pixel circuit 134 illustrated in FIG. 35B includes a transistor 431, a capacitor 233, the transistor 232, and a transistor 434. The pixel circuit 134 is electrically connected to the light-emitting element 125.

One of a source electrode and a drain electrode of the transistor 431 is electrically connected to a wiring to which a data signal is supplied (hereinafter referred to as a signal line DL_n). A gate electrode of the transistor 431 is electrically connected to a wiring to which a gate signal is supplied (hereinafter referred to as a scan line GL_m). The signal line DL_n and the scan line GL_m correspond to the wiring 136 and the wiring 135, respectively.

The transistor 431 has a function of controlling whether to write a data signal to a node 435.

One of a pair of electrodes of the capacitor 233 is electrically connected to the node 435, and the other of the pair of electrodes of the capacitor 233 is electrically connected to a node 437. The other of the source electrode and the drain electrode of the transistor 431 is electrically connected to the node 435.

The capacitor 233 functions as a storage capacitor for storing data written to the node 435.

One of a source electrode and a drain electrode of the transistor 232 is electrically connected to a potential supply line VL_a, and the other of the source electrode and the drain electrode of the transistor 232 is electrically connected to the node 437. A gate electrode of the transistor 232 is electrically connected to the node 435.

One of a source electrode and a drain electrode of the transistor 434 is electrically connected to a potential supply line V0, and the other of the source electrode and the drain electrode of the transistor 434 is electrically connected to the node 437. A gate electrode of the transistor 434 is electrically connected to the scan line GL_m.

One of an anode and a cathode of the light-emitting element 125 is electrically connected to a potential supply line VL_b, and the other of the anode and the cathode of the light-emitting element 125 is electrically connected to the node 437.

As the light-emitting element 125, an organic electroluminescent element (also referred to as an organic EL element) or the like can be used, for example. Note that the light-emitting element 125 is not limited thereto and may be an inorganic EL element containing, for example, an inorganic material.

As a power supply potential, a potential on the comparatively high potential side or a potential on the comparatively low potential side can be used, for example. A power supply potential on the high potential side is referred to as a high power supply potential (also referred to as VDD), and a power supply potential on the low potential side is referred to as a low power supply potential (also referred to as VSS). A ground potential can be used as the high power supply potential or the low power supply potential. For example, in the case where a ground potential is used as the high power supply potential, the low power supply potential is a potential lower than the ground potential, and in the case where a ground potential is used as the low power supply potential, the high power supply potential is a potential higher than the ground potential.

A high power supply potential VDD is supplied to one of the potential supply line VL_a and the potential supply line VL_b, and a low power supply potential VSS is supplied to the other, for example.

In the display device including the pixel circuit 134 in FIG. 35B, the pixel circuits 134 are sequentially selected row by row by the driver circuit 142a and/or the driver circuit 142b, so that the transistors 431 and 434 are turned on and a data signal is written to the nodes 435.

When the transistors 431 and 434 are turned off, the pixel circuits 134 in which the data has been written to the nodes 435 are brought into a holding state. The amount of current flowing between the source electrode and the drain electrode of the transistor 232 is controlled in accordance with the potential of the data written to the node 435. The light-emitting element 125 emits light with luminance corresponding to the amount of the flowing current. This operation is sequentially performed row by row; thus, an image can be displayed.

[Example of Pixel Circuit for Liquid Crystal Display Device]

The pixel circuit 134 in FIG. 35C includes the transistor 431 and the capacitor 233. The pixel circuit 134 is electrically connected to a liquid crystal element 432.

The potential of one of a pair of electrodes of the liquid crystal element 432 is set in accordance with the specifications of the pixel circuit 134 as appropriate. The alignment state of the liquid crystal element 432 depends on data written to a node 436. A common potential may be applied to one of the pair of electrodes of the liquid crystal element 432 included in each of the plurality of pixel circuits 134. The potential supplied to one of a pair of electrodes of the liquid crystal element 432 in the pixel circuit 134 in one row may be different from the potential supplied to one of a pair of electrodes of the liquid crystal element 432 in the pixel circuit 134 in another row.

Examples of a method for driving the display device including the liquid crystal element 432 include a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Note that one embodiment of the present invention is not limited thereto, and various liquid crystal elements and driving methods can be used.

The liquid crystal element 432 may be formed using a liquid crystal composition including a liquid crystal exhibiting a blue phase and a chiral material. The liquid crystal exhibiting a blue phase has a short response time of 1 ms or less and has optical isotropy; thus, an alignment process is not necessary. A liquid crystal display device including a liquid crystal exhibiting a blue phase has small viewing angle dependence because the liquid crystal has optical isotropy.

Note that, as described below, a display element other than the light-emitting element 125 and the liquid crystal element 432 can be used.

In the pixel circuit 134 in the m-th row and the n-th column, one of the source electrode and the drain electrode of the transistor 431 is electrically connected to the signal line DL_n, and the other of the source electrode and the drain electrode of the transistor 431 is electrically connected to the node 436. The gate electrode of the transistor 431 is electrically connected to the scan line GL_m. The transistor 431 has a function of controlling whether to write a data signal to the node 436.

One of the pair of electrodes of the capacitor 233 is electrically connected to a wiring to which a specific potential is supplied (hereinafter referred to as a capacitor line CL), and the other of the pair of electrodes of the capacitor 233 is electrically connected to the node 436. The other of the pair of electrodes of the liquid crystal element 432 is electrically connected to the node 436. The potential of the capacitor line CL is set in accordance with the specifications of the pixel circuit 134 as appropriate. The capacitor 233 functions as a storage capacitor for storing data written to the node 436.

For example, in the display device including the pixel circuit 134 in FIG. 35C, the pixel circuits 134 are sequentially selected row by row by the driver circuit 142a and/or the driver circuit 142b, so that the transistors 431 are turned on and a data signal is written to the nodes 436.

When the transistors 431 are turned off, the pixel circuits 134 in which the data signal has been written to the nodes 436 are brought into a holding state. This operation is sequentially performed row by row; thus, an image can be displayed on the display region 231.

[Display Element]

The display device of one embodiment of the present invention can employ various modes and can include various elements. The display element includes at least one of an electroluminescence (EL) element (e.g., an EL element including organic and inorganic materials, an organic EL element, or an inorganic EL element) including an LED (e.g., a white LED, a red LED, a green LED, or a blue LED), a transistor (a transistor that emits light depending on current), an electron emitting element, a plasma display panel (PDP), a liquid crystal element, an electrophoretic element, a display element using micro electro mechanical system (MEMS) such as a grating light valve (GLV), a digital micromirror device (DMD), a digital micro shutter (DMS) element, a MIRASOL (registered trademark) display, an interferometric modulator display (IMOD) element, and a piezoelectric ceramic display, an electrowetting element, and the like. Other than the above, display device may contain a display medium whose contrast, luminance, reflectance, transmittance, or the like is changed by electrical or magnetic action. Alternatively, quantum dots may be used as the display element.

Examples of display devices having EL elements include an EL display. Examples of a display device including an electron emitter include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices having electrophoretic elements include electronic paper. Examples of display devices including quantum dots include a quantum dot display.

In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

This embodiment can be implemented in an appropriate combination with any of the structures described in the other embodiments.

Embodiment 6

In this embodiment, an example of a transistor which can be used instead of the transistor 232 and/or the transistor 252 described in the above embodiments will be described with reference to FIGS. 36A1, 36A2, 36B1, and 36B2. A transistor disclosed in this specification and the like can be applied to the transistors 431, 434, and the like.

[Bottom-Gate Transistor]

A transistor 410 shown in FIG. 36A1 as an example is a channel-protective transistor that is a type of bottom-gate transistor. The transistor 410 includes an insulating layer 209 that can function as a channel protective layer over a channel formation region in the semiconductor layer 208. The insulating layer 209 can be formed using a material and a method that are similar to those of the insulating layer 205. Part of the electrode 214 and part of the electrode 215 are formed over the insulating layer 209.

With the insulating layer 209 provided over the channel formation region, the semiconductor layer 208 can be prevented from being exposed at the time of forming the electrode 214 and the electrode 215. Thus, the semiconductor layer 208 can be prevented from being reduced in thickness at the time of forming the electrode 214 and the electrode 215.

A transistor 411 illustrated in FIG. 36A2 is different from the transistor 410 in that an electrode 213 that can function as a back gate electrode is provided over the insulating layer 211. The electrode 213 can be formed using a material and a method that are similar to those of the electrode 206. The electrode 213 may be formed between the insulating layer 210 and the insulating layer 211.

In general, the back gate electrode is formed using a conductive layer and positioned so that the channel formation region of the semiconductor layer is provided between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode independently of the potential of the gate electrode, the threshold voltage of the transistor can be changed.

The electrodes 206 and 213 can both function as a gate electrode. Thus, the insulating layers 207, 209, 210, and 211 can all function as a gate insulating layer.

In the case where one of the electrode 206 and the electrode 213 is simply referred to as a "gate electrode", the other can be referred to as a "back gate electrode". For example, in the transistor 411, in the case where the electrode 213 is referred to as a "gate electrode", the electrode 206 is referred to as a "back gate electrode". In the case where the electrode 213 is used as a "gate electrode", the transistor 411 is a kind of bottom-gate transistor. Furthermore, one of the electrode 206 and the electrode 213 may be referred to as a "first gate electrode", and the other may be referred to as a "second gate electrode".

By providing the electrode 206 and the electrode 213 with the semiconductor layer 208 provided therebetween and setting the potentials of the electrode 206 and the electrode 213 to be the same, a region of the semiconductor layer 208 through which carriers flow is enlarged in the film thickness direction; thus, the number of transferred carriers is increased. As a result, the on-state current and the field-effect mobility of the transistor 411 are increased.

Therefore, the transistor 411 has large on-state current for the area occupied thereby. That is, the area occupied by the transistor 411 can be small for required on-state current.

Furthermore, the gate electrode and the back gate electrode are formed using conductive layers and thus each have a function of preventing an electric field generated outside the transistor from influencing the semiconductor layer in which the channel is formed (in particular, a function of blocking static electricity).

Since the electrode 206 and the electrode 213 each have a function of blocking an electric field generated outside, charges of charged particles and the like generated on the substrate 111 side or above the electrode 213 do not influence the channel formation region in the semiconductor layer 208. Therefore, degradation in a stress test (e.g., a negative gate bias temperature (−GBT) stress test in which negative charges are applied to a gate) can be reduced, and changes in the threshold voltage can be reduced. Note that this effect is caused when the electrodes 206 and 213 have the same potential or different potentials.

The BT stress test is one kind of accelerated test and can evaluate, in a short time, a change by long-term use (i.e., a change over time) in characteristics of transistors. In particular, the change in threshold voltage of the transistor between before and after the BT stress test is an important indicator when examining the reliability of the transistor. If the change in the threshold voltage between before and after the BT stress test is small, the transistor has higher reliability.

By providing the electrode 206 and the electrode 213 and setting the potentials of the electrode 206 and the electrode 213 to be the same, the change in threshold voltage is reduced. Accordingly, variation in electrical characteristics among a plurality of transistors is also reduced.

The transistor including the back gate electrode has a smaller change in threshold voltage between before and after a positive GBT stress test in which positive charges are applied to a gate than a transistor including no back gate electrode.

When the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

A transistor 420 shown in FIG. 36B1 as an example is a channel-protective transistor that is a type of bottom-gate transistor. The transistor 420 has substantially the same structure as the transistor 410 but is different from the transistor 410 in that the insulating layer 209 covers the side surfaces of the semiconductor layer 208.

The semiconductor layer 208 is electrically connected to the electrode 214 in an opening which is formed by selectively removing part of the insulating layer 209. The semiconductor layer 208 is electrically connected to the electrode 215 in the opening which is formed by selectively removing part of the insulating layer 209. A region of the insulating layer 209 which overlaps with the channel formation region can function as a channel protective layer.

A transistor 421 illustrated in FIG. 36B2 is different from the transistor 420 in that the electrode 213 that can function as a back gate electrode is provided over the insulating layer 211.

With the insulating layer 209, the semiconductor layer 208 can be prevented from being exposed at the time of forming the electrode 214 and the electrode 215. Thus, the semiconductor layer 208 can be prevented from being reduced in thickness at the time of forming the electrode 214 and the electrode 215.

The length between the electrode 214 and the electrode 206 and the length between the electrode 215 and the electrode 206 in the transistors 420 and 421 are longer than those in the transistors 410 and 411. Thus, the parasitic capacitance generated between the electrode 214 and the electrode 206 can be reduced. Moreover, the parasitic capacitance generated between the electrode 215 and the electrode 206 can be reduced.

[Top-Gate Transistor]

A transistor 430 shown in FIG. 37A1 as an example is a type of top-gate transistor. The transistor 430 includes the semiconductor layer 208 over the insulating layer 119; the electrode 214 in contact with part of the semiconductor layer 208 and the electrode 215 in contact with part of the semiconductor layer 208, over the semiconductor layer 208 and the insulating layer 119; the insulating layer 207 over the semiconductor layer 208, the electrode 214 and the electrode 215; and the electrode 206 over the insulating layer 207. The insulating layer 210 and the insulating layer 211 are formed over the electrode 206.

Since, in the transistor 430, the electrode 206 overlaps with neither the electrode 214 nor the electrode 215, the parasitic capacitance generated between the electrode 206 and the electrode 214 and the parasitic capacitance generated between the electrode 206 and the electrode 215 can be reduced. After the formation of the electrode 206, an impurity element 221 is introduced into the semiconductor layer 208 using the electrode 206 as a mask, so that an impurity region can be formed in the semiconductor layer 208 in a self-aligned manner (see FIG. 37A3).

The introduction of the impurity element 221 can be performed with an ion implantation apparatus, an ion doping apparatus, or a plasma treatment apparatus.

As the impurity element 221, for example, at least one element of a Group 13 element and a Group 15 element can be used. In the case where an oxide semiconductor is used for the semiconductor layer 208, it is possible to use at least one kind of element of a rare gas, hydrogen, and nitrogen as the impurity element 221.

A transistor 431 illustrated in FIG. 37A2 is different from the transistor 430 in that the electrode 213 and an insulating layer 217 are included. The transistor 431 includes the electrode 213 formed over the insulating layer 119 and the insulating layer 217 formed over the electrode 213. As described above, the electrode 213 can function as a back gate electrode. Thus, the insulating layer 217 can function as a gate insulating layer. The insulating layer 217 can be formed using a material and a method that are similar to those of the insulating layer 205.

The transistor 431 as well as the transistor 411 has large on-state current for the area occupied thereby. That is, the area occupied by the transistor 431 can be small for required on-state current. According to one embodiment of the present invention, the area occupied by a transistor can be reduced. Therefore, according to one embodiment of the present invention, a semiconductor device having a high degree of integration can be provided.

A transistor 440 shown in FIG. 37B1 as an example is a type of top-gate transistor. The transistor 440 is different from the transistor 430 in that the semiconductor layer 208 is formed after the formation of the electrode 214 and the electrode 215. A transistor 441 shown in FIG. 37B2 as an example is different from the transistor 431 in that the semiconductor layer 208 is formed after the formation of the electrode 214 and the electrode 215. Thus, in the transistors 440 and 441, part of the semiconductor layer 208 is formed over the electrode 214 and another part of the semiconductor layer 208 is formed over the electrode 215.

In the transistors 440 and 441, after the formation of the electrode 206, the impurity element 221 is introduced into the semiconductor layer 208 using the electrode 206 as a mask, so that an impurity region can be formed in the semiconductor layer 208 in a self-aligned manner.

Although the variety of films such as the metal film, the semiconductor film, the inorganic insulating film which are disclosed in this specification and the like can be formed by a sputtering method or a plasma chemical vapor deposition (CVD) method, such films may be formed by another method, for example, a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and they are reacted with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on a surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust the film thickness and thus is suitable for manufacturing a minute FET.

The variety of films such as the metal film, the semiconductor film, and the inorganic insulating film which are described in the above embodiments can be formed by a thermal CVD method such as a MOCVD method or an ALD method. For example, in the case where an In—Ga—Zn—O film is formed, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing liquid containing a solvent and a hafnium precursor compound (a hafnium alkoxide or hafnium amide such as tetrakis(dimethylamide) hafnium (TDMAH, $Hf[N(CH_3)_2]_4$)) are used. Examples of another material include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing a solvent and liquid containing an aluminum precursor compound (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, and radicals of an oxidizing gas (e.g., $O_2$ or dinitrogen monoxide) are supplied to react with the adsorbate.

For example, in the case where a tungsten film is formed by a deposition apparatus using an ALD method, a $WF_6$ gas and a $B_2H_6$ gas are sequentially introduced plural times to form an initial tungsten film, and then a $WF_6$ gas and an $H_2$ gas are sequentially introduced plural times to form a tungsten film. Note that an $SiH_4$ gas may be used instead of a $B_2H_6$ gas.

For example, in the case where an oxide semiconductor film, for example, an In—Ga—Zn—O film is formed by a deposition apparatus using an ALD method, an $In(CH_3)_3$ gas and an $O_3$ gas are sequentially introduced plural times to form an In—O layer, a $Ga(CH_3)_3$ gas and an $O_3$ gas are sequentially introduced plural times to form a GaO layer, and then a $Zn(CH_3)_2$ gas and an $O_3$ gas are sequentially introduced plural times to form a ZnO layer. Note that the order of these layers is not limited to this example. A mixed oxide layer such as an In—Ga—O layer, an In—Zn—O layer, or a Ga—Zn—O layer may be formed by using these gases. Note that although an $H_2O$ gas which is obtained by bubbling water with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Alternatively, a $Zn(CH_3)_2$ gas may be used.

This embodiment can be implemented in an appropriate combination with any of the structures described in the other embodiments.

Embodiment 7

In this embodiment, structure examples of a light-emitting element that can be used as the light-emitting element 125 will be described. Note that an EL layer 320 described in this embodiment corresponds to the EL layer 117 described in the other embodiments.

<Structure of Light-Emitting Element>

Figure 38A:
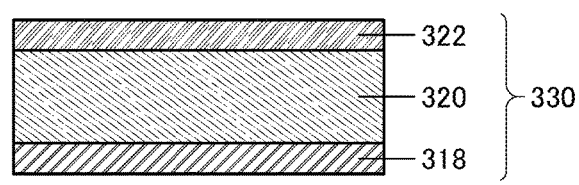
FIGS. 38A and 38B illustrate structure examples of a light-emitting element.

In a light-emitting element 330 illustrated in FIG. 38A, the EL layer 320 is sandwiched between a pair of electrodes (electrodes 318 and 322). The electrode 318, the electrode 322, and the EL layer 320 respectively correspond to the electrode 115, the electrode 118, and the EL layer 117 of the aforementioned Embodiments. Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron and hole transport properties), or the like can be used. Specifically, functional layers such as a hole-injection layer, a hole-transport layer, an electron-transport layer, and an electron-injection layer can be used in appropriate combination.

The light-emitting element 330 illustrated in FIG. 38A emits light when current flows by applying a potential difference between the electrode 318 and the electrode 322 and holes and electrons are recombined in the EL layer 320. In other words, a light-emitting region is formed in the EL layer 320.

In one embodiment of the present invention, light emitted from the light-emitting element 330 is extracted to the outside from the electrode 318 side or the electrode 322 side. Thus, one of the electrodes 318 and 322 is formed using a light-transmitting substance.

Figure 38B:
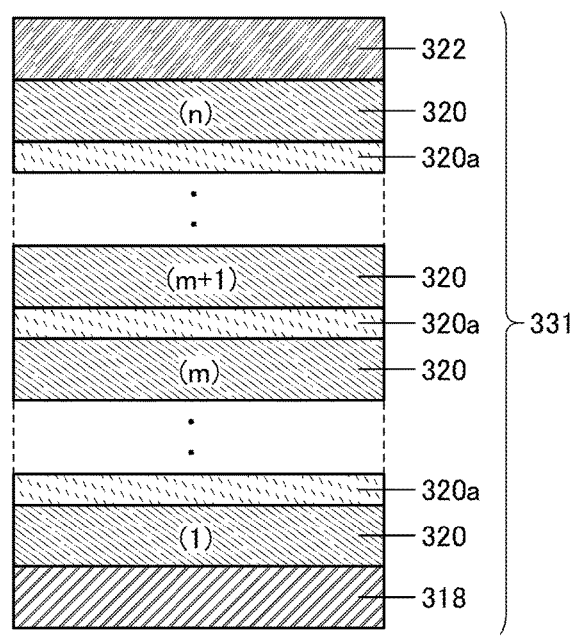

Note that a plurality of EL layers 320 may be stacked between the electrode 318 and the electrode 322 as in a light-emitting element 331 illustrated in FIG. 38B. In the case where n (n is a natural number of 2 or more) layers are stacked, an electric charge generation layer 320a is preferably provided between an m-th EL layer 320 and an (m+1)th EL layer 320. Note that m is a natural number greater than or equal to 1 and less than n. The components other than the electrode 318 and the electrode 322 correspond to the EL layer 117 of the aforementioned Embodiments.

The electric charge generation layer 320a can be formed using a composite material of an organic compound and a metal oxide. Examples of the metal oxide are vanadium oxide, molybdenum oxide, tungsten oxide, or the like. As the organic compound, a variety of compounds can be used; for example, an aromatic amine compound, a carbazole derivative, an aromatic hydrocarbon, and an oligomer, a dendrimer, and a polymer having a basic skeleton of these compounds can be used. Note that as the organic compound, it is preferable to use an organic compound that has a hole-transport property and has a hole mobility of $10^{-6}$ cm$^2$/Vs or higher. However, other substances may be used as long as their hole-transport properties are higher than their electron-transport properties. These materials used for the electric charge generation layer 320a have excellent carrier-injection properties and carrier-transport properties; thus, the light-emitting element 331 can be driven with low current and with low voltage. Other than the composite material, the metal oxide, a composite material of an organic compound and an alkali metal, an alkaline earth metal, or a compound of the alkali metal or the alkaline earth metal can be used in the electric charge generation layer 320a.

Note that the electric charge generation layer 320a may be formed by a combination of a composite material of an organic compound and a metal oxide with another material. For example, the electric charge generation layer 320a may be formed by a combination of a layer containing the composite material of an organic compound and a metal oxide with a layer containing one compound selected from electron-donating substances and a compound having a high electron-transport property. Furthermore, the electric charge generation layer 320a may be formed by a combination of a layer containing the composite material of an organic compound and a metal oxide with a transparent conductive film.

The light-emitting element 331 having such a structure is unlikely to result in energy transfer between the neighboring EL layer 320 and can easily realize high emission efficiency and a long lifetime. Furthermore, it is easy to obtain phosphorescence from one light-emitting layer and fluorescence from the other light-emitting layer.

The electric charge generation layer 320a has a function of injecting holes to one of the EL layers 320 that is in contact with the electric charge generation layer 320a and a function of injecting electrons to the other EL layer 320 that is in contact with the electric charge generation layer 320a, when voltage is applied to the electrodes 318 and 322.

The light-emitting element 331 illustrated in FIG. 38B can provide a variety of emission colors by changing the type of the light-emitting substance used for the EL layers 320. In addition, a plurality of light-emitting substances having different emission colors may be used as the light-emitting substances, so that light emission having a broad spectrum or white light emission can be obtained.

In the case of obtaining white light emission using the light-emitting element 331 in FIG. 38B, as for a combination of a plurality of EL layers, a structure for emitting white light including red light, blue light, and green light may be used. For example, the structure may include an EL layer containing a blue fluorescent substance as a light-emitting substance and an EL layer containing green and red phosphorescent substances as light-emitting substances. Alternatively, the structure may include an EL layer emitting red light, an EL layer emitting green light, and an EL layer emitting blue light. Further alternatively, with a structure including EL layers emitting light of complementary colors, white light emission can be obtained. In a stacked-layer element including two EL layers which emit lights with complementary colors, the combinations of colors are as follows: blue and yellow, blue-green and red, and the like.

Note that in the structure of the above stacked-layer element, by providing the electric charge generation layer between the stacked light-emitting layers, the element can give a high-luminance region at a low current density, and have a long lifetime.

This embodiment can be implemented in an appropriate combination with any of the structures described in the other embodiments.

Embodiment 8

In this embodiment, a display module using the display device of one embodiment of the present invention will be described with reference to FIG. 39.

Figure 39:
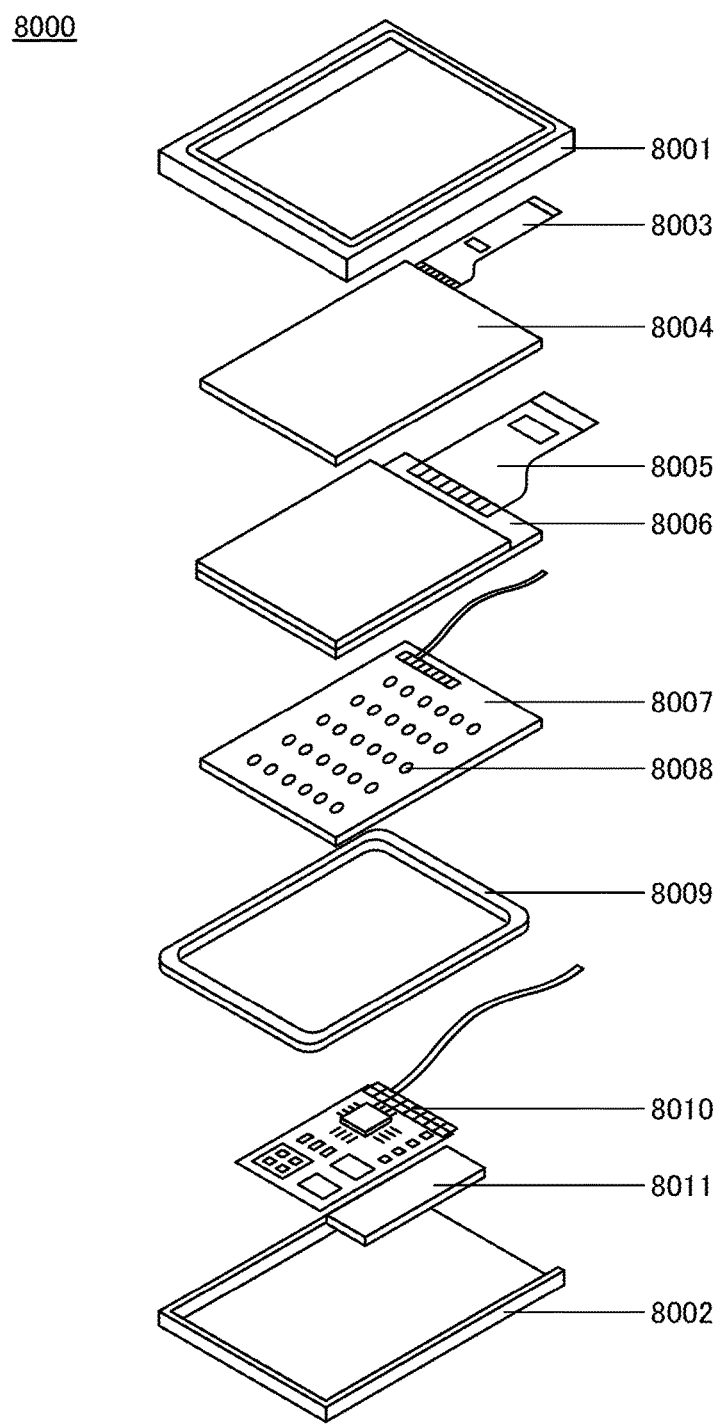
FIG. 39 illustrates a display module.

In a display module 8000 illustrated in FIG. 39, a touch sensor 8004 connected to an FPC 8003, a cell 8006 connected to an FPC 8005, a backlight unit 8007, a frame 8009, a printed board 8010, and a battery 8011 are provided between an upper cover 8001 and a lower cover 8002. At least one of the upper cover 8001, the lower cover 8002, the backlight unit 8007, the frame 8009, the printed board 8010, the battery 8011, the touch sensor 8004, and the like is not provided in some cases.

The display device of one embodiment of the present invention can be used for the cell 8006, for example.

The shapes and sizes of the upper cover 8001 and the lower cover 8002 can be changed as appropriate in accordance with the sizes of the touch sensor 8004 and the cell 8006.

The touch sensor 8004 can be a resistive touch sensor or a capacitive touch sensor and may be formed to overlap with the cell 8006. A counter substrate (sealing substrate) of the cell 8006 can have a touch sensor function. A photosensor may be provided in each pixel of the cell 8006 so that an optical touch sensor is obtained. An electrode for a touch sensor may be provided in each pixel of the cell 8006 so that a capacitive touch sensor is obtained.

The backlight unit 8007 includes a light source 8008. The light source 8008 may be provided at an end portion of the backlight unit 8007 and a light diffusing plate may be used. In the case where a display device including a light-emitting element and the like is used for the cell 8006, the backlight unit 8007 is not necessarily provided.

The frame 8009 may protect the cell 8006 and also function as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using an external power source.

The display module 8000 can be additionally provided with a member such as a polarizing plate, a retardation plate, or a prism sheet.

This embodiment can be implemented in an appropriate combination with any of the structures described in the other embodiments.

Embodiment 9

In this embodiment, examples of an electronic device and a lighting device including the display device of one embodiment of the present invention will be described with reference to drawings.

Specific examples of the electronic device that uses the display device of one embodiment of the present invention are as follows: display devices of televisions, monitors, and the like, lighting devices, desktop and laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, large game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects and the like driven by electric motors using power from a power storage unit are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

In particular, as examples of electronic devices including a display device with flexibility, the following can be given: television devices (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 40A:
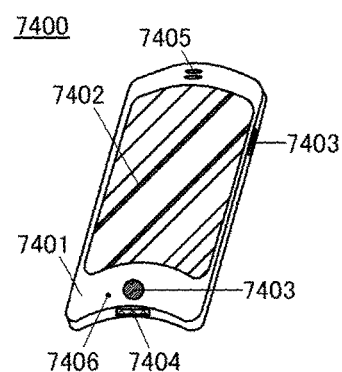
FIGS. 40A to 40E illustrate examples of electronic devices and lighting devices.

FIG. 40A is an example of a mobile phone. A mobile phone 7400 includes a display portion 7402 that is incorporated in a housing 7401. The mobile phone 7400 further includes operation buttons 7403, an external connection port 7404, a speaker 7405, a microphone 7406, and the like. The mobile phone 7400 is manufactured using the display device for the display portion 7402.

When the display portion 7402 is touched with a finger or the like, data can be input into the mobile phone 7400 in FIG. 40A. Furthermore, operations such as making a call and inputting a letter can be performed by touch on the display portion 7402 with a finger or the like.

With the operation buttons 7403, power ON/OFF can be switched. In addition, types of images displayed on the display portion 7402 can be switched; for example, switching images from a mail creation screen to a main menu screen.

Here, the display portion 7402 includes the display device of one embodiment of the present invention. Thus, the mobile phone can have a curved display portion and high reliability.

Figure 40B:
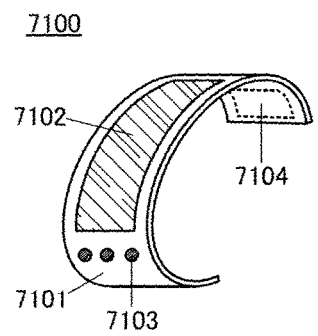

FIG. 40B is an example of a wristband-type display device. A portable display device 7100 includes a housing 7101, a display portion 7102, operation buttons 7103, and a transceiver 7104.

The portable display device 7100 can receive a video signal with the transceiver 7104 and can display the received video on the display portion 7102. In addition, with the transceiver 7104, the portable display device 7100 can send an audio signal to another receiving device.

With the operation button 7103, power ON/OFF, switching displayed videos, adjusting volume, and the like can be performed.

Here, the display portion 7102 includes the display device of one embodiment of the present invention. Thus, the portable display device can have a curved display portion and high reliability.

Figure 40C:
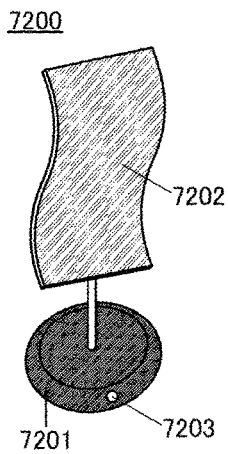
Figure 40D:
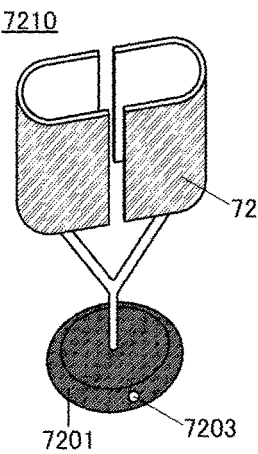
Figure 40E:
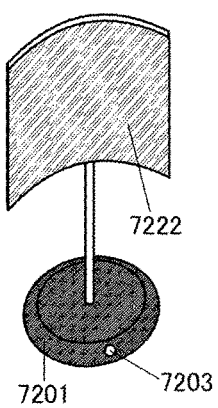

FIGS. 40C to 40E show examples of lighting devices. Lighting devices 7200, 7210, and 7220 each include a stage 7201 provided with an operation switch 7203 and a light-emitting portion supported by the stage 7201.

The lighting device 7200 illustrated in FIG. 40C includes a light-emitting portion 7202 with a wave-shaped light-emitting surface and thus is a good-design lighting device.

A light-emitting portion 7212 included in the lighting device 7210 illustrated in FIG. 40D has two convex-curved light-emitting portions symmetrically placed. Thus, light radiates from the lighting device 7210 in all directions.

The lighting device 7220 illustrated in FIG. 40E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 is flexible; thus, the light-emitting portion can be fixed on a plastic member, a movable frame, or the like so that an emission surface of the light-emitting portion can be curved freely depending on the intended use.

The light-emitting portions included in the lighting devices 7200, 7210, and 7220 each include the display device of one embodiment of the present invention. Thus, the light-emitting portions can be curved or bent into any shape and the lighting devices can have high reliability.

Figure 41A:
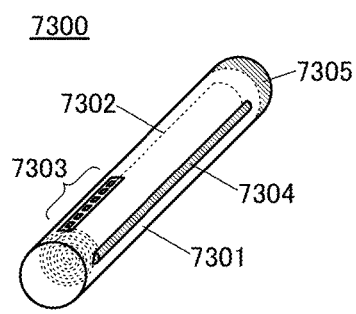
FIGS. 41A and 41B illustrate an example of an electronic device.

FIG. 41A shows an example of a portable display device. A display device 7300 includes a housing 7301, a display portion 7302, operation buttons 7303, a display portion pull 7304, and a control portion 7305.

The display device 7300 includes the rolled flexible display portion 7302 in the cylindrical housing 7301.

The display device 7300 can receive a video signal with the control portion 7305 and can display the received video on the display portion 7302. In addition, a power storage device is included in the control portion 7305. Moreover, a connector may be included in the control portion 7305 so that a video signal or power can be supplied directly.

With the operation buttons 7303, power ON/OFF, switching of displayed videos, and the like can be performed.

Figure 41B:
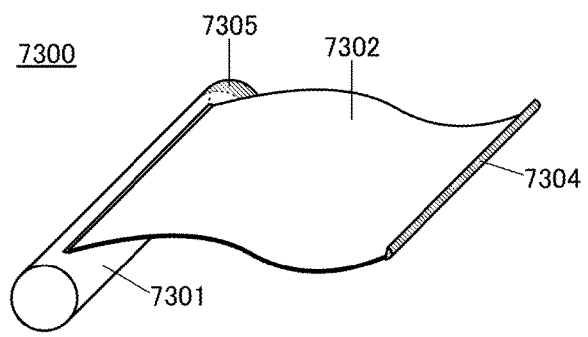

FIG. 41B illustrates a state where the display portion 7302 is pulled out with the display portion pull 7304. Videos can be displayed on the display portion 7302 in this state. Furthermore, the operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes the display device of one embodiment of the present invention. Thus, the display portion 7302 is a display device which is flexible and highly reliable, which makes the display device 7300 lightweight and highly reliable.

Figure 42A:
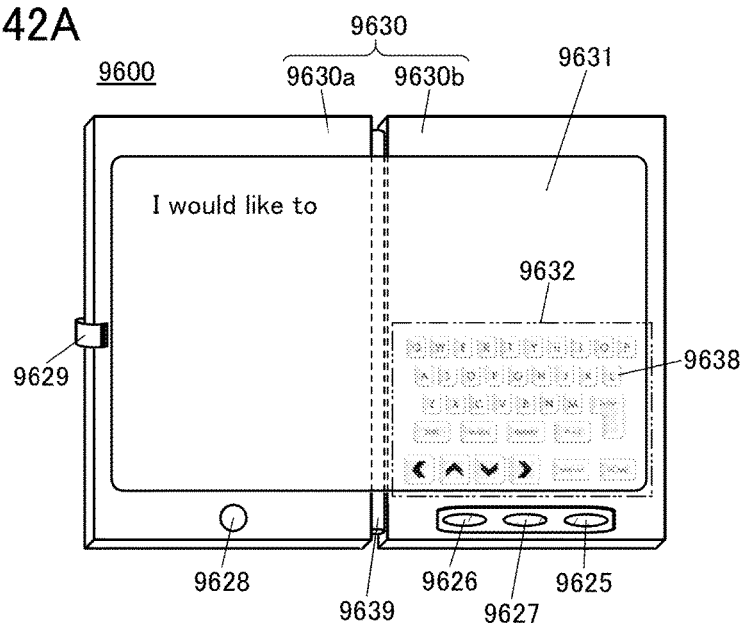
FIGS. 42A to 42C illustrate an example of an electronic device.
Figure 42B:
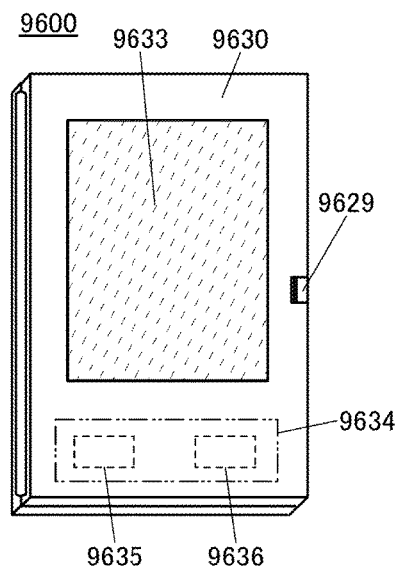

FIGS. 42A and 42B show a double foldable tablet terminal 9600 as an example. FIG. 42A illustrates the tablet terminal 9600 which is unfolded. The tablet terminal 9600 includes a housing 9630, a display portion 9631, a display mode switch 9626, a power switch 9627, a power-saving mode switch 9625, a clasp 9629, and an operation switch 9628.

The housing 9630 includes a housing 9630a and a housing 9630b, which are connected with a hinge portion 9639. The hinge portion 9639 makes the housing 9630 double foldable.

The display portion 9631 is provided on the housing 9630a, the housing 9630b, and the hinge portion 9639. By the use of the display device disclosed in this specification and the like for the display portion 9631, the tablet terminal in which the display portion 9631 is foldable and which has high reliability can be provided.

Part of the display portion 9631 can be a touchscreen region 9632 and data can be input when a displayed operation key 9638 is touched. A structure can be employed in which half of the display portion 9631 has only a display function and the other half has a touchscreen function. The whole display portion 9631 may have a touchscreen function. For example, keyboard buttons may be displayed on the entire region of the display portion 9631 so that the display portion 9631 can be used as a data input terminal.

The display mode switch 9626 can switch the display between a portrait mode and a landscape mode, and between monochrome display and color display, for example. The power-saving mode switch 9625 can control display luminance in accordance with the amount of external light in use of the tablet terminal detected by an optical sensor incorporated in the tablet terminal. Another detection device including a sensor for detecting inclination, such as a gyroscope or an acceleration sensor, may be incorporated in the tablet terminal, in addition to the optical sensor.

FIG. 42B illustrates the tablet terminal 9600 which is folded. The tablet terminal 9600 includes the housing 9630, a solar cell 9633, and a charge and discharge control circuit 9634. As an example, FIG. 42B illustrates the charge and discharge control circuit 9634 including a battery 9635 and a DC-to-DC converter 9636.

By including the display device that is disclosed in this specification and the like, the display portion 9631 is foldable. Since the tablet terminal 9600 is double foldable, the housing 9630 can be closed when the tablet terminal is not in use, for example; thus, the tablet terminal is highly portable. Moreover, since the display portion 9631 can be protected when the housing 9630 is closed, the tablet terminal can have high durability and high reliability for long-term use.

The tablet terminal illustrated in FIGS. 42A and 42B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that the solar cell 9633 is preferably provided on one or both surfaces of the housing 9630, in which case the battery 9635 can be charged efficiently. When a lithium ion battery is used as the battery 9635, there is an advantage of downsizing or the like.

Figure 42C:
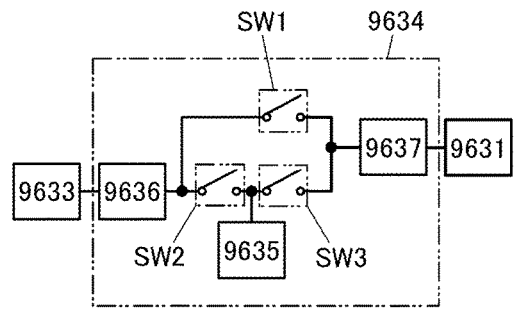

The structure and operation of the charge and discharge control circuit 9634 illustrated in FIG. 42B is described with reference to a block diagram of FIG. 42C. FIG. 42C illustrates the solar cell 9633, the battery 9635, the DC-to-DC converter 9636, a converter 9637, switches SW1 to SW3, and the display portion 9631. The battery 9635, the DC-to-DC converter 9636, the converter 9637, and the switches SW1 to SW3 correspond to the charge and discharge control circuit 9634 illustrated in FIG. 42B.

First, description is made on an example of the operation in the case where power is generated by the solar cell 9633 with the use of external light. The voltage of the power generated by the solar cell is raised or lowered by the DC-to-DC converter 9636 so as to be voltage for charging the battery 9635. Then, when power from the solar cell 9633 is used for the operation of the display portion 9631, the switch SW1 is turned on and the voltage of the power is raised or lowered by the converter 9637 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation unit, the power generation unit is not particularly limited, and the battery 9635 may be charged by another power generation unit such as a piezoelectric element or a thermoelectric conversion element (Peltier element). For example, the battery 9635 may be charged using a non-contact power transmission module that transmits and receives power wirelessly (without contact) or using another charge unit in combination.

Figure 43A:
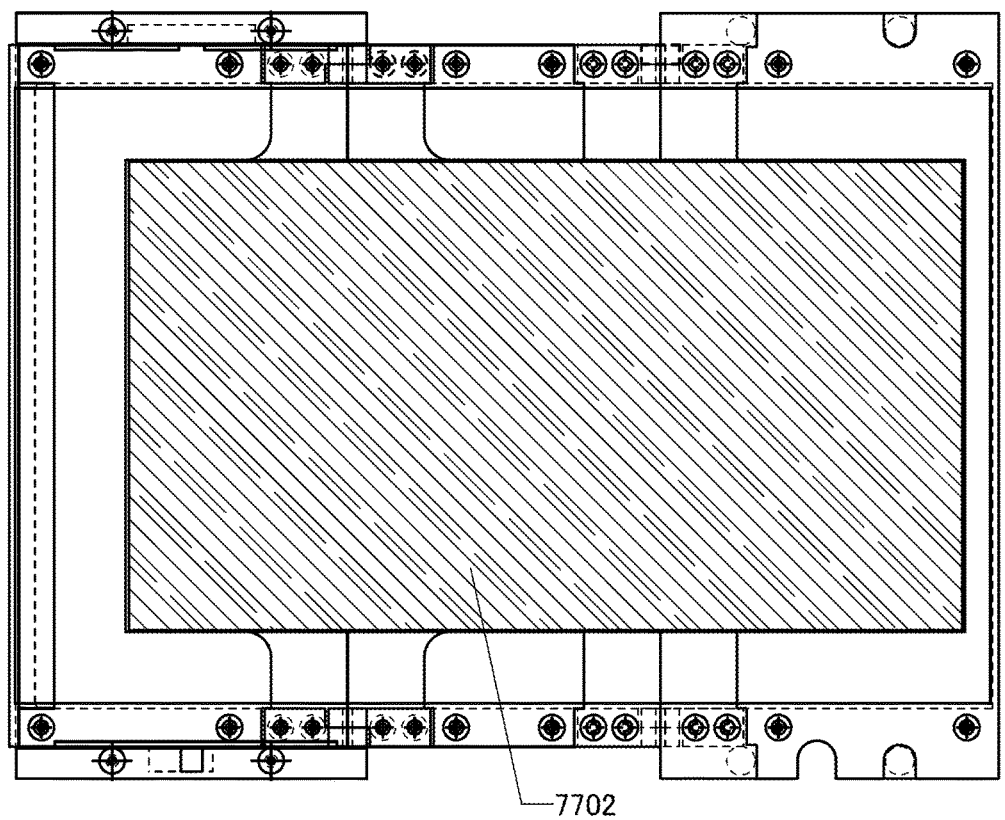
FIGS. 43A to 43C are a plan view and cross-sectional views illustrating an example of an electronic device.
Figure 43B:
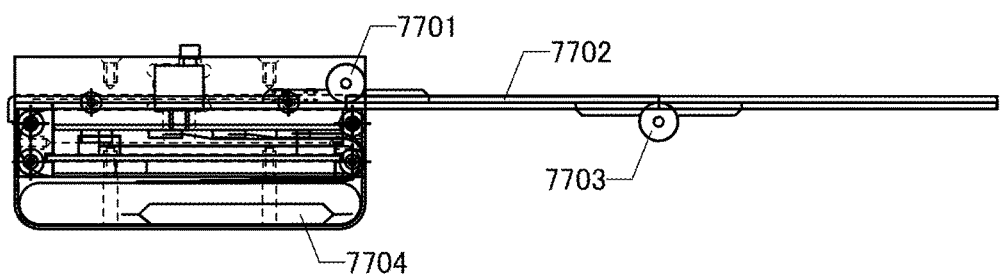
Figure 43C:
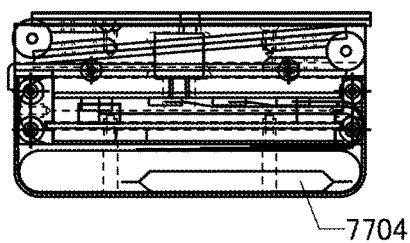
Figure 44A:
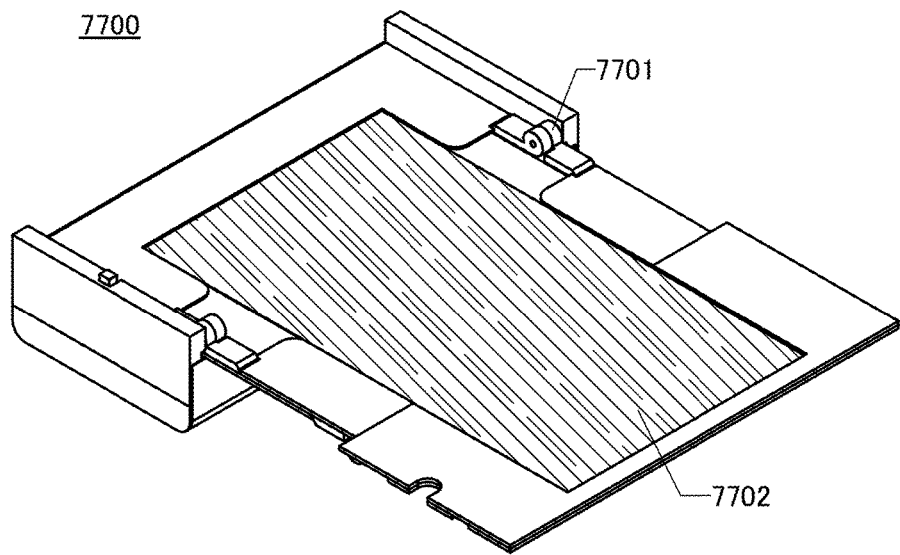
FIGS. 44A and 44B are perspective views illustrating an example of an electronic device.

An electronic device 7700 illustrated in FIGS. 43A to 43C and FIGS. 44A and 44B has the display portion 7702 including the foldable display device disclosed in the above embodiments. FIG. 43A is a plan view showing a state where the display portion 7702 is unfolded. A cross-sectional view of the electronic device 7700 is illustrated in FIG. 43B. A power storage device 7704 is provided inside the electronic device 7700. FIG. 44A corresponds to an external perspective view showing a state where the display portion 7702 is unfolded.

Furthermore, hinges 7701 and 7703 that allow the display portion 7702 to be folded are provided. The display portion 7702 is an active matrix display device including an organic EL element over a plastic substrate and is a flexible display panel. For example, a transistor having an oxide semiconductor layer is included, the transistor and the organic EL element are electrically connected to each other, and the transistor and the organic EL element are placed between two plastic substrates. The electronic device illustrated in FIGS. 43A to 43C and FIGS. 44A and 44B is an example of the electronic device 7700 which can be reduced in size by folding at portions where the hinges 7701 and 7703 are provided.

Figure 44B:
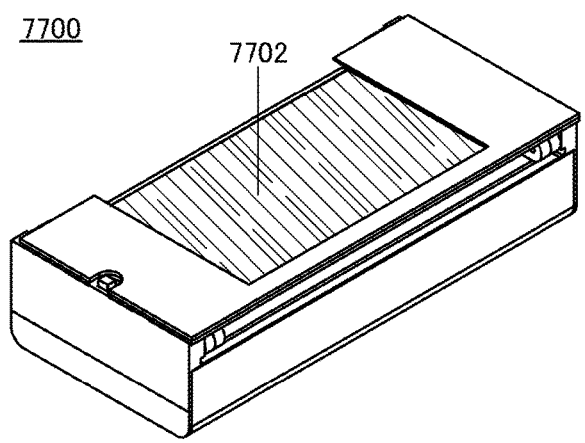

FIG. 43C is a cross-sectional view of the electronic device in a folded state. FIG. 44B corresponds to an external perspective view of the electronic device in the state. The example of folding two places using the two hinges 7701 and 7703 is given; however, folding of the electronic device is not limited thereto. An electronic device which can be folded at three or more places may be obtained by increasing the size of the display portion 7702 and the number of hinges. Alternatively, an electronic device which can be folded at one place using one hinge may be obtained.

By selecting a material (a silicone rubber or a plastic material) of the housing of the electronic device 7700 so that a flexible housing is obtained, the electronic device 7700 can be folded wholly or partly while a foldable power storage device is used for the power storage device 7704 provided inside the housing. According to one embodiment of the present invention, an electronic device with high portability can be provided.

It is needless to say that one embodiment of the present invention is not limited to the above-described electronic devices and lighting devices as long as the display device of one embodiment of the present invention is included.

This embodiment can be implemented in an appropriate combination with any of the structures described in the other embodiments.

Note that content (or may be part of the content) described in one embodiment may be applied to, combined with, or replaced by different content (or may be part of the different content) described in the embodiment and/or content (or may be part of the content) described in one or more different embodiments.

Note that in each embodiment, content described in the embodiment is content described with reference to a variety of diagrams or content described with a text described in the specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in another embodiment or other embodiments, much more diagrams can be formed.

Note that content that is not specified in any drawing or text in the specification can be excluded from one embodiment of the invention. Alternatively, when the range of a value that is defined by the maximum and minimum values is described, the range is narrowed freely and part of the range is removed, so that one embodiment of the invention excluding part of the range can be constructed. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection in the invention. It can be specified that the circuit does not include a capacitor with a particular connection in the invention. For example, it can be specified that a sixth transistor whose gate is connected to a gate of the third transistor is not included in the invention. It can be specified that a capacitor whose first electrode is connected to the gate of the third transistor is not included in the invention, for example.

As another specific example, when the expression "voltage is preferably higher than or equal to 3 V and lower than or equal to 10 V" is used to describe a given value, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but not 9 V in the invention. Note that even when the expression "a value is preferably in a certain range" or "a value preferably satisfies a certain condition" is used, for example, the value is not limited to the description. In other words, the description of a value that includes a term "preferable", "preferably", or the like does not necessarily limit the value.

As another specific example, when the expression "voltage is preferably 10 V" is used to describe a given value, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, when the expression "a film is an insulating film" is used to describe properties of a material, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, when the expression "a film is provided between an A film and a B film" is used to describe a given layered structure, for example, it can be specified that the case where the film is a stacked film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the embodiment of the invention. For example, in the case of a transmission/reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention is clear. Moreover, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or text described in one embodiment can be taken out to constitute one embodiment of the invention. Thus, in the case where a diagram or text related to a certain portion is described, the contents taken out from part of the diagram or the text are also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to take out M circuit elements (e.g., transistors or capacitors; M is an integer, where M<N) and constitute one embodiment of the invention. For another example, it is possible to take out M layers (M is an integer, where M<N) from a cross-sectional view in which N layers (N is an integer) are provided and constitute one embodiment of the invention. For another example, it is possible to take out M elements (M is an integer, where M<N) from a flow chart in which N elements (N is an integer) are provided and constitute one embodiment of the invention. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, what is illustrated in at least a diagram (which may be part of the diagram) is disclosed as one embodiment of the invention, and one embodiment of the invention can be constituted. Therefore, when certain contents are described in a diagram, the contents are disclosed as one embodiment of the invention even when the contents are not described with text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

This application is based on Japanese Patent Application serial no. 2014-038740 filed with Japan Patent Office on Feb. 28, 2014 and Japanese Patent Application serial no. 2014-044735 filed with Japan Patent Office on Mar. 7, 2014, the entire contents of which are hereby incorporated by reference.

What is claimed is:

1. A method for manufacturing a display device, the method comprising:
    forming a display element and an electrode between a flexible substrate and a glass substrate, the electrode being in contact with and sandwiched between a first insulating layer and a second insulating layer;
    peeling whole of the glass substrate from the flexible substrate so that one of the first insulating layer and the second insulating layer is partly and simultaneously removed to expose the electrode; and
    connecting the exposed electrode with an external electrode through which a signal is input to the display element.

2. The method according to claim 1,
    wherein the external electrode is a flexible printed circuit.

3. The method according to claim 1, further comprising:
    irradiating the electrode with light through the glass substrate before peeling the glass substrate.

4. The method according to claim 1, further comprising:
    bonding a second flexible substrate to the flexible substrate after peeling the glass substrate and before connecting the exposed electrode with the external electrode so that the display element and the electrode are sandwiched between the second flexible substrate and the flexible substrate.

5. The method according to claim 4,
    wherein the second flexible substrate comprises an opening, and
    wherein the second flexible substrate is bonded to the flexible substrate so that the opening overlaps with the exposed electrode.

6. The method according to claim 1, further comprising:
    forming, between the glass substrate and the flexible substrate, a peripheral circuit for controlling the display element,
    wherein the signal is input to the peripheral circuit through the external electrode and the electrode.

7. A method for manufacturing a display device, the method comprising:
    forming an electrode over a first substrate;
    forming a first insulating layer over the electrode;
    forming a display element over the first insulating layer;
    bonding a second substrate to the first substrate with a bonding layer so that the electrode and the display element are sandwiched between the first substrate and the second substrate and the electrode and the display element are covered by the bonding layer;
    peeling whole of the second substrate so that part of the first insulating layer and part of the bonding layer are simultaneously removed to expose the electrode, remaining the display element being covered by the bonding layer; and
    connecting the exposed electrode with an external electrode through which a signal is input to the display element.

8. The method according to claim 7,
    wherein the external electrode is a flexible printed circuit.

9. The method according to claim 7,
    wherein the second substrate comprises a second insulating layer having an opening, and
    wherein the second substrate is bonded to the first substrate so that the second insulating layer is sandwiched between the first substrate and the second substrate and the opening overlaps with the electrode.

10. The method according to claim 9, further comprising:
    irradiating the electrode with light through the opening after bonding the second substrate to the first substrate and before peeling the second substrate.

11. The method according to claim 7, further comprising:
    replacing the first substrate with a third substrate after bonding the second substrate to the first substrate and before peeling the second substrate,
    wherein the third substrate is flexible.

12. The method according to claim 11, further comprising:
    bonding a fourth substrate to the third substrate after peeling the second substrate and before connecting the electrode with the external electrode so that the electrode and the display element are sandwiched between the third substrate and the fourth substrate,
    wherein the fourth substrate is flexible.

13. The method according to claim 12,
    wherein the fourth substrate comprises an opening, and
    wherein the fourth substrate is bonded to the third substrate so that the opening of the fourth substrate overlaps with the electrode.

14. A method for manufacturing a display device, the method comprising:
    forming a first insulating layer over a first substrate;
    forming an electrode over the first insulating layer;
    forming a second insulating layer over the electrode;
    forming a display element over the second insulating layer;
    bonding a second substrate to the first substrate so that the electrode and the display element are sandwiched between the first substrate and the second substrate;
    peeling the first substrate so that part of the first insulating layer is selectively and simultaneously removed to expose the electrode, remaining other part of the first insulating layer underneath the display element; and
    connecting the exposed electrode with an external electrode through which a signal is input to the display element.

15. The method according to claim 14,
    wherein the external electrode is a flexible printed circuit.

16. The method according to claim 14, further comprising:
    forming a peeling layer over the first substrate before forming the first insulating layer, the peeling layer comprising an opening,
    wherein the electrode is formed so as to overlap with the opening.

17. The method according to claim 16,
wherein the first insulating layer is formed so that the part of the first insulating layer is in contact with the first substrate in the opening.

18. The method according to claim 14, further comprising:
irradiating the electrode with light through the first insulating layer before peeling the first substrate.

19. The method according to claim 14, further comprising:
replacing the second substrate with a third substrate before peeling the first substrate,
wherein the third substrate is flexible.

20. The method according to claim 19, further comprising:
bonding a fourth substrate to the third substrate after peeling the first substrate so that the display element is sandwiched between the third substrate and the fourth substrate,
wherein the fourth substrate is flexible.

21. A method for manufacturing a display device, the method comprising:
forming an electrode over a first substrate;
forming an insulating layer over the electrode;
forming a display element over the insulating layer;
bonding a second substrate to the first substrate with a bonding layer; and
peeling the second substrate from the first substrate,
wherein part of the insulating layer and part of the bonding layer are simultaneously removed to expose the electrode at the step of peeling the second substrate.

22. The method according to claim 21, further comprising a step of connecting the exposed electrode with a flexible printed circuit.

* * * * *